(12) United States Patent
Ju et al.

(10) Patent No.: US 12,051,693 B2
(45) Date of Patent: Jul. 30, 2024

(54) METHOD FOR MANUFACTURING SEMICONDUCTOR STRUCTURE WITH ISOLATION STRIPS

(71) Applicant: TAIWAN SEMICONDUCTOR MANUFACTURING COMPANY, LTD., Hsinchu (TW)

(72) Inventors: Shi Ning Ju, Hsinchu (TW); Kuo-Cheng Chiang, Zhubei (TW); Kuan-Lun Cheng, HsinChu (TW); Chih-Hao Wang, Baoshan Township, Hsinchu County (TW); Kuan-Ting Pan, Taipei (TW); Zhi-Chang Lin, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 52 days.

(21) Appl. No.: 17/515,726

(22) Filed: Nov. 1, 2021

(65) Prior Publication Data
US 2022/0052040 A1    Feb. 17, 2022

Related U.S. Application Data

(62) Division of application No. 16/280,470, filed on Feb. 20, 2019, now Pat. No. 11,164,866.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
None
See application file for complete search history.

(56) References Cited

U.S. PATENT DOCUMENTS 9,209,247 B2    12/2015  Colinge et al.
9,236,267 B2     1/2016  De et al.
(Continued)

FOREIGN PATENT DOCUMENTS

JP          2010-73869 A       4/2010
KR       20160042797 A       4/2016
(Continued)

OTHER PUBLICATIONS

Notice of Allowance mailed Sep. 14, 2021 in corresponding Korean application No. KR10-2020-0019204.

*Primary Examiner* — Scott B Geyer
(74) *Attorney, Agent, or Firm* — Birch, Stewart, Kolasch & Birch, LLP

(57) ABSTRACT

A method for manufacturing a semiconductor structure is provided. The method includes forming a plurality of fin structures extending along a first direction over a substrate, forming a low-k isolation strip over the substrate, the low-k isolation strip extending along the first direction and between the plurality of fin structures; and forming a high-k isolation strip on top of the low-k isolation strip.

20 Claims, 67 Drawing Sheets

(51) Int. Cl.
  *H01L 29/06* (2006.01)
  *H01L 29/10* (2006.01)
  *H01L 29/66* (2006.01)
  *H01L 29/78* (2006.01)

(52) U.S. Cl.
  CPC ...... *H01L 29/0653* (2013.01); *H01L 29/0673* (2013.01); *H01L 29/1037* (2013.01); *H01L 29/66545* (2013.01); *H01L 29/785* (2013.01); *H01L 2029/7858* (2013.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,461,044 B1* | 10/2016 | Chang | H01L 29/42372 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,917,162 B2* | 3/2018 | Cheng | H01L 29/4966 |
| 9,929,249 B1 | 3/2018 | Ahn et al. | |
| 10,453,824 B1 | 10/2019 | Mochizuki et al. | |
| 10,516,032 B2 | 12/2019 | Wu | |
| 10,580,701 B1* | 3/2020 | Zang | H01L 27/0886 |
| 10,756,174 B2 | 8/2020 | Van Dal et al. | |
| 2010/0065917 A1 | 3/2010 | Ohta et al. | |
| 2011/0227170 A1 | 9/2011 | Zhu et al. | |
| 2012/0196425 A1* | 8/2012 | Scheiper | H01L 29/66795 438/585 |
| 2013/0161729 A1* | 6/2013 | Xie | H01L 29/7851 257/E21.546 |
| 2013/0309856 A1* | 11/2013 | Jagannathan | H01L 27/1211 438/587 |
| 2015/0053912 A1 | 2/2015 | Ching et al. | |
| 2015/0318398 A1* | 11/2015 | Xie | H01L 29/78 257/288 |
| 2016/0005735 A1* | 1/2016 | Costrini | H01L 21/76224 438/283 |
| 2016/0087062 A1* | 3/2016 | Yin | H01L 29/785 438/283 |
| 2016/0104673 A1* | 4/2016 | Tung | H01L 21/76897 257/288 |
| 2016/0104765 A1 | 4/2016 | Ching et al. | |
| 2016/0126143 A1 | 5/2016 | Su et al. | |
| 2016/0148846 A1* | 5/2016 | Ok | H01L 21/28512 438/587 |
| 2016/0315017 A1 | 10/2016 | Bae et al. | |
| 2017/0053941 A1* | 2/2017 | Basker | H01L 21/845 |
| 2017/0125408 A1* | 5/2017 | Park | H01L 21/02345 |
| 2017/0141112 A1* | 5/2017 | Ching | H01L 21/823807 |
| 2017/0330801 A1* | 11/2017 | Ragnarsson | H01L 21/823871 |
| 2017/0352657 A1* | 12/2017 | Bergendahl | H01L 29/6653 |
| 2017/0365676 A1* | 12/2017 | Wu | H01L 29/66795 |
| 2018/0090605 A1* | 3/2018 | Cheng | H01L 29/66742 |
| 2018/0301371 A1 | 10/2018 | Wang et al. | |
| 2018/0315854 A1* | 11/2018 | Liaw | H01L 21/76816 |
| 2019/0027570 A1 | 1/2019 | Ching et al. | |
| 2019/0035786 A1* | 1/2019 | Huang | H01L 21/823821 |
| 2019/0067277 A1* | 2/2019 | Tsai | H01L 21/823431 |
| 2019/0097048 A1* | 3/2019 | Song | H01L 21/823462 |
| 2019/0131415 A1 | 5/2019 | Cheng et al. | |
| 2019/0252268 A1* | 8/2019 | Xie | H01L 29/4966 |
| 2019/0393347 A1 | 12/2019 | Kim et al. | |
| 2020/0043793 A1 | 2/2020 | Huang | |
| 2020/0091142 A1* | 3/2020 | Ching | H01L 27/0886 |
| 2020/0105603 A1* | 4/2020 | Chang | H01L 23/485 |
| 2020/0127124 A1* | 4/2020 | Ching | H01L 29/785 |
| 2020/0135873 A1* | 4/2020 | Wu | H01L 29/785 |

FOREIGN PATENT DOCUMENTS

| | | |
|---|---|---|
| KR | 20170040147 A | 4/2017 |
| WO | WO 2018/101957 A1 | 6/2018 |

* cited by examiner

METHOD FOR MANUFACTURING SEMICONDUCTOR STRUCTURE WITH ISOLATION STRIPS

PRIORITY CLAIM AND CROSS-REFERENCE

This application is a divisional application of U.S. patent application Ser. No. 16/280,470, filed on Feb. 20, 2019, entitled of "SEMICONDUCTOR STRUCTURE AND Method for MANUFACTURING THE SAME," which is incorporated herein by reference in its entirety.

BACKGROUND

A typical semiconductor manufacturing process includes numerous steps. For example, lithography is a crucial step that significantly affects design of the semiconductor structure as well as the subsequent manufacturing process. The basic principle of lithography is similar to that of film photography. The patterns of a photomask are projected through a high-precision lithography tool onto the wafer surface, which is coated with a layer of a light-sensitive chemical compound, e.g., photoresist. Due to the complex processing and technique limitations, space needs to be reserved for performing lithography, and a size of a device is therefore constrained by processing limitations.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
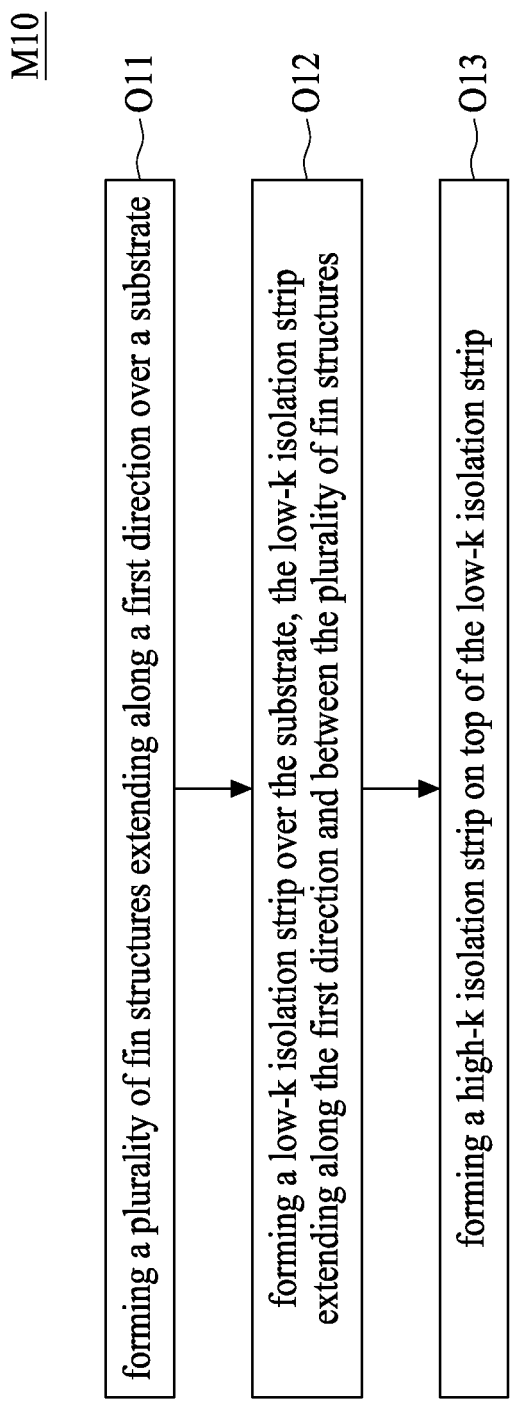
FIG. 1 is a flowchart showing various steps of a method for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or in other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The gate all around (hereinafter "GAA") transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed along the patterned sacrificial layer using a self-aligned process. The sacrificial layer is then removed, and the remaining spacers may then be used to pattern the GAA structure.

FIG. 1 illustrates a flowchart of a method M10 in accordance with some embodiments of the present disclosure for manufacturing a semiconductor structure. The method M10 includes: (O11) forming a plurality of fin structures extending along a first direction over a substrate; (O12) forming a low-k isolation strip over the substrate, the low-k isolation strip extending along the first direction and between the plurality of fin structures; and (O13) forming a high-k isolation strip on top of the low-k isolation strip.

In order to further illustrate concepts of the present disclosure, various embodiments are provided below. However, it is not intended to limit the present disclosure to specific embodiments. In addition, conditions or parameters illustrated in different embodiments can be combined or modified to form different combinations of embodiments as long as the parameters or conditions used are not conflicted. For ease of illustration, reference numerals with similar or same functions and properties are repeatedly used in different embodiments and figures, but such repetition in not intended to limit the present disclosure to specific embodiments.

FIGS. 2 to 30 illustrate diagrammatic views of one or more operations in accordance with the method M10 for manufacturing a GAA transistor structure TS10 in accordance with some embodiments of the present disclosure.

Figure 2:
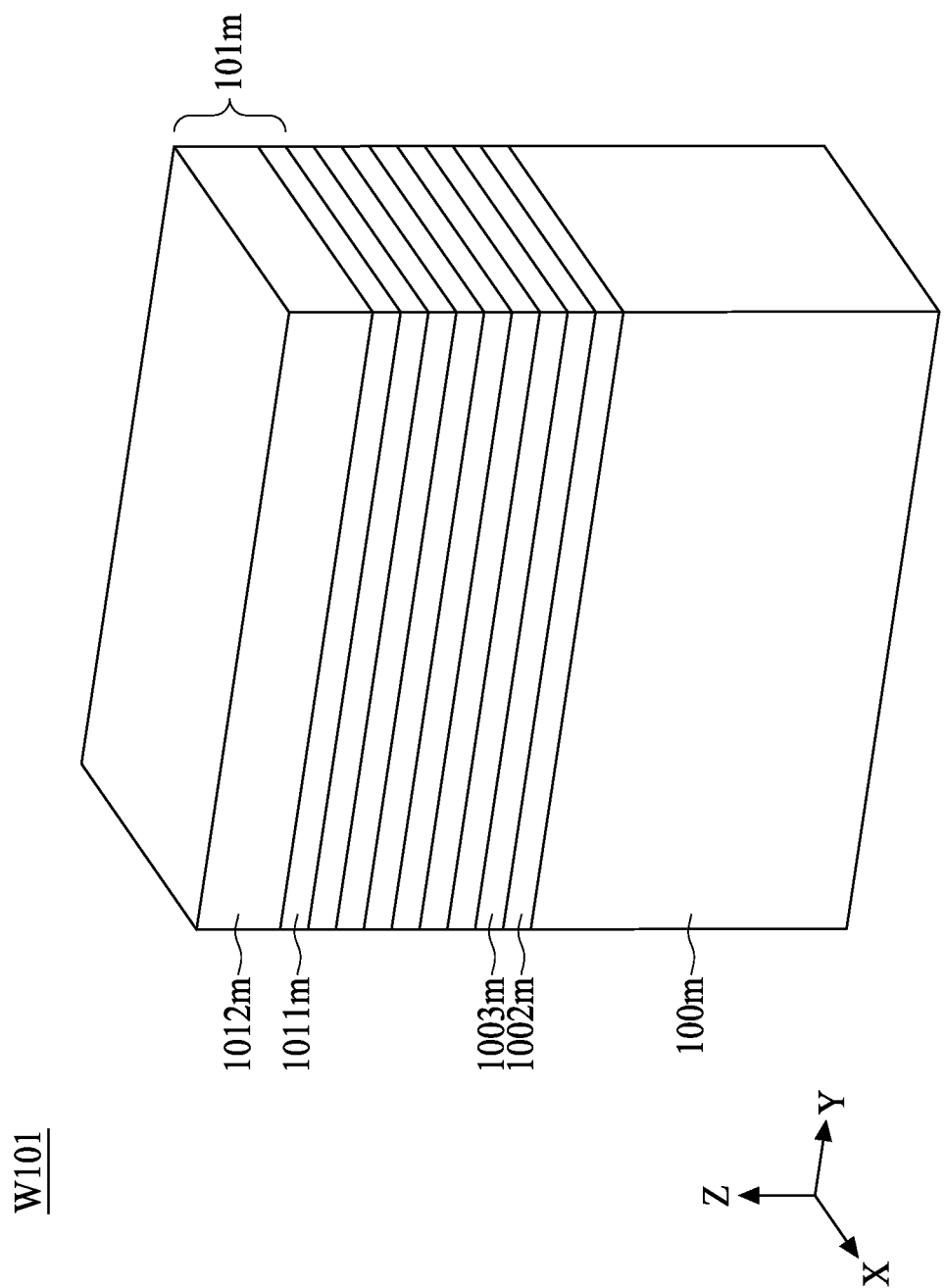
FIGS. 2 to 27 are diagrammatic views of one or more operations of a method for forming a semiconductor structure in accordance with some embodiments of the present disclosure.
Figure 3:
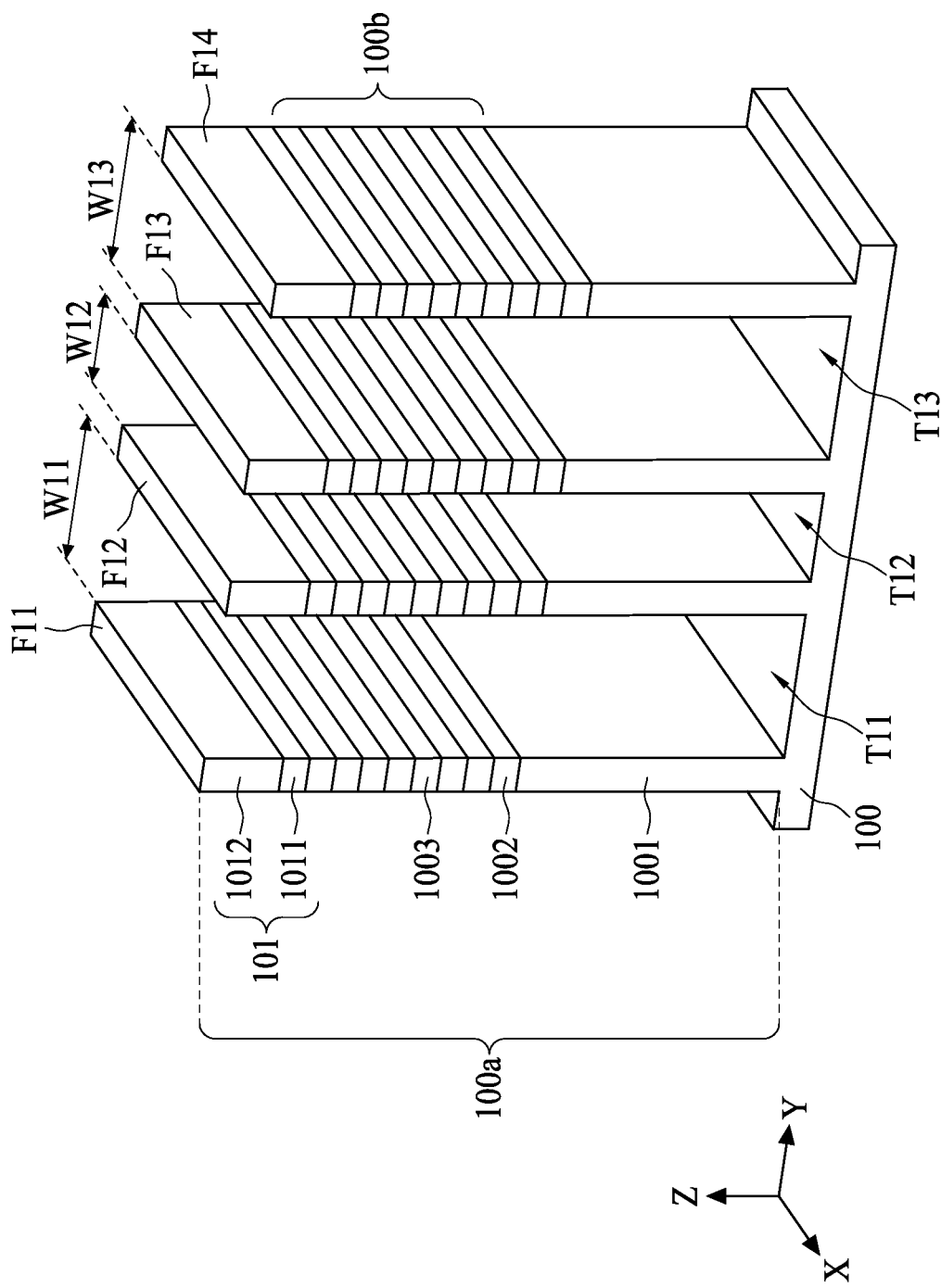

Referring to FIGS. 2 to 3, in accordance with the operation (O11) and some embodiments of the present disclosure, a plurality of fin structures 100a are formed over the substrate 100. As shown in FIG. 3, each of the fin structures 100a includes a substrate fin 1001, a stacked fin 100b and a hard mask structure 101. The stacked fin 100b includes a plurality of silicon germanium (SiGe) layers 1002 and a plurality of silicon (Si) layers 1003 alternatingly disposed on the substrate fin 1001 over the substrate 100. In some embodiments, the hard mask structure 101 includes a hard mask layer 1011 and a hard mask layer 1012 stacked sequentially on top of each of the stacked fins 100b. The substrate 100 extends parallel to the X-Y plane, and the fin structures 100a protrude in the Z direction over the substrate 100.

In accordance with some embodiments, formation of the structure shown in FIG. 3 is achieved by removing portions of a stacked structure W101 as shown in FIG. 2. Referring back to FIG. 2, a substrate material layer 100m is received or provided, and a plurality of SiGe material layers 1002m and a plurality of Si material layers 1003m are alternatingly formed on the substrate material layer 100m. Hard mask material layers 1011m and 1012m are then formed over the SiGe material layers 1002m and the Si material layers 1003m. The portions of the stacked structure W101 are removed by, for instance, one or more etching operations, from a top of the hard mask material layer 1012m to the substrate material layer 100m to form the fin structures 100a over the substrate 100 as shown in FIG. 3.

FIG. 3 shows four fin structures 100a (individually labeled as F11, F12, F13 and F14) for illustration but not to limit the present disclosure. It should be noted that a width W11 of a trench T11 formed between the fin structures F11 and F12 is greater than a width W12 of a trench T12 between the fin structures F12 and F13, and the width T11 is substantially the same as a width W13 of a trench T13 between the fin structures F13 and F14. In some embodiments, the four fin structures F11, F12, F13 and F14 as a unit are repeatedly arranged over the substrate 100, and a trench formed between the fin structure F14 and the adjacent fin structure F11 has a width, which is substantially the same as the width W12.

Figure 4:
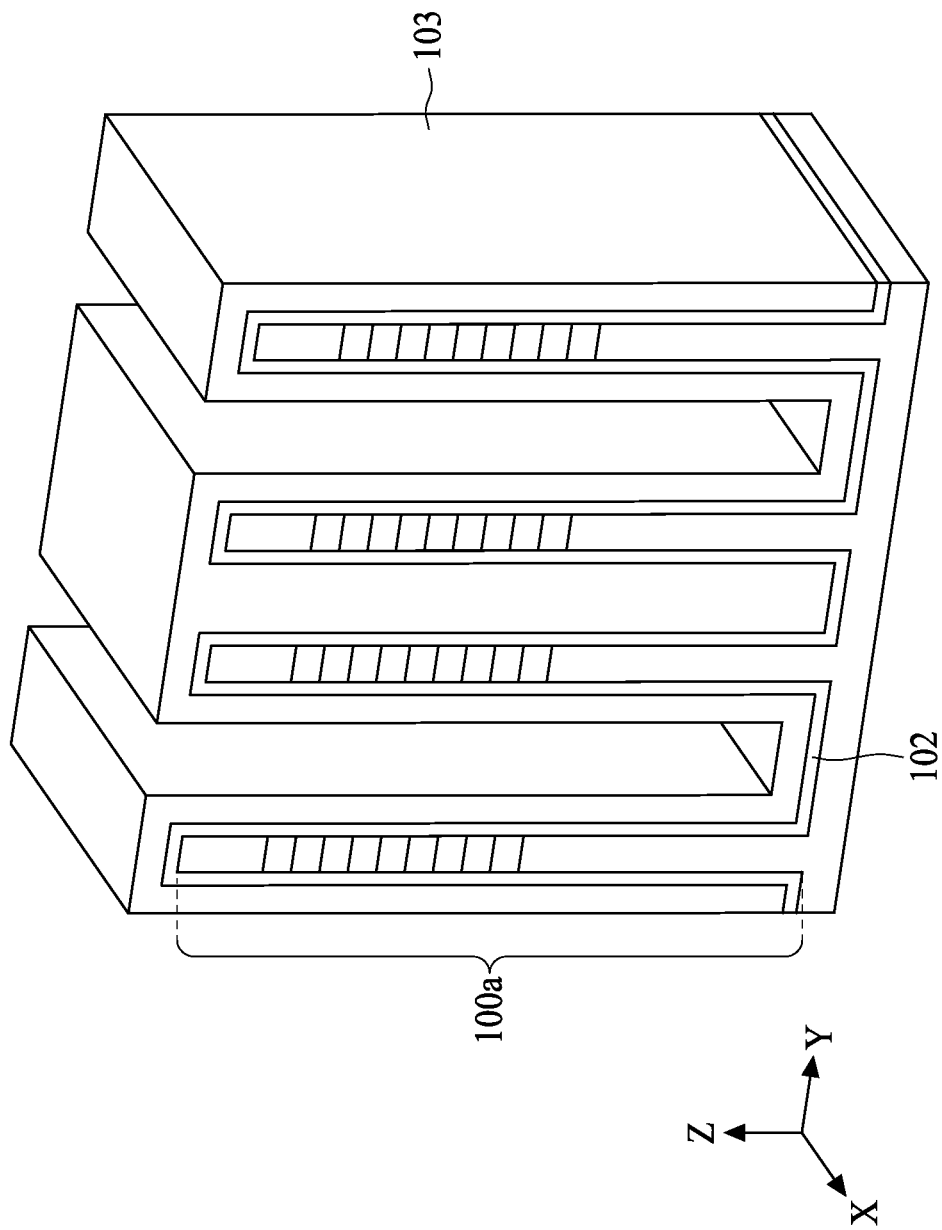

Referring to FIG. 4, a dielectric structure 102 and a low-k dielectric layer 103 are sequentially formed over the fin structures 100a and the substrate 100. In some embodiments shown in FIG. 4, the dielectric structure 102 is a single oxide layer (e.g., silicon oxide). In some embodiments, the dielectric structure 102 includes a plurality of dielectric layers. In some embodiments, the dielectric structure 102 is formed by conformal deposition, and a profile of the oxide layer is conformal to a profile of the fin structures 100a. In some embodiments, the dielectric structure 102 has a thickness greater than 3.5 nanometers (nm). In some embodiments, the low-k dielectric layer 103 completely fills the trench T12 between the fin structures F12 and F13 over the dielectric structure 102 due to the smaller width W12 of the trench T12. In some embodiments, the low-k dielectric layer 103 is conformal to the fin structures 100a without completely filling the trench T11 and the trench T13 due to the greater widths W11 and W12 of the trenches T11 and T13. In some embodiments, the low-k dielectric layer 103 has a dielectric constant k smaller than 7. In some embodiments, the low-k dielectric layer 103 includes one or more of silicon carbon nitride (SiCN), carbon-doped silicon oxide (SiOC), silicon oxycarbonitride (SiOCN), and other suitable materials.

Figure 5:
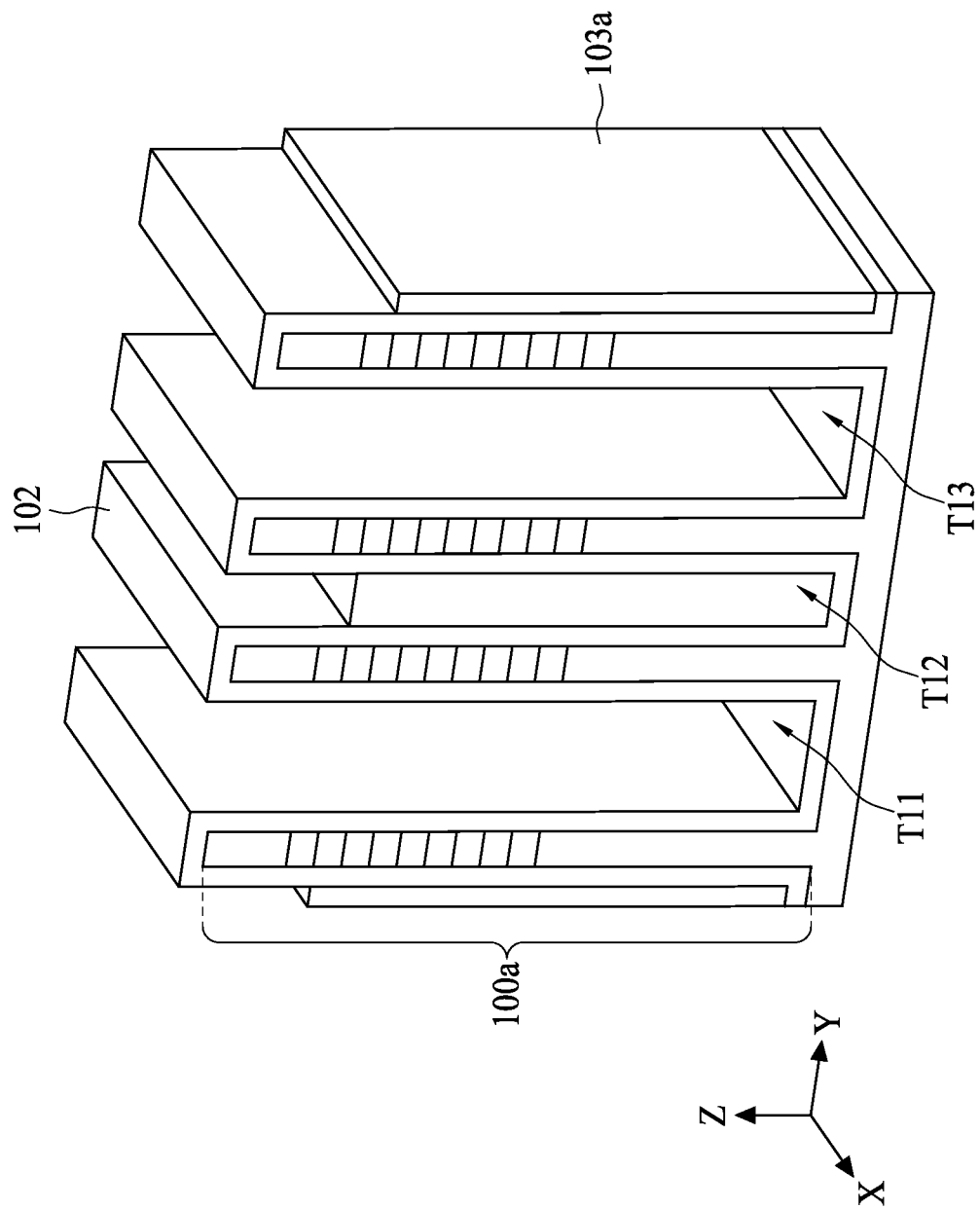

Referring to FIG. 5, in accordance with some embodiments of the present disclosure, portions of the low-k dielectric layer 103 are removed to form a plurality of low-k isolation strips 103a over the substrate 100 in the trench T12. In some embodiments, portions of the low-k dielectric layer 103 conformal to the fin structures 100a without completely filling the trenches T11 and T13 between the fin structures 100a are removed. In some embodiments, portions of the low-k dielectric layer 103 on tops of the fin structures 100a and above the stacked fins 100b are also removed. In some embodiments, the low-k isolation strips 103a extend along the X direction between the fin structures F12 and F13. In some embodiments, the low-k isolation strips 103a are also disposed between the adjacent fin structures F14 and F11.

Figure 6:
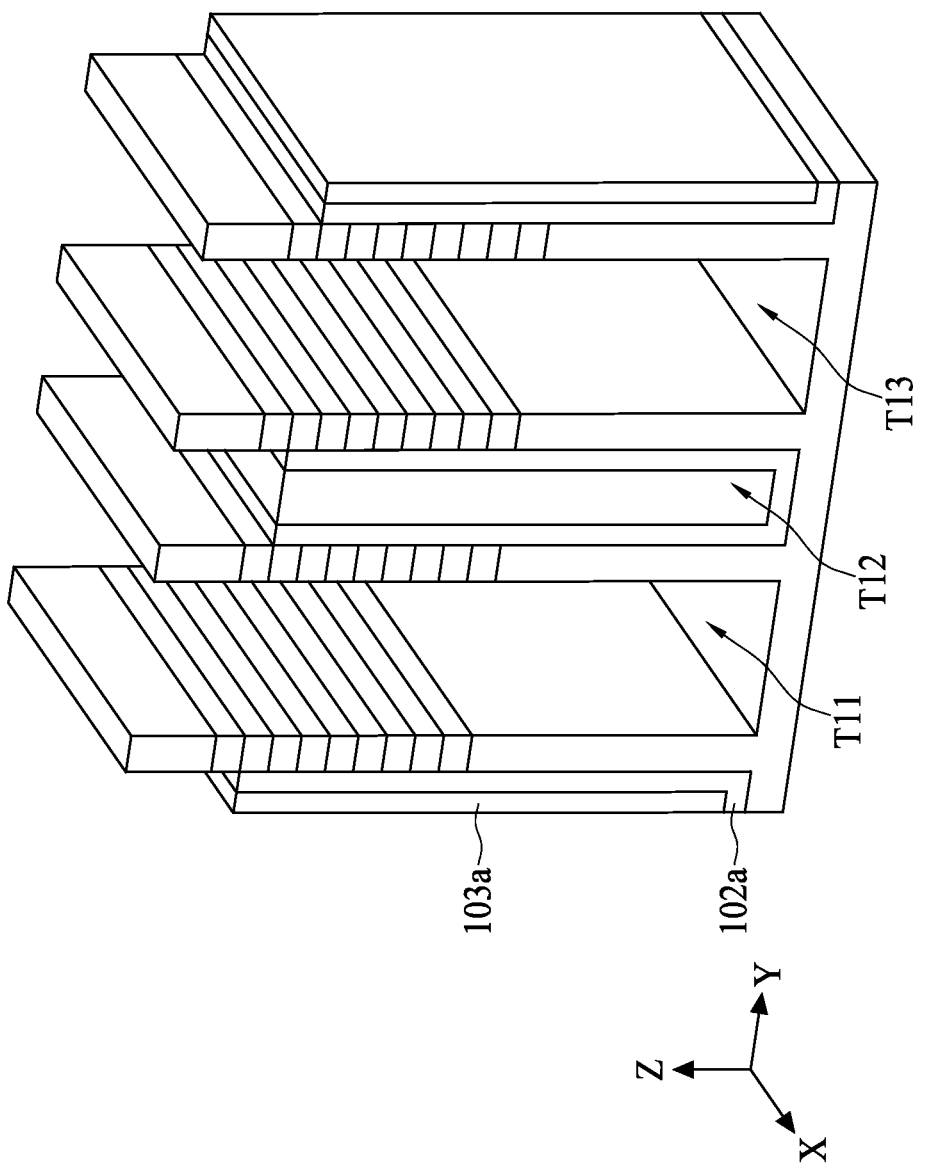

Referring to FIG. 6, in accordance with some embodiments of the present disclosure, portions of the dielectric structure 102 are optionally removed to form a plurality of spacers 102a over the substrate 100. In some embodiments, the portions of the dielectric structure 102 exposed from the low-k isolation strips 103a are removed. In some embodiments, each of the spacers 102a is between one of the low-k isolation strips 103a and the adjacent fin structure 100a. In some embodiments, the spacers 102a are between the low-k isolation strips 103a and the substrate 100. In some embodiments, the hard mask structure 101 is exposed, and the stacked fin 100b remains covered by the spacers 102a and the low-k isolation strips 103a. In some embodiments, the operation shown in FIG. 6 is skipped if the material of the dielectric structure 102 is the same as a material of a liner layer 105 to be formed in the subsequent operations.

Figure 7:
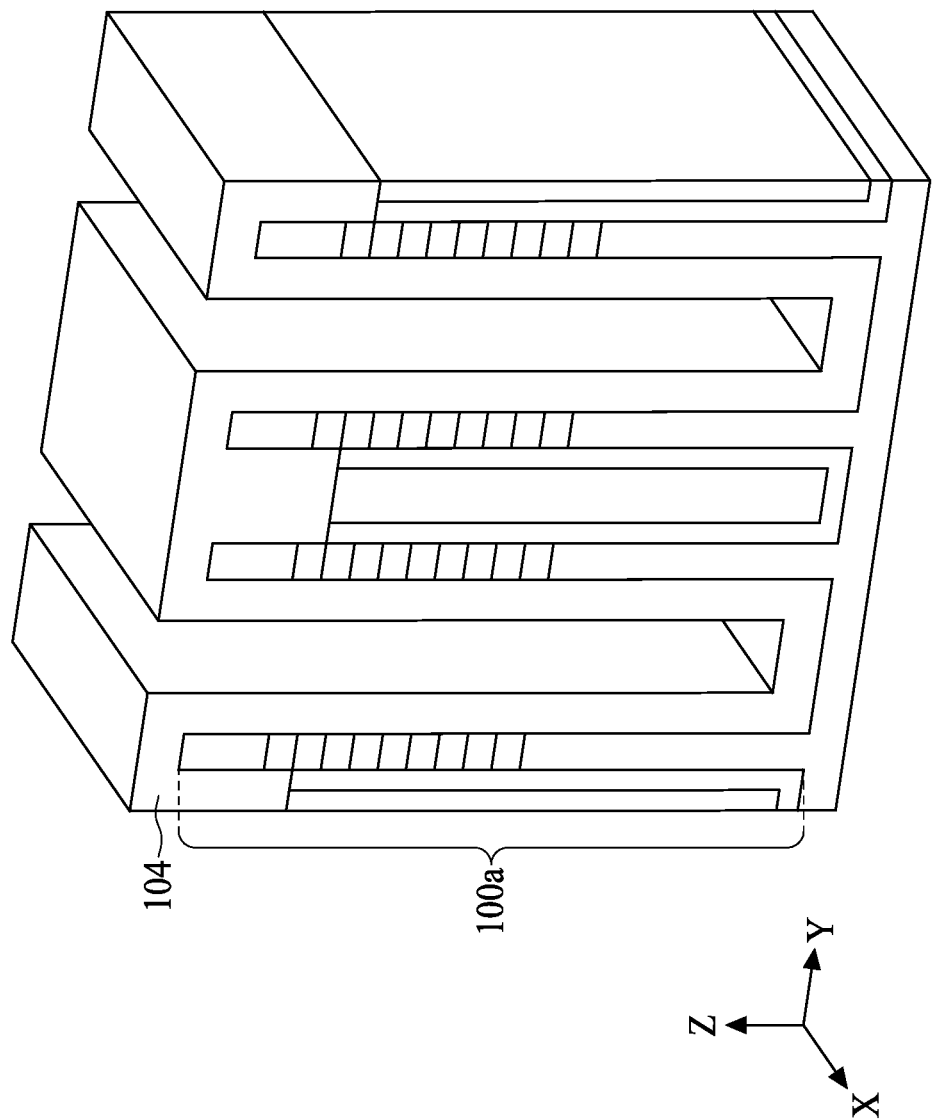

Referring to FIG. 7, in accordance with some embodiments of the present disclosure, a high-k dielectric layer 104 is formed over the fin structures 100a and the substrate 100. In some embodiments, the high-k dielectric layer 104 is formed by conformal deposition. In some embodiments, the high-k dielectric layer 104 is conformal to the fin structures F14 and F11 and the trenches T11 and T13 without completely filling the trenches T11 and T13 due to the greater widths W11 and W12 of the trenches T11 and T13. In some embodiments, the high-k dielectric layer 104 completely fills the spaces on tops of the low-k isolation strips 103a and the spacers 102a between the fin structures F12 and F13. In some embodiments, the high-k dielectric layer 104 has a dielectric constant k greater than 7. In some embodiments, the high-k dielectric layer 104 includes one or more of zirconium dioxide ($ZrO_2$), hafnium oxide ($HfO_2$), aluminum oxide ($Al_2O_3$), yttrium oxide ($Y_2O_3$), lanthanum oxide ($La_2O_3$), silicates of one or more of $ZrO_2$, $HfO_2$, $Al_2O_3$, $Y_2O_3$, $La_2O_3$, and aluminates of one or more of $ZrO_2$, $HfO_2$, $Y_2O_3$, $La_2O_3$. Other high-k dielectric materials known in the art, including, for example binary and ternary oxides having k values greater than 7, also may be used in the present disclosure.

Figure 8:
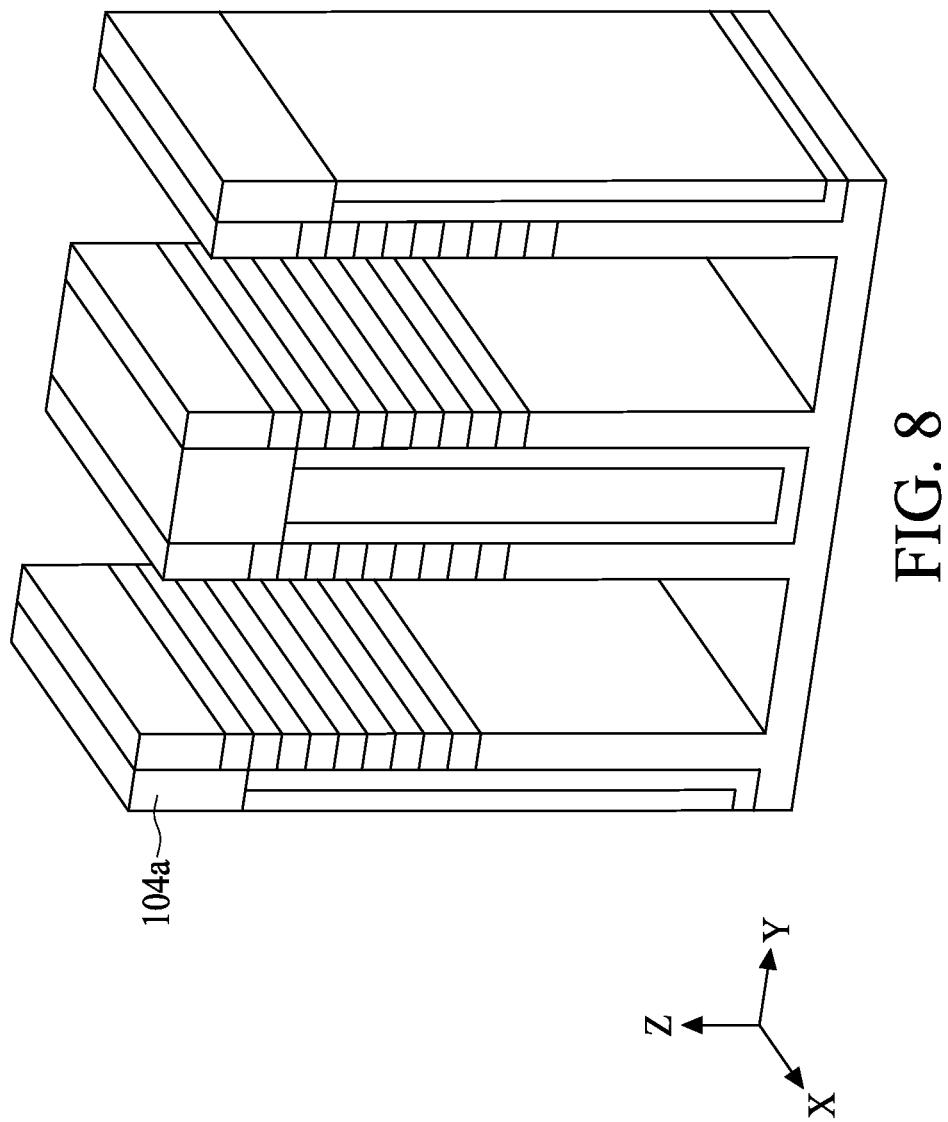

Referring to FIG. 8, in accordance with the operation (O13) of the method M10 and some embodiments of the present disclosure, portions of the high-k dielectric layer 104 are removed to form a plurality of high-k isolation strips 104a on the tops of the low-k isolation strips 103a. In some embodiments, the tops of the fin structures 100a are exposed. In some embodiments, portions of the high-k dielectric layer 104 in the trenches T11 and T13 are removed. In some embodiments, portions of the high-k dielectric layer 104 conformal to the fin structures 100a without completely filling the trenches T11 and T13 between the fin structures 100a are removed. In some embodiments, the high-k isolation strips 104a extend along the X direction between the fin structures F12 and F13. In some embodiments, the high-k isolation strips 104a extend along the X direction between the adjacent fin structures F14 and F11. In some embodiments, tops of the high-k isolation strips 104a are substantially coplanar with the tops of the adjacent fin structures 100a.

Figure 9:
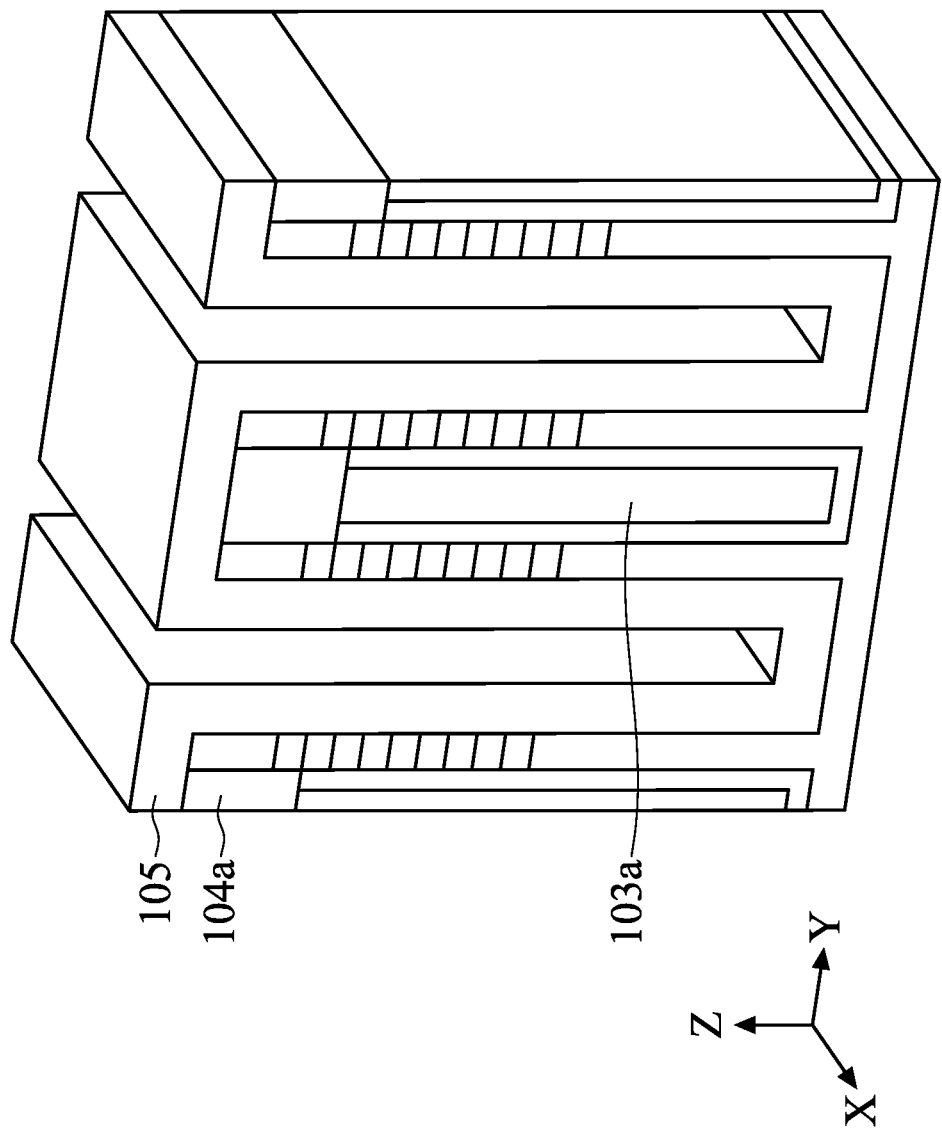
Figure 10:
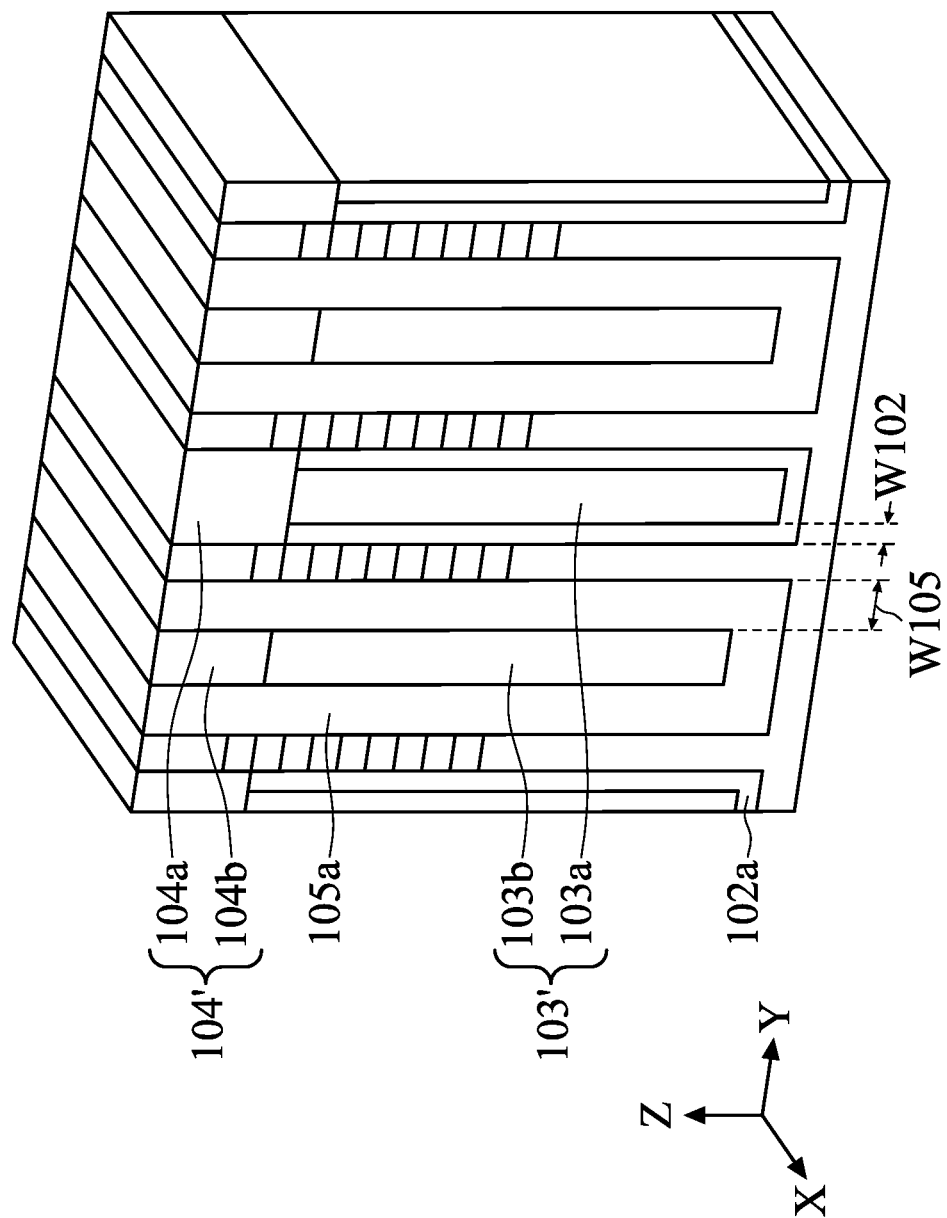

Referring to FIGS. 9 and 10, in accordance with some embodiments of the present disclosure, a liner layer 105, a plurality of low-k isolation strips 103b and a plurality of high-k isolation strips 104b are sequentially formed over the substrate 100. In some embodiments, the liner layer 105 is conformally formed over the substrate 100 and in the trenches T11 and T13. In some embodiments, the low-k isolation strips 103b fill in the trenches T11 and T13 between portions of the liner layer 105. In some embodiments, the high-k isolation strips 104b are on tops of the plurality of low-k isolation strips 103b respectively. In some embodiments, formations of the low-k isolation strips 103b and the high-k isolation strips 104b are similar to the formations of the low-k isolation strips 103a and the high-k isolation strips 104a. For ease of illustration, the low-k isolation strips 103a and the low-k isolation strips 103b are collectively labeled as a plurality of low-k isolation strips 103', and the high-k isolation strips 104a and the high-k isolation strips 104b are collectively labeled as a plurality of high-k isolation strips 104'.

Referring to FIG. 10, in accordance with some embodiments of the present disclosure, a polishing operation, e.g., a chemical mechanical polishing (CMP) operation, is optionally performed to planarize tops of the high-k isolation strips 104' and the fin structures 100a. A plurality of spacers 105a is formed between the low-k isolation strips 103b and the adjacent fin structures 100a. In some embodiments, tops of the spacers 105a are substantially coplanar with the tops of the fin structures 100a and the tops of the high-k isolation strips 104'. It should be noted that a distance W105 between the low-k isolation strip 103b and the fin structure 100a is greater than a distance W102 between the low-k isolation strip 103a and the fin structure 100a because a thickness of the liner layer 105 is greater than a thickness of the dielectric structure 102.

Figure 11:
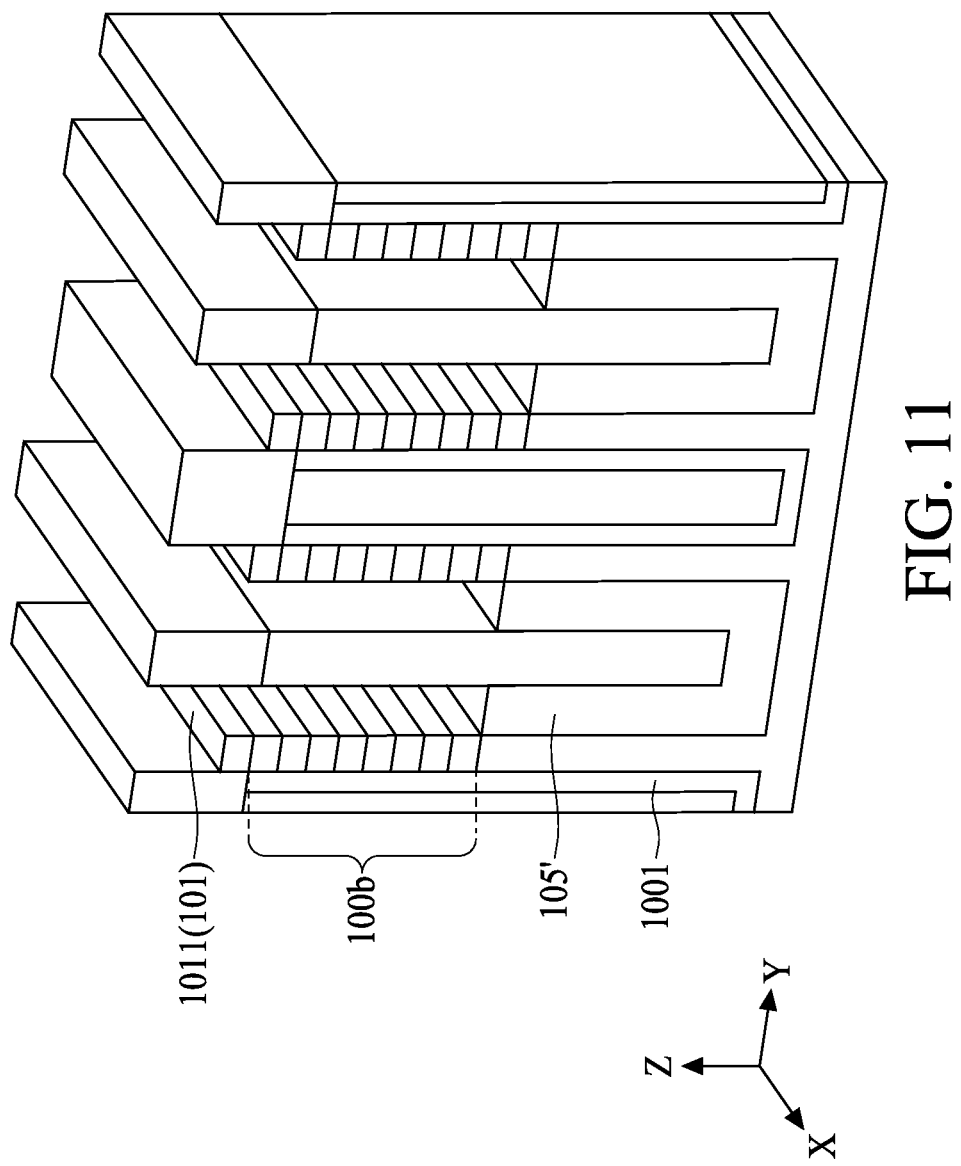

Referring to FIG. 11, in accordance with some embodiments of the present disclosure, portions of the spacers 105a and the hard mask layer 1012 are removed. In some embodiments, the portions of the spacers 105a above the substrate fins 1001 are removed from the tops of the spacers 105a to form spacers 105', and the stacked fin 100b is exposed.

Figure 12:
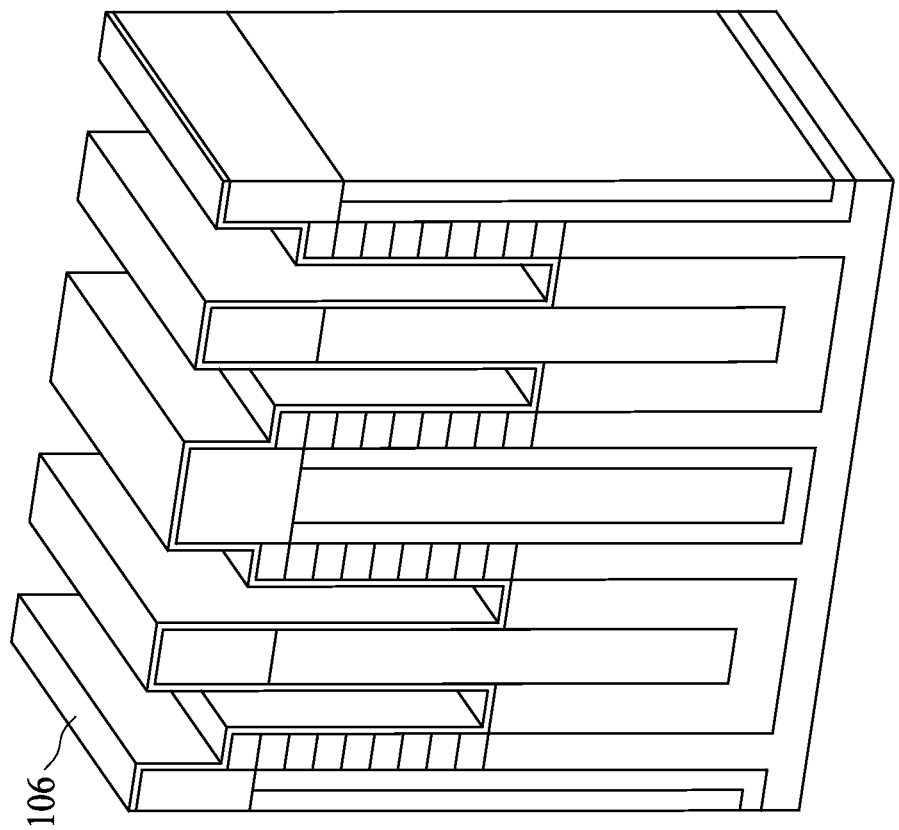

Referring to FIG. 12, in accordance with some embodiments of the present disclosure, an oxide layer 106 is formed conformally over the substrate 100. In some embodiments, the oxide layer 106 has a profile conformal to a profile of the spacers 105', the stacked fins 100b, the low-k isolation strips 103', and the high-k isolation strips 104'.

Figure 13:
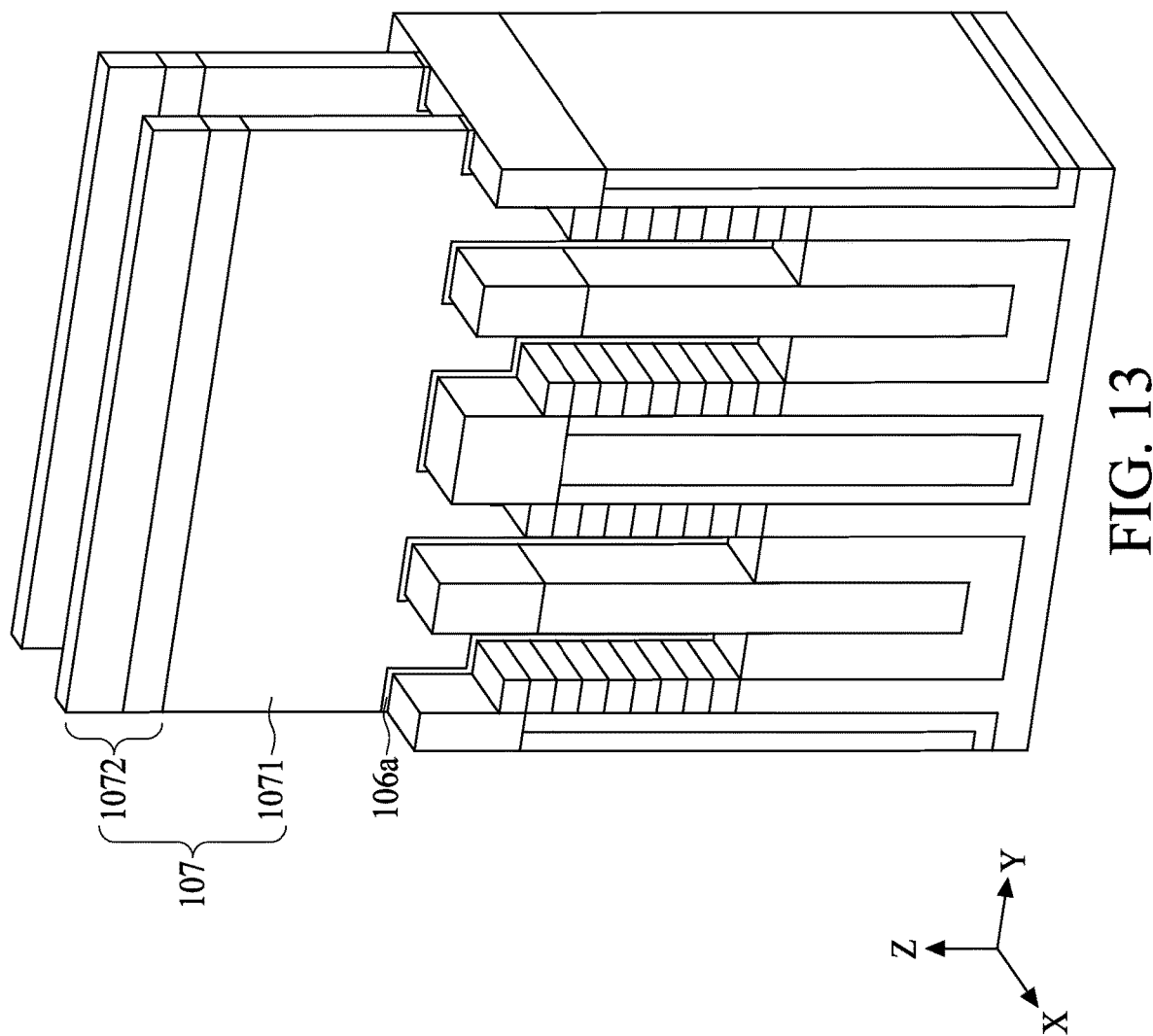

Referring to FIG. 13, in accordance with some embodiments of the present disclosure, a dummy stacked structure 107, extending along the Y direction and crossing over the fin structures 100a, is formed over the substrate 100. In some embodiments, the dummy stacked structure 107 includes a polysilicon layer 1071 and a hard mask structure 1072. In some embodiments, the hard mask structure 1072 is a multilayer structure. In some embodiments, a polysilicon material layer and hard material layers are formed over the substrate 100 by blanket deposition, and portions of the polysilicon material layer and the hard material layers are removed to form the polysilicon layer 1071 and the hard mask structure 1072. In some embodiments, portions of the oxide layer 106 exposed through the dummy stacked structure 107 are also removed during the removal of the dummy material layer and the hard mask layers to form the oxide layer 106a covered by the dummy stacked structure 107.

Figure 14:
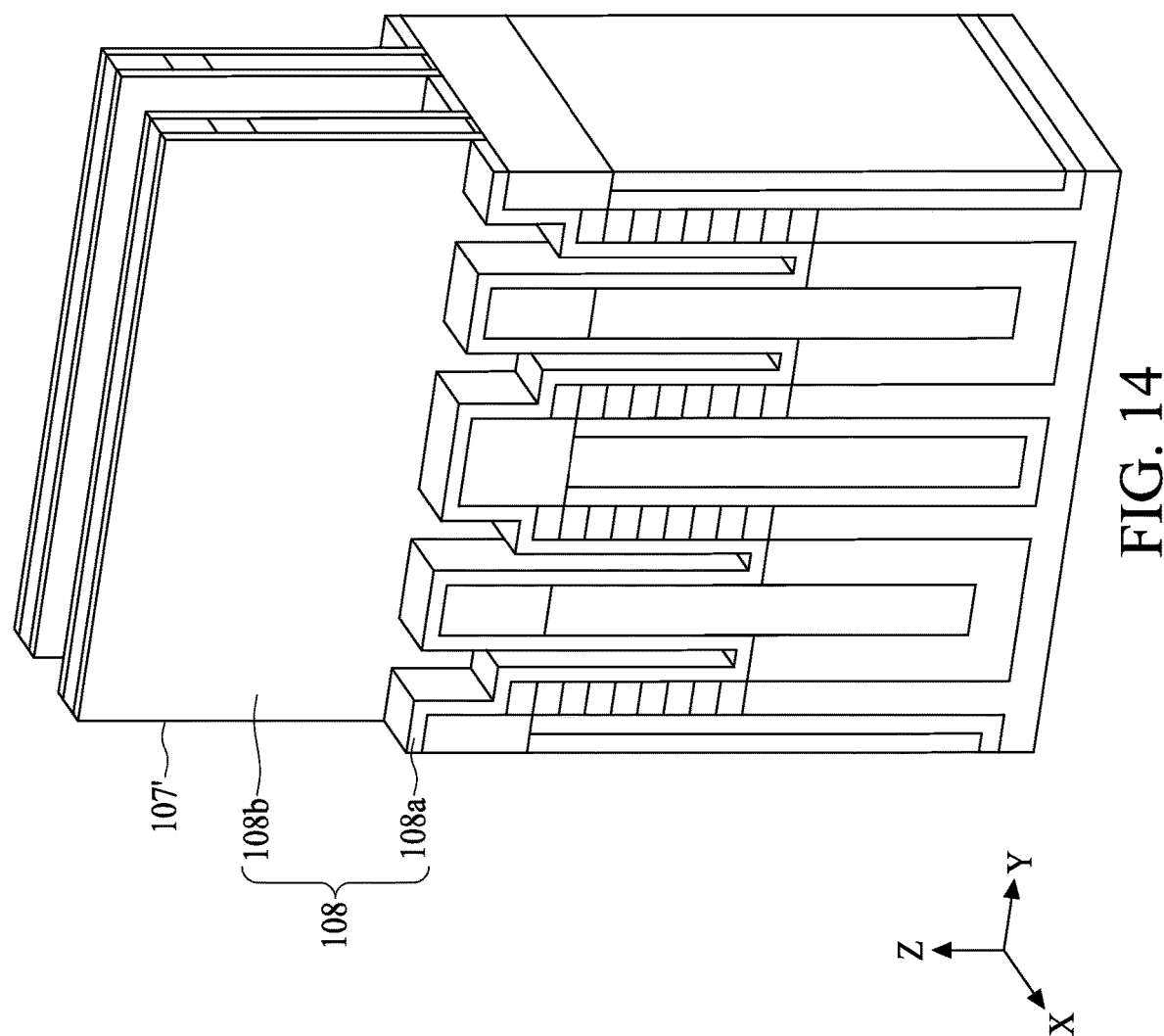

Referring to FIG. 14, in accordance with some embodiments of the present disclosure, a seal spacer 108 is deposited conformally over the substrate 100. In some embodiments, the seal spacer 108 is a multilayer structure (not shown in FIG. 14). Portions of the seal spacer 108 vertically (along the Z direction) covering the dummy stacked structures 107 become gate spacers 108b, and are illustrated together with the stacked structures 107 being portions of dummy gate structures 107'. Portions of the seal spacer 108, extending out of the gate spacers, covering the high-k isolation strips 104', the low-k isolation strips 103', the fin structures 100a, and the spacer 105', are illustrated as seal spacers 108a.

Figure 15:
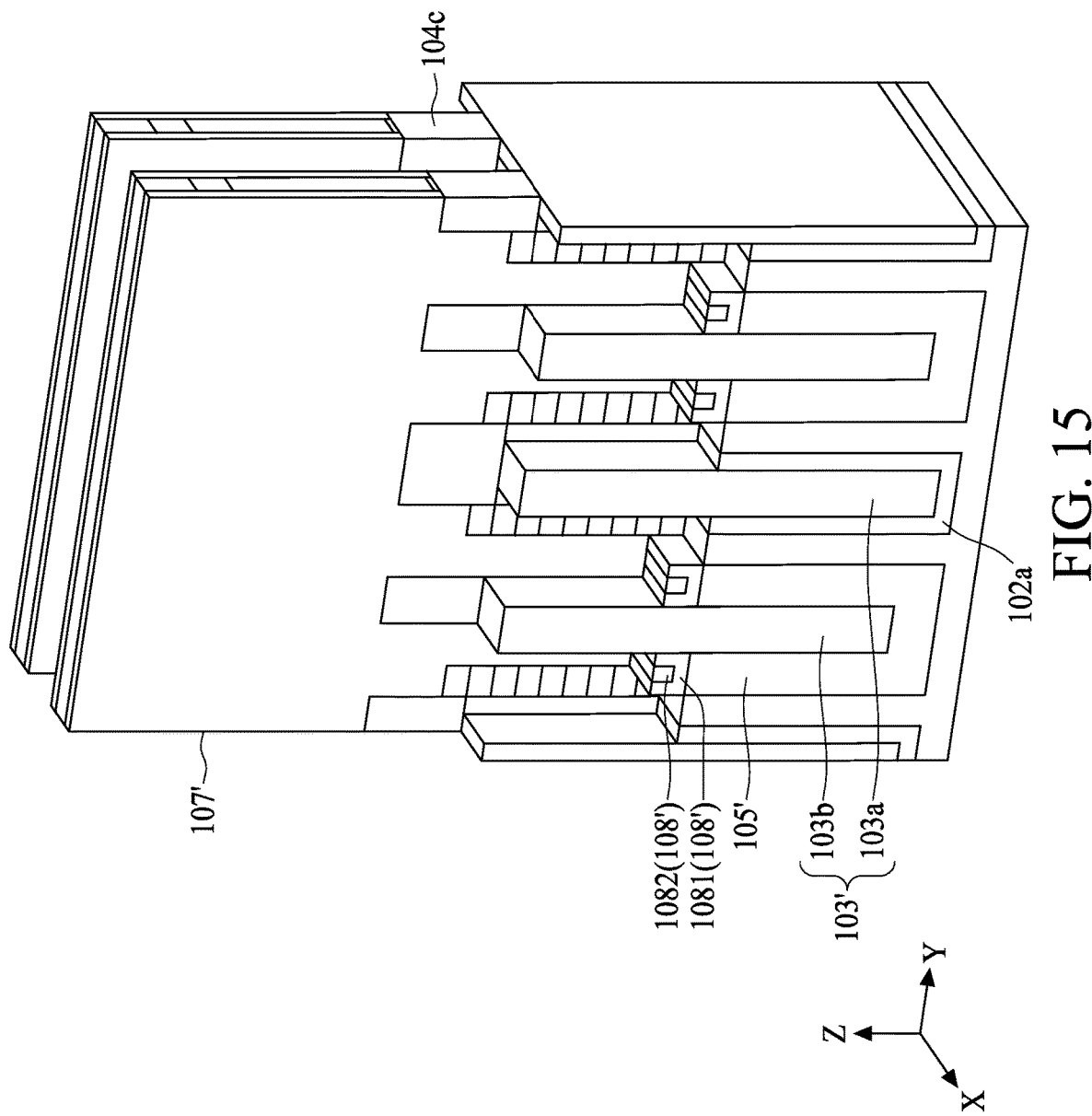

Referring to FIG. 15, in accordance with some embodiments of the present disclosure, a source/drain (hereinafter S/D) etching operation is performed to remove portions of the stacked fins 100b exposed from the dummy gate structures 107'. In some embodiments, portions of the seal spacers 108a and portions of the high-k isolation strips 104' exposed from the dummy gate structures 107' are also removed by the S/D etching operation. Portions of the high-k isolation strips 104' under the dummy gate structures 107' remain in place and are illustrated as a plurality of high-k isolation portions 104c.

Referring to FIG. 14 and FIG. 15, the seal spacer 108 may be a single layer or a multilayer structure. For instance, when the seal spacer 108 is a multilayer structure, each of remaining portions 108' of the seal spacers 108a after the S/D etching operation includes a spacer portion 1081 and a spacer portion 1082. In some embodiments, the remaining portion 108' is on the spacers 105' between the substrate fin 1001 and the low-k isolation strip 103b. In some embodiments, the remaining portions 108' serve to control a size of an epitaxial S/D structure in the subsequent process. In some embodiments, the stacked fins 100b and the high-k isolation strips 104c are substantially coplanar with an exposed sidewall of the dummy gate structure 107'.

Figure 16:
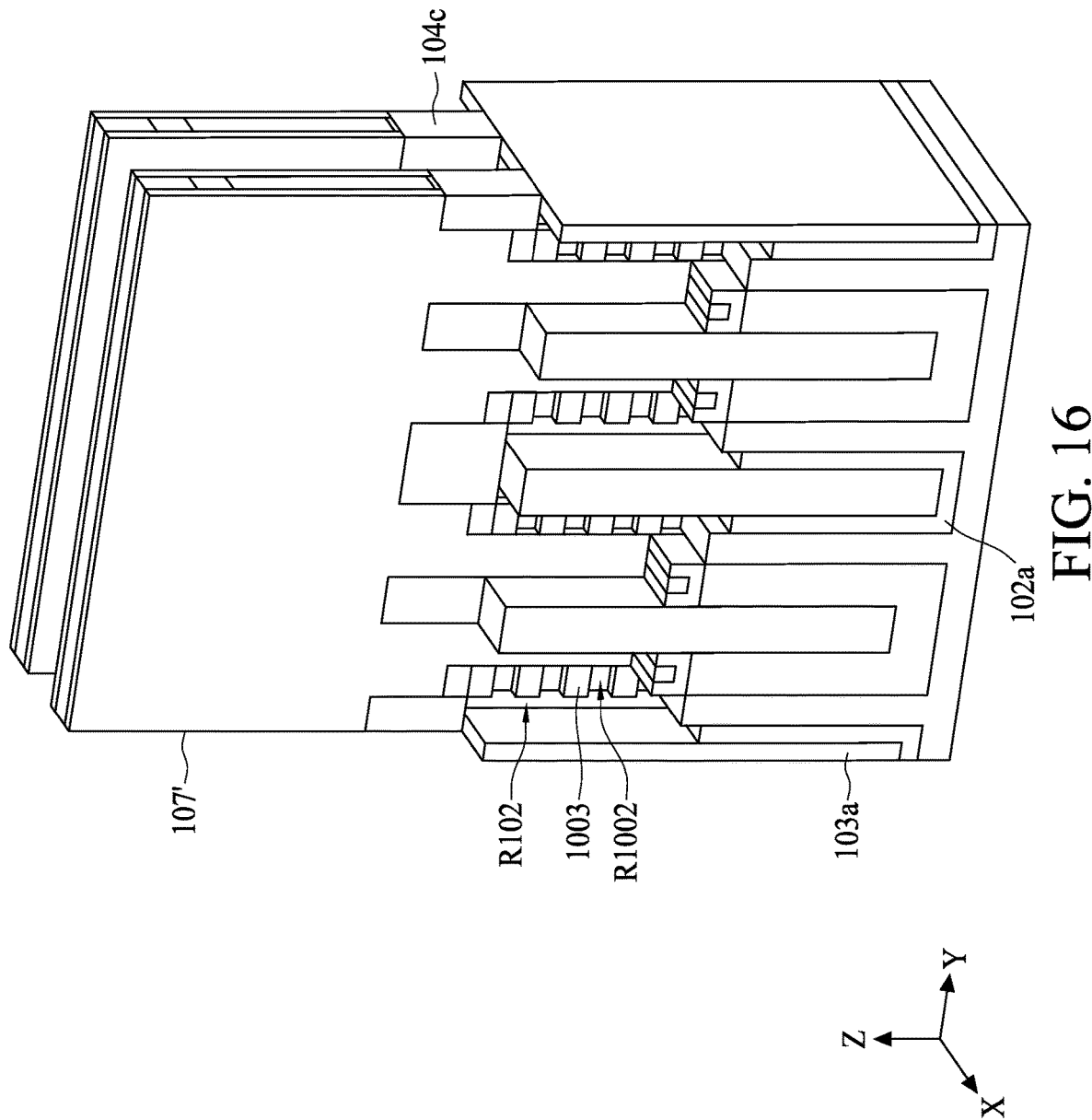

Referring to FIG. 16, in accordance with some embodiments of the present disclosure, a push-in operation is performed to partially remove the SiGe layers 1002 and the spacer 102a. In some embodiments, the push-in operation includes one or more wet etching operations. In some embodiments, a plurality of recesses R1002 in the SiGe layers 1002 between the Si layers 1003 are formed by a wet etching operation. In some embodiments, a recess R102 in the spacer 102a between the stacked fin 100b and the adjacent low-k isolation strip 103a is formed by another wet etching operation.

Figure 17:
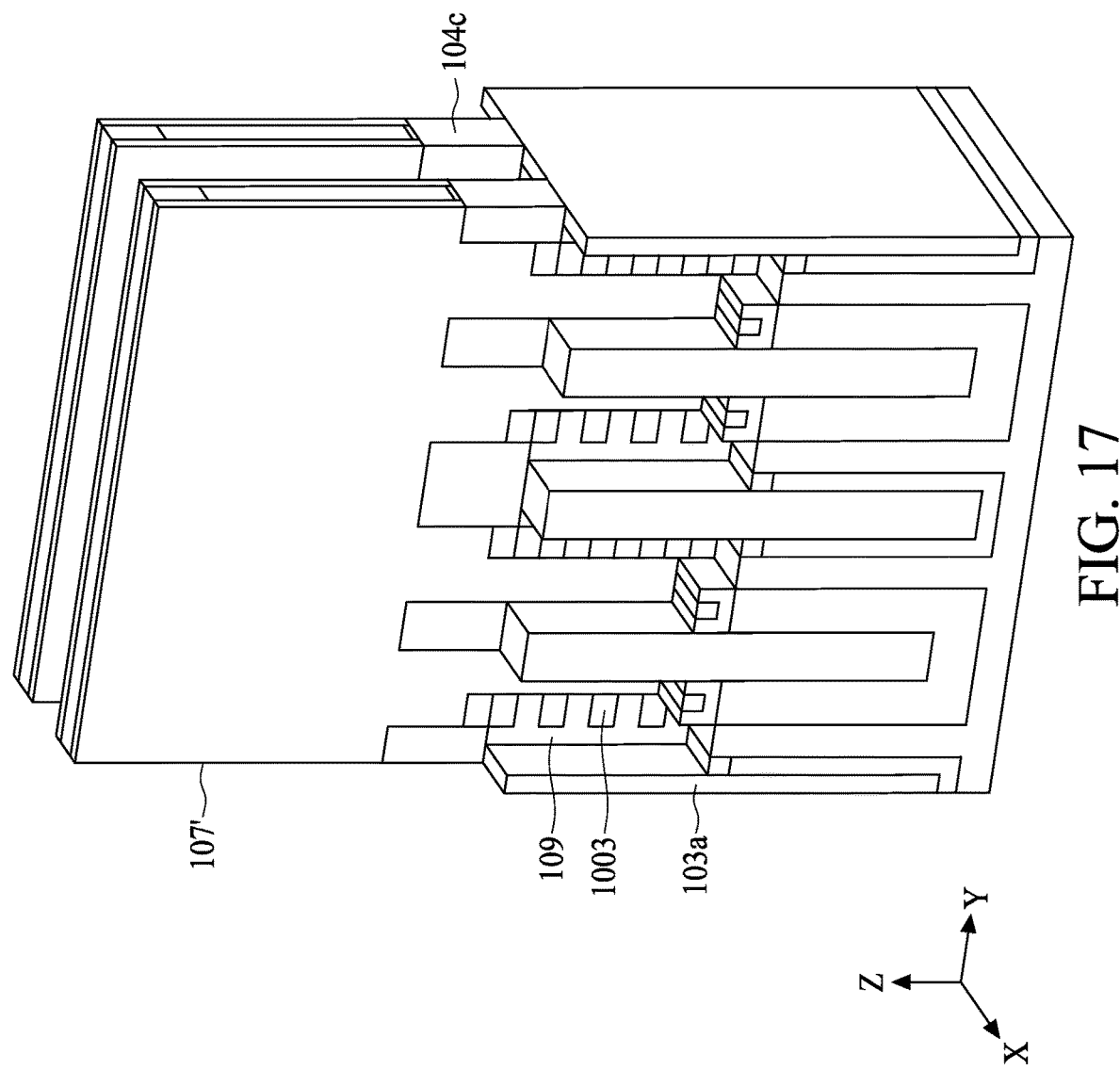

Referring to FIG. 17, in accordance with some embodiments of the present disclosure, an inner spacer deposition is performed to form an inner spacer 109 filling the recesses R1002 and the recesses R102. In some embodiments, the inner spacer 109 includes low-k dielectric materials. In some embodiments, the inner spacer 109 is between the Si layers 1003, and between the Si layers 1003 and the low-k isolation strips 103'. In some embodiments, the inner spacer deposition includes a conformal deposition, and the inner spacer 109 is formed to line the Si layers 1003, the low-k isolation strips 103a, the spacers 102a, and the high-k isolation strips 104a in the recesses R1002 and R102 toward centers of the recesses R1002 and R102. The recesses R1002 and R102 are sealed from the edges to the centers. In some embodiments, an etching operation is performed to remove portions of the inner spacer 109 outside the recesses R1002 and R102.

Figure 18:
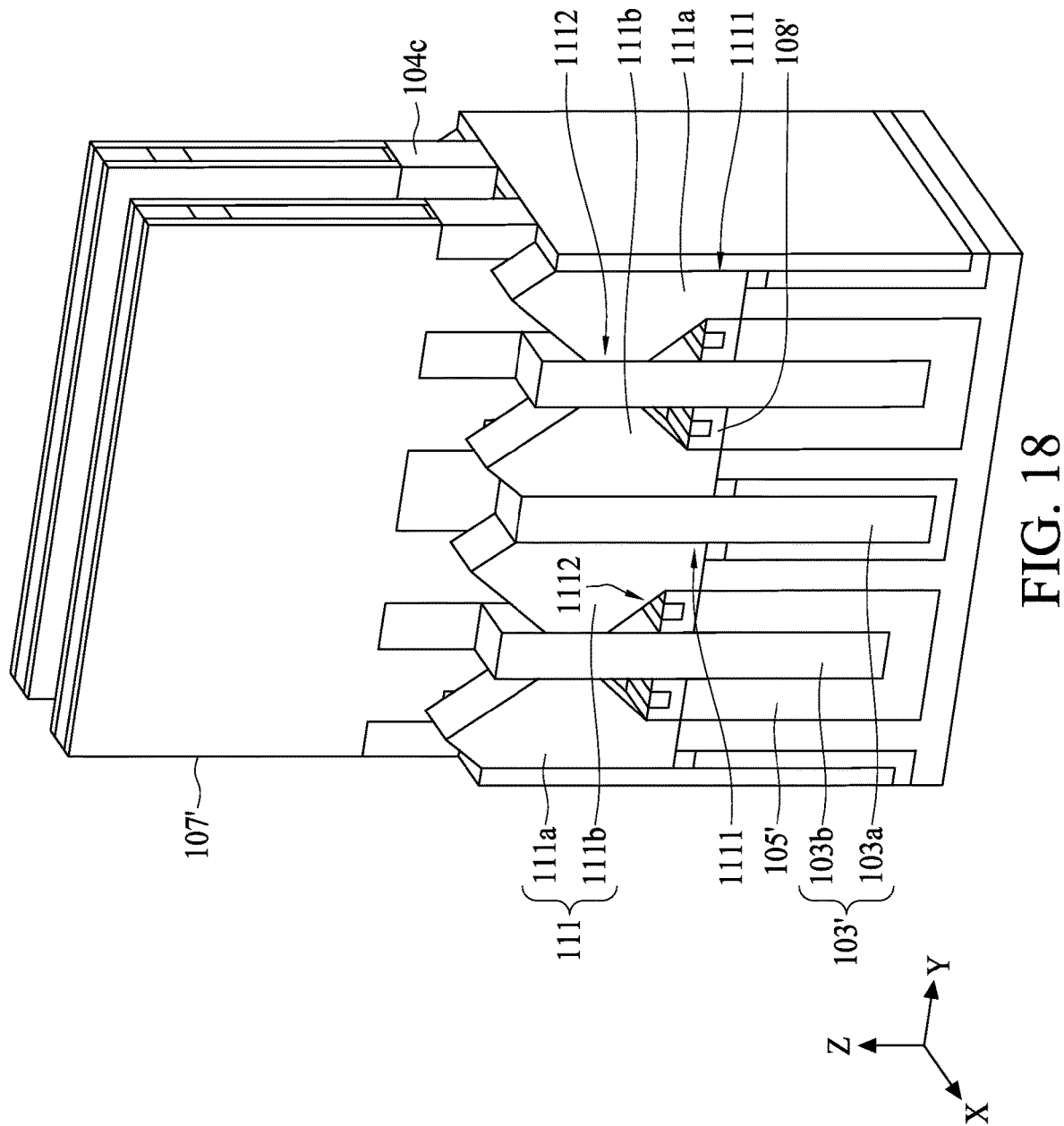

Referring to FIG. 18, in accordance with some embodiments of the present disclosure, an epitaxial growth is performed on the substrate fins 1001 to form S/D structures 111. In some embodiments, the S/D structures 111 include S/D structures 111a and S/D structures 111b of different types of transistors, respectively. Each of the S/D structures 111 has a first side boundary 1111 and a second side boundary 1112 opposite to the first side boundary. In some embodiments, the S/D structure 111 epitaxially grown along with and being conformal or constrained to a sidewall of one of the adjacent low-k isolation strips 103' (i.e., the adjacent low-k isolation strip 103a). In some embodiments, the S/D structure 111 epitaxially grown along the remaining portion 108' of the seal spacer 108a, and then freely extending to the adjacent low-k isolation strips 103' (i.e., the adjacent low-k isolation strip 103b) as a result of faceting. In some embodiments, the second side boundary 1112 is partially separated from and partially contacting the low-k isolation strip 103b.

Due to a difference between distances (e.g., a difference between the distances W105 and W102) between the fin structure 100a and the two adjacent low-k isolation strips 103' (e.g., the low-k isolation strips 103a and 103b), growing of the S/D structures 111 is constrained, particularly at a side of the S/D structures 111 proximal to the low-k isolation strip 103a.

Figure 19:
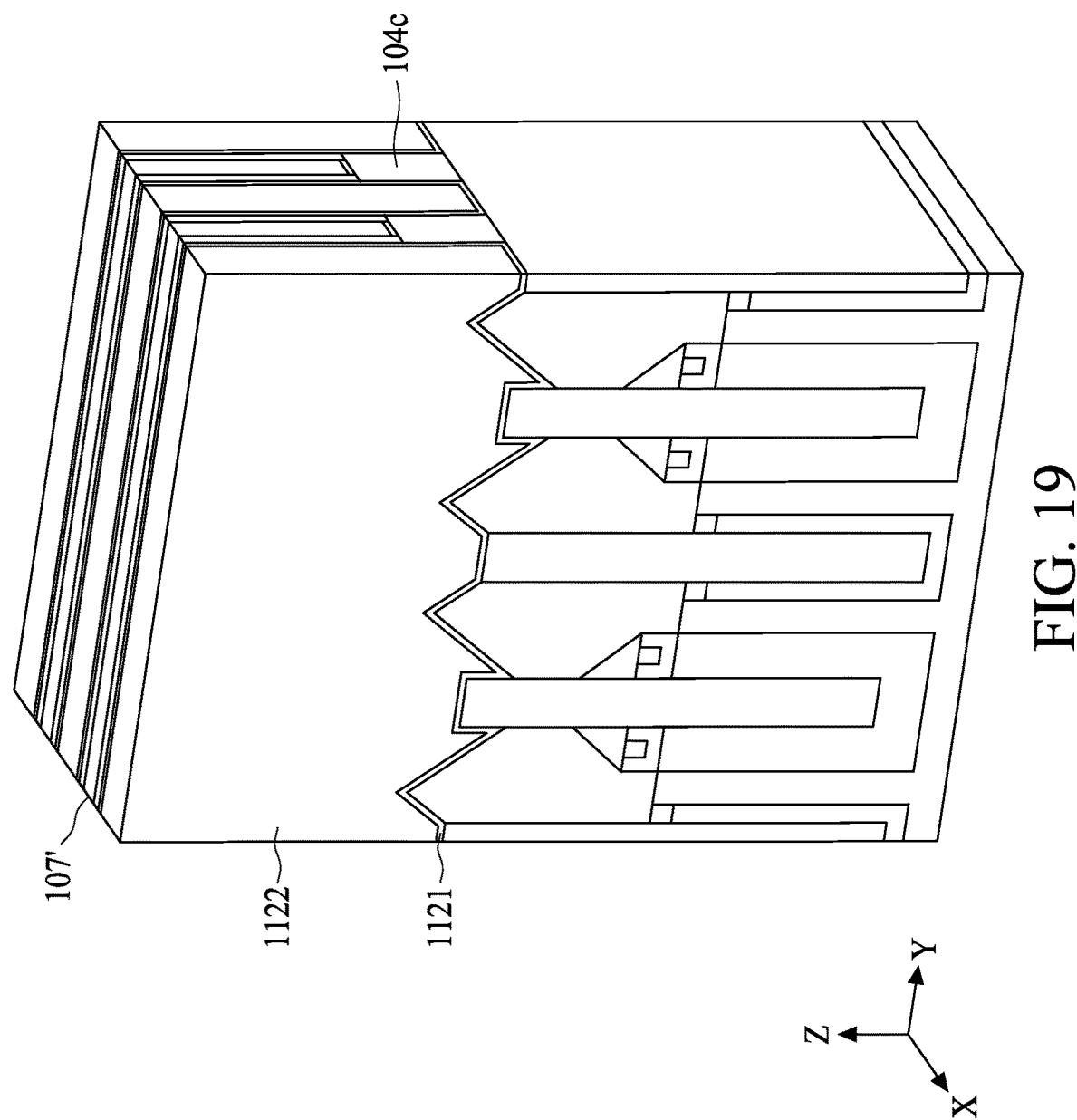

Referring to FIG. 19, in accordance with some embodiments of the present disclosure, a liner layer 1121 and a dielectric layer 1122 are formed over the substrate 100. The liner layer 1121 is formed conformally over the S/D structures 111, the low-k isolation strips 103', and the dummy gate structures 107'. The dielectric layer 1122 formed by blanket deposition fills spaces between the dummy gate structures 107 over the substrate 100. A planarization operation is performed in order to remove hard mask structure 101 and expose the polysilicon layer 1071 of the dummy gate structure 107'.

Figure 20:
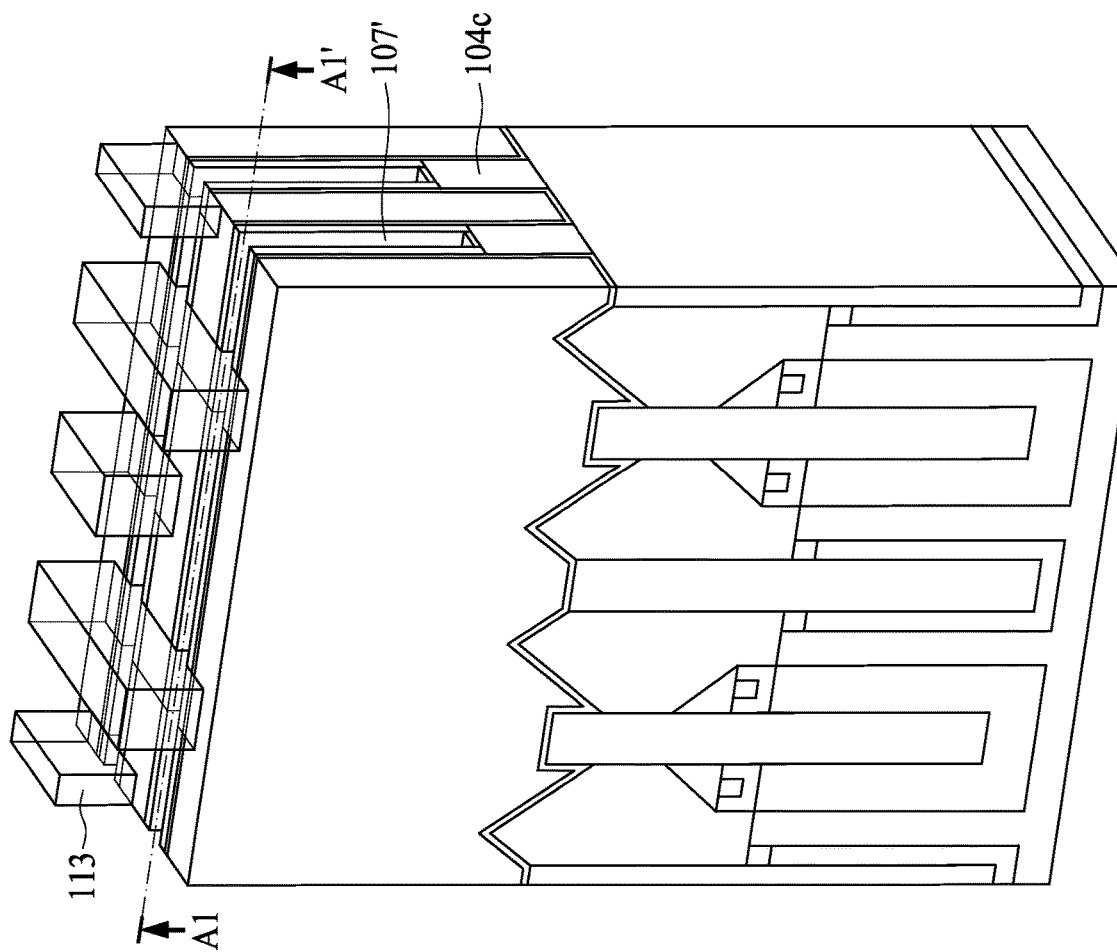
Figure 21:
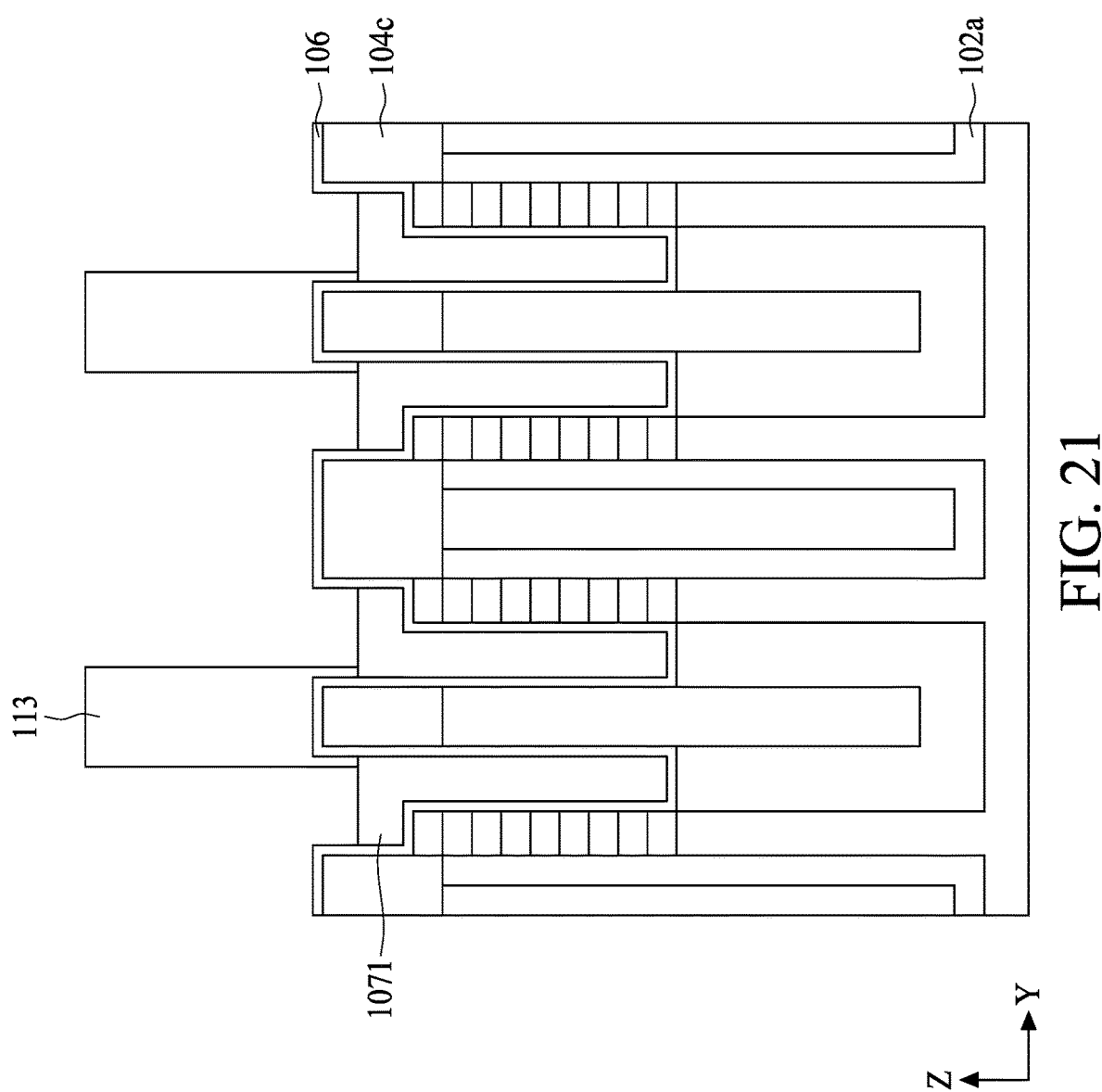

Referring to FIG. 20, in accordance with some embodiments of the present disclosure, the dummy layer 1071 is partially removed to expose the high-k isolation portions 104c, and a patterned photomask layer 113 is subsequently formed covering a portion of the high-k isolation portions 104c. In some embodiments, portions of the polysilicon layer 1071 above the high-k isolation portions 104c are removed. FIG. 21 shows a vertically cut cross-sectional view (i.e., a cross-sectional view cut along Y axis; herein after called Y-cut cross-sectional view) of the structure shown in FIG. 20 along a line A1-A1' at gate regions. In some embodiments, a portion of the patterned photomask layer 113 covers the top of the dummy gate structures 107' and fills spaces between the gate spacers 108b at the removed portion of the polysilicon layer 1071.

FIGS. 22 to 26 are Y-cut cross-sectional views along the line A1-A1' in FIG. 20 in accordance with one or more subsequent operations for formation of gate structures.

Figure 22:
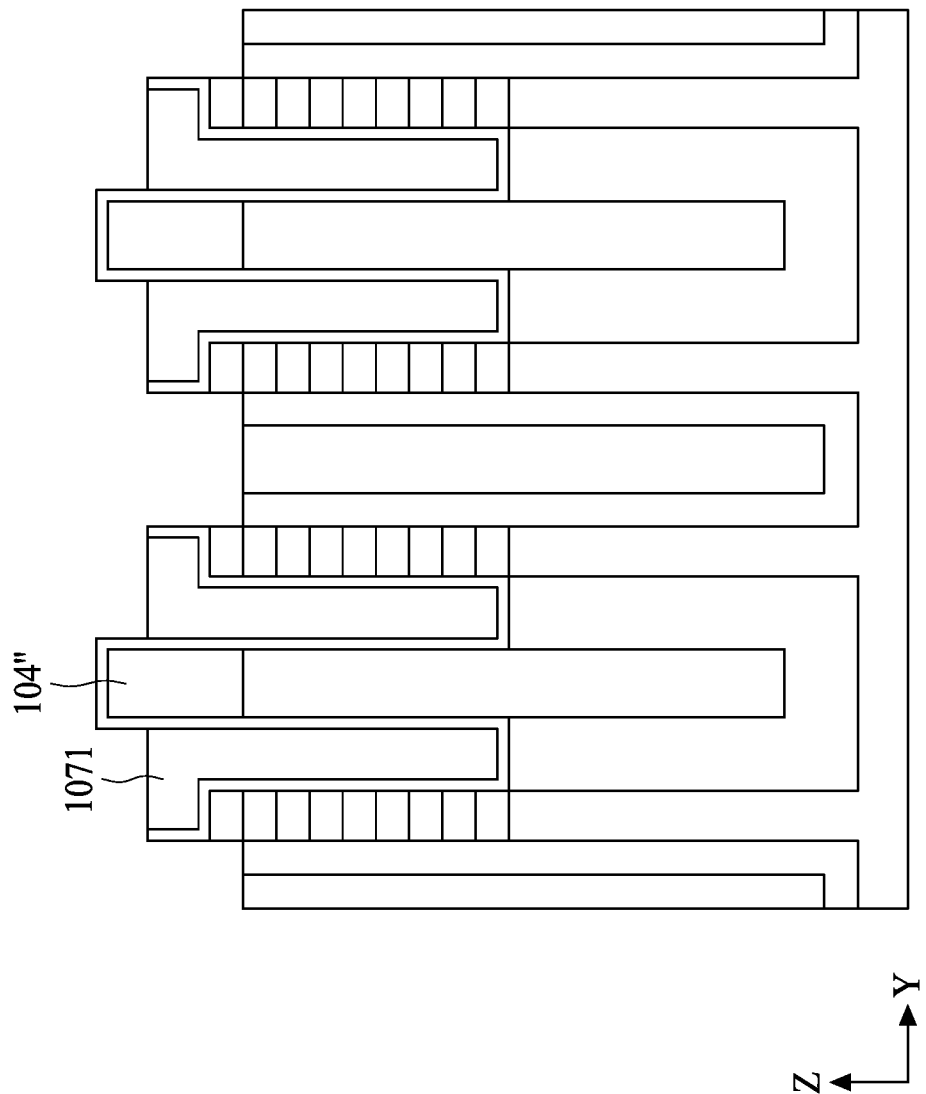

Referring to FIG. 22, the high-k isolation portions 104c exposed from the patterned photomask layer 113 are removed, and a plurality of high-k isolation segments 104" are formed. The plurality of the high-k isolation segments 104" are formed on tops of portions of the low-k isolation strips 103' at positions where gate structures of transistors are designed to be separated.

Figure 23:
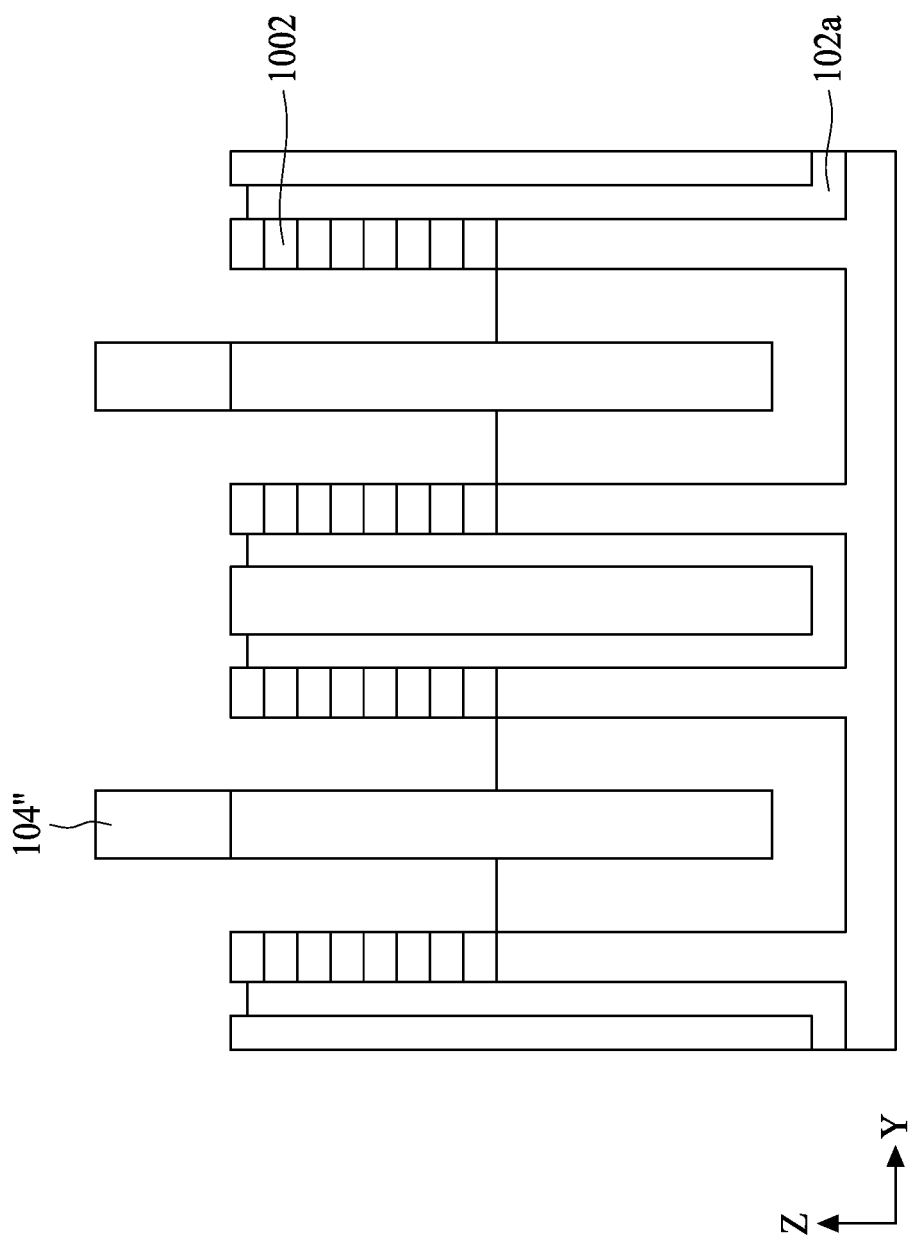
Figure 24:
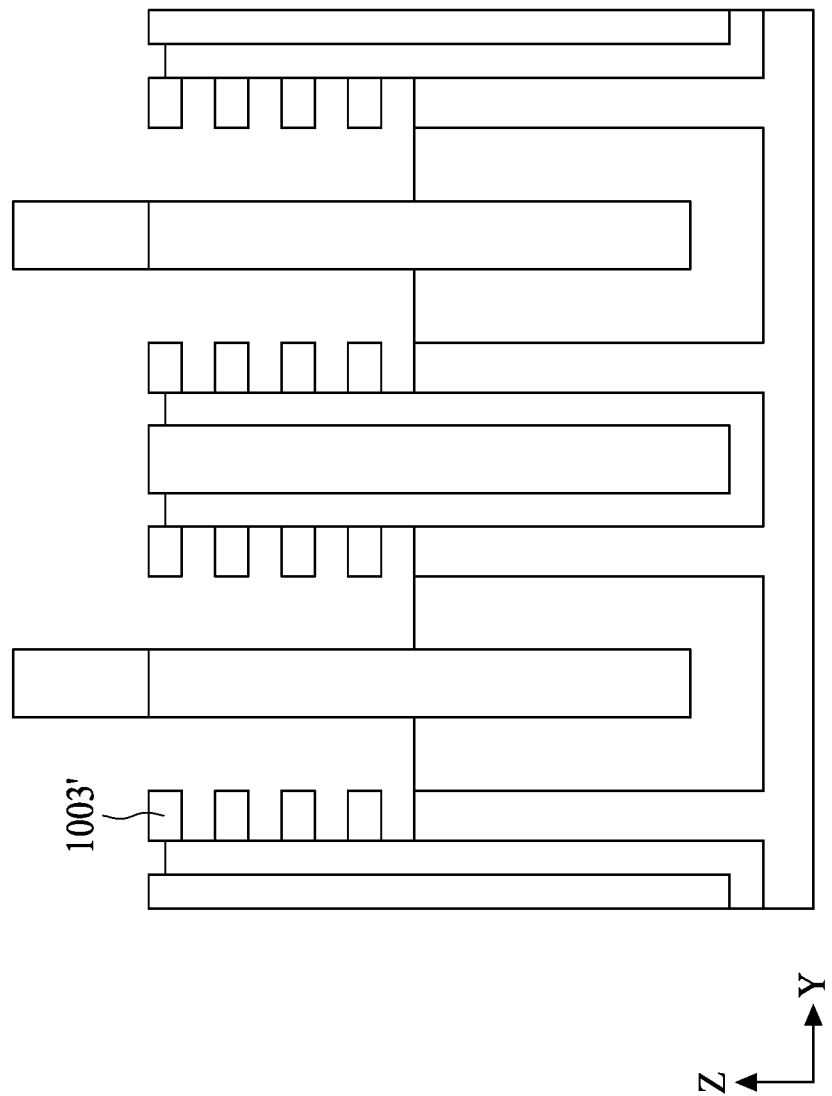
Figure 25:
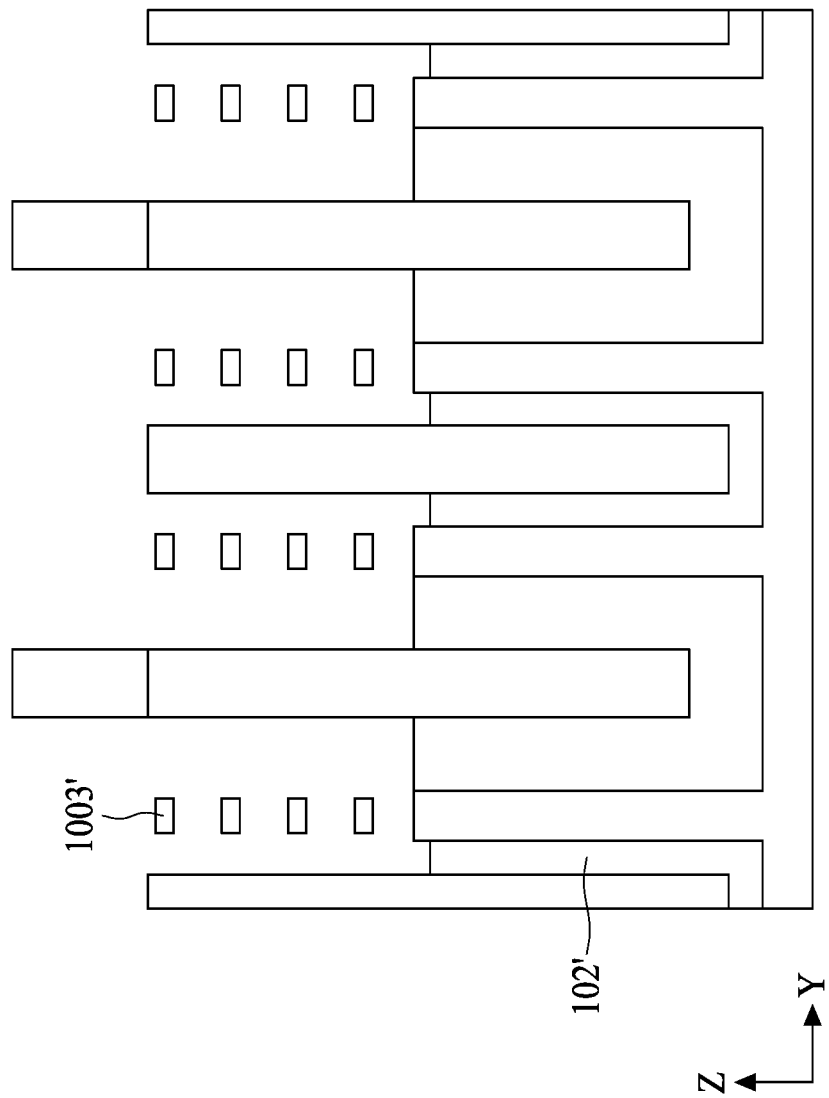

Referring to FIGS. 23 to 24, the patterned photomask layer 113, the remaining polysilicon layer 1071, and the hard mask layer 1011 are removed. A nanowire release operation is then performed as shown in FIG. 24 by removing exposed portions of the SiGe layers 1002 at the gate regions. Next, a dielectric removal operation is performed to remove portions of the spacer 102a to expose the Si layers 1003 entirely at the gate regions as shown in FIG. 25 (in the following description the released Si layers 1003 are referred to as nanowires 1003'). In some embodiments, the portions of the spacer 102a above the substrate fins 1001 (or horizontally adjacent to the stacked fins 100b) are removed to form a plurality of spacers 102'. In some embodiments, a diameter of the nanowire 1003' is reduced by the dielectric removal operation. In the embodiments as shown in FIG. 25, wherein the dielectric layer 102 is a single oxide layer, the dielectric removal operation includes an oxide wet etching operation.

Figure 26:
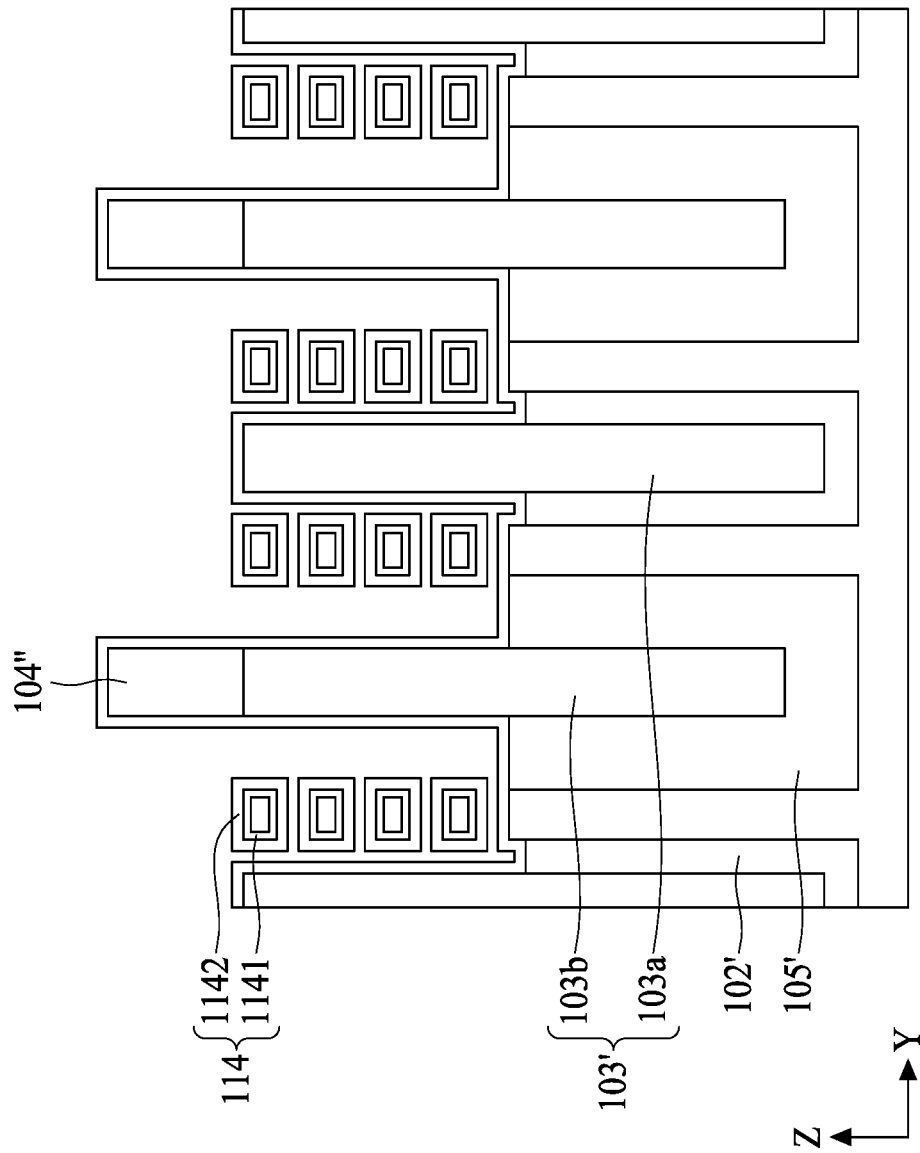

Referring to FIG. 26, a gate dielectric layer 114 is formed conformally over the substrate 100. The gate dielectric layer 114 surrounds the nanowires 1003' and conforms to the exposed low-k isolation strips 103', the high-k isolation segments 104", and the spacers 102' and 105'. In some embodiments, the gate dielectric layer 114 includes a low-k dielectric layer 1141 and a high-k dielectric layer 1142. In some embodiments, the low-k dielectric layer 1141 and the high-k dielectric layer 1142 are sequentially formed. In some embodiments, the low-k dielectric layer 1141 is formed only around the nanowires 1003', and the high-k dielectric layer 1142 is formed on the low-k dielectric layer 1141 around the nanowires 1003' and also over the exposed low-k isolation strips 103', high-k isolation segments 104", and the spacers 102' and 105'. In some embodiments, the low-k dielectric layer 1141 covers only channel regions of a transistor. In the embodiments shown in FIG. 26, after the formation of the gate dielectric layer 114, the nanowires 1003' are separated from the low-k isolation strips 103', particularly the low-k isolation strips 103a, by a space large enough for a gate electrode to be formed therebetween.

Figure 27:
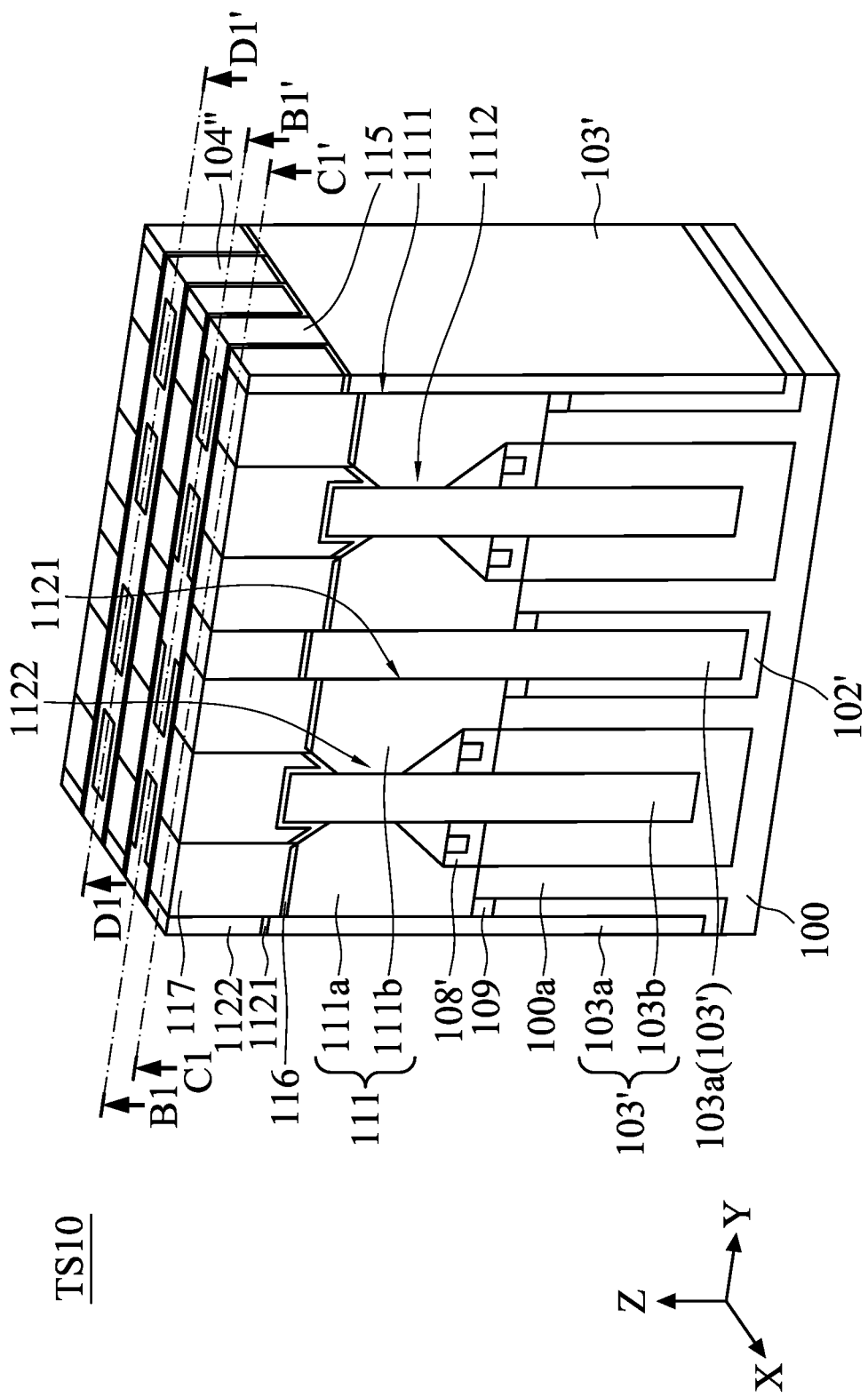

Referring to FIG. 27, a plurality of gate electrodes 115 are formed, a planarization operation is performed after the formation of the gate electrodes 115, and a silicide 116 and an S/D contact 117 are formed on the S/D structure 111 prior to or after the planarization operation. A semiconductor structure TS10 is formed as shown in FIGS. 27 to 30, wherein FIGS. 28 to 30 are Y-cut cross-sectional views along a line B1-B1' (Y-cut on the gate structures), a line C1-C1' (Y-cut on the S/D structures) and a line D1-D1' (Y-cut between the gate and the S/D structures), respectively, as shown in FIG. 27.

Figure 28:
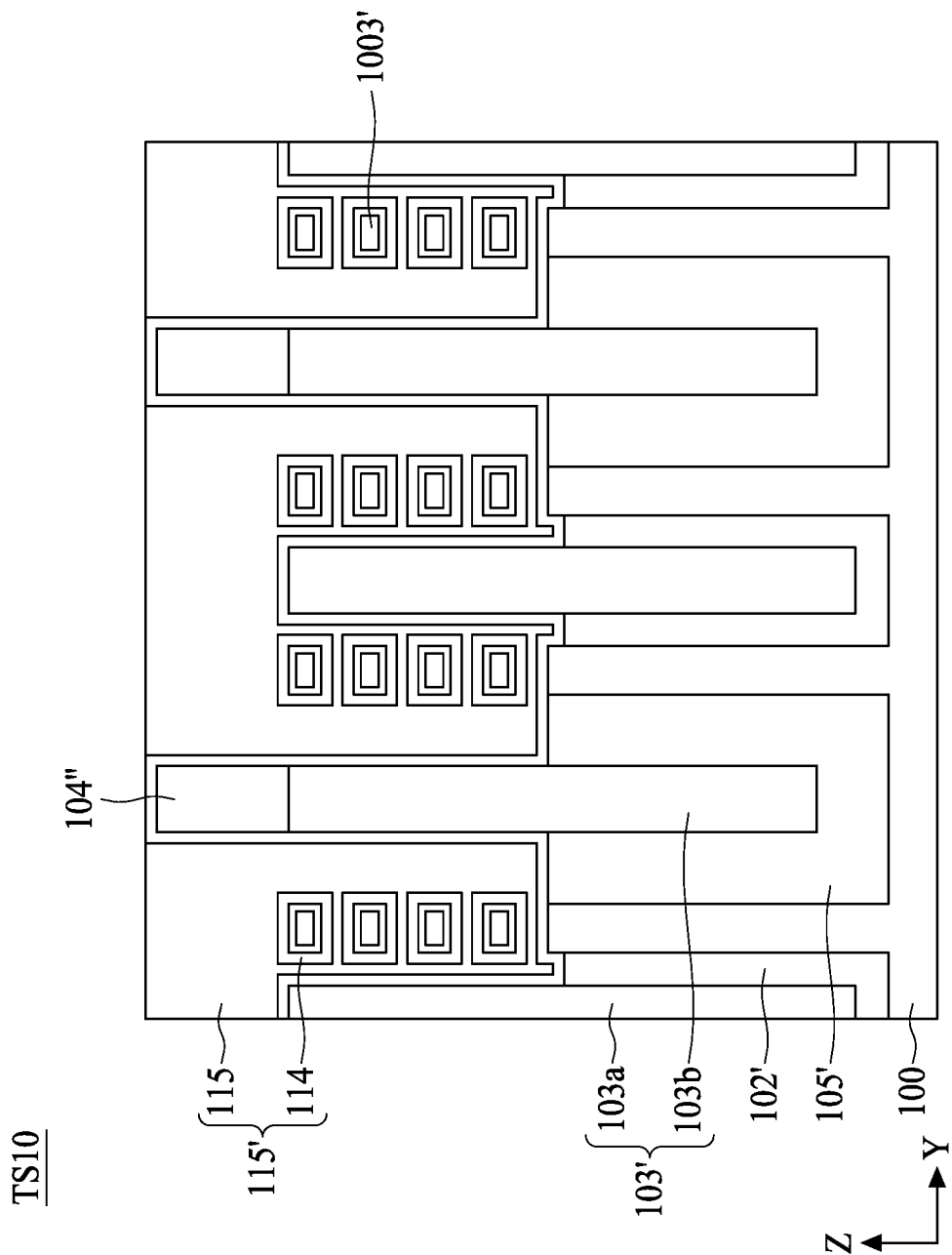
FIGS. 28 to 30 are cross-sectional views cut along lines B1-B1', C1-C1', and D1-D1' shown in FIG. 27 in accordance with some embodiments of the present disclosure.

As shown in FIGS. 27 and 28, a plurality of gate electrodes 115 are formed over the substrate 100, and a plurality of gate structures 115', including the gate dielectric layer 114 and the gate electrodes 115, are formed. In some embodiments, the gate structure 115' surrounds the nanowires 1003' and is between the low-k isolation strips 103' and also between the high-k isolation segments 104". In some embodiments, some of the gate structures 115' surround and cover the tops of one or more of the low-k isolation strips 103'. In some embodiments, the gate structures 115' are separated by the stacked low-k isolation strips 103' and the high-k isolation segments 104". In some embodiments, tops of the high-k isolation segments 104" are coplanar with tops of the gate structures 115'.

The high-k isolation segments 104" on the tops of the low-k isolation strips 103' function to isolate the gate structures 115'. Formation of the high-k isolation segments 104" replaces a cutting gate operation in conventional manufacturing. The cutting gate operation of conventional manufacturing is carried out by lithography, and a space is required to be reserved between different gate structures. More specifically, distances between the nanowires of different transistors or distances between the nanowires and the adjacent isolation structures are constrained for a purpose of reserving spaces for the lithographic processes. A size of a cell of a group of transistors on a chip is hence constrained. The high-k isolation segments 104" of the present disclosure require less space than the space required for the photolithography in the cutting gate operation. Applications of the high-k isolation segments 104" can provide smaller distances between the gate structures, and therefore a size of a cell of groups of transistors can be decreased, or active areas (or lengths of nanowires) of the cell can be increased to enhance speed of a device if the size of the cell is constant.

Figure 29:
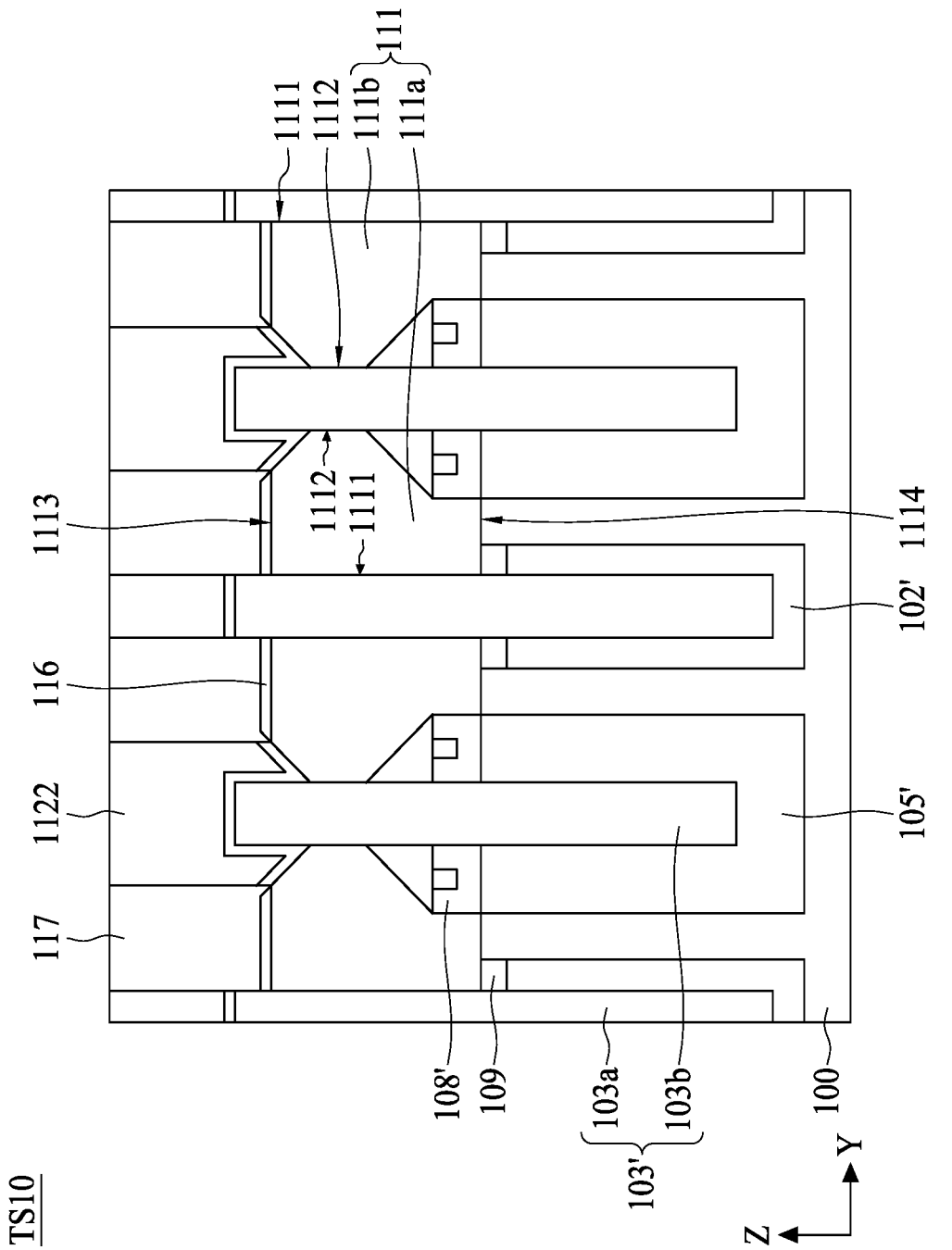
Figure 30:
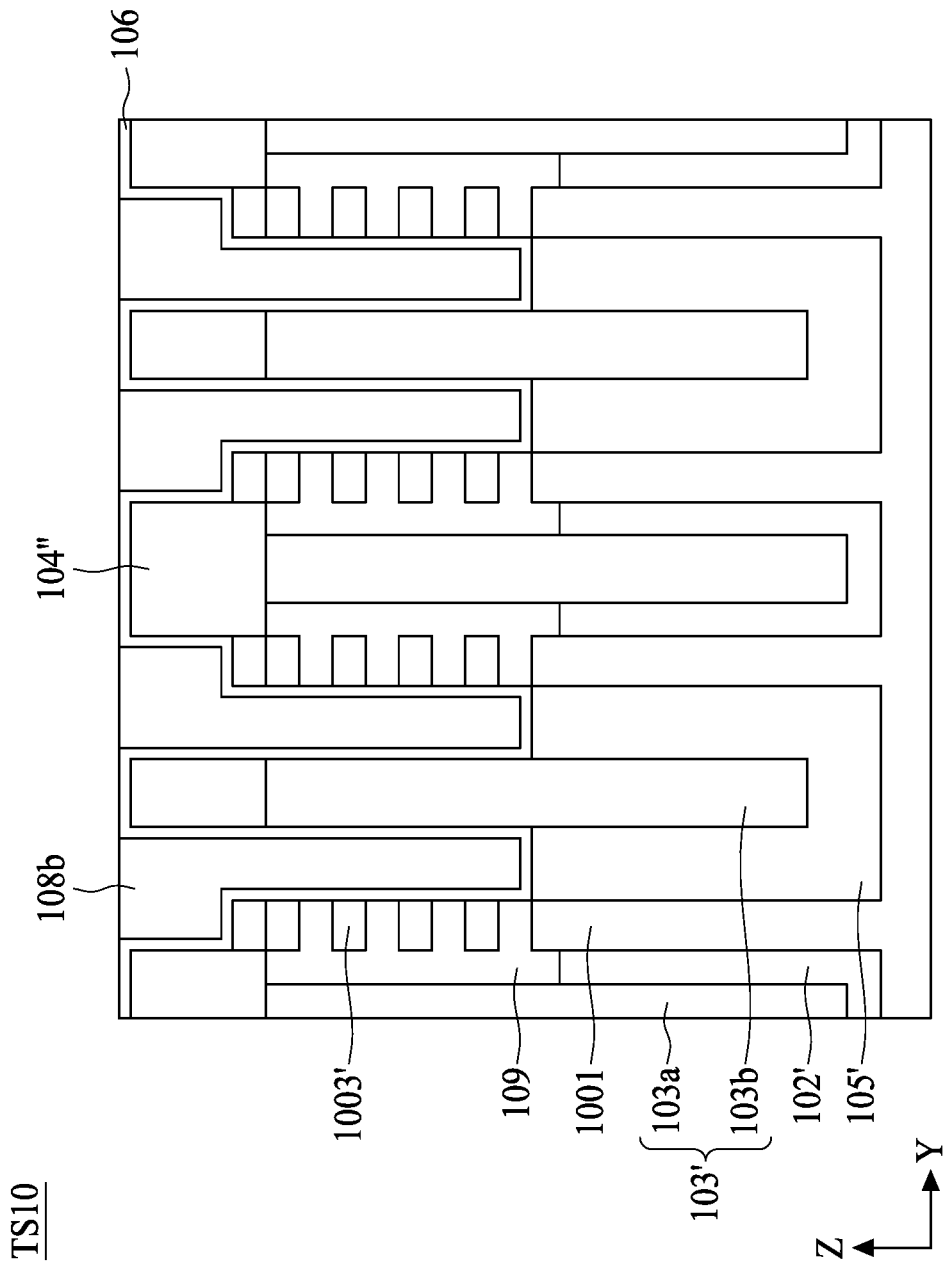

As shown in FIG. 29, the silicide 116 and the S/D contact 117 are formed on each of the S/D structures 111 prior to or after the planarization operation. In some embodiments, a top portion of the S/D structure 111 is removed from the formation contact recesses in the dielectric layer 1122 for the S/D contact 117. In some embodiments as shown in FIG. 29, each of the S/D structures 111, for example, the S/D structures 111a or the S/D structures 111b, possesses a first side boundary 1111 in contact with the low-k isolation strip 103a, a second side boundary 1112 in contact with low-k isolation strip 103b, a top boundary 1113 and a bottom boundary 1114. The aforesaid boundaries enclose an area with a half diamond shape at the cross section dissecting along line C1-C1' of FIG. 27. The silicide 116 is formed on top of the S/D structure 111, and the first side boundary 1111 and the second side boundary 1112 respectively connect the top boundary 1113 and the bottom boundary 1114 of the S/D structure 111. The bottom of boundary 1114 of the S/D structure 111 contacts the substrate fin 1001 and the top boundary 1113 contacts the silicide 116. In some embodiments, the first side boundary 1111 is entirely conformal to the sidewall of the low-k isolation strip 103a. In some embodiments, the first side boundary 1111 is a substantially planar surface and coplanar with the sidewall of the low-k isolation strip 103a. In some embodiments, the second side boundary 1112 is a convex surface. In some embodiments, only a portion of the second side boundary 1112 contacts the sidewall of the low-k isolation strip 103b.

As shown in FIG. 30, the inner spacer 109 is formed not only between the nanowires 1003' but also between the nanowires 1003' and the low-k isolation strip 103a of the low-k isolation strips 103' over the spacer 102'. Due to capillary phenomenon, a side-etching effect often occurs when the target layer has a thickness in certain ranges. However, it is necessary to avoid damaging the S/D structures 111 during the formation of the nanowires 1003'. The inner spacer 109 formed between the gate structure 115' and the S/D structures 111 functions to prevent the side-etching damage to the S/D structures 111 during the nanowire release operation shown in FIG. 24 and the dielectric removal operation shown in FIG. 25. In particular, the portion of the inner spacer 109 formed over the spacer 102' between the nanowires 1003' and the low-k isolation strips 103' can prevent the side-etching effect, and distances between the nanowires 1003' and the adjacent isolation structure (i.e., the low-k isolation strip 103a of the low-k isolation strips 103') can be reduced without damage to the S/D structures 111. Thus, a size of the semiconductor structure TS10 can be also reduced.

The present disclosure provides a method to cut the gate by integrating formation of the high-k isolation segments into a GAA manufacturing process. In the above-provided embodiments, the inner spacer 109 is applied to prevent side-etching damage to the S/D structures 111 caused by reduced distances between adjacent gate structures 115'.

Figure 38:
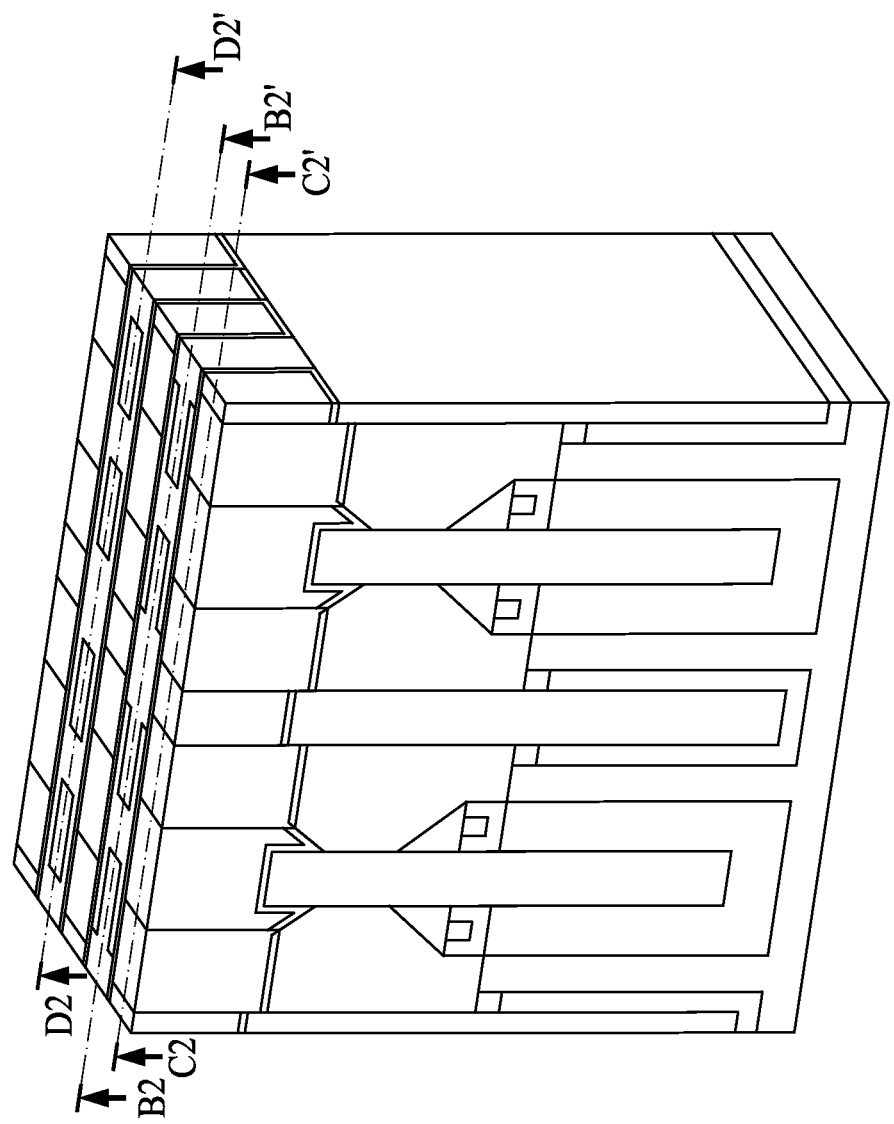
Figure 39:
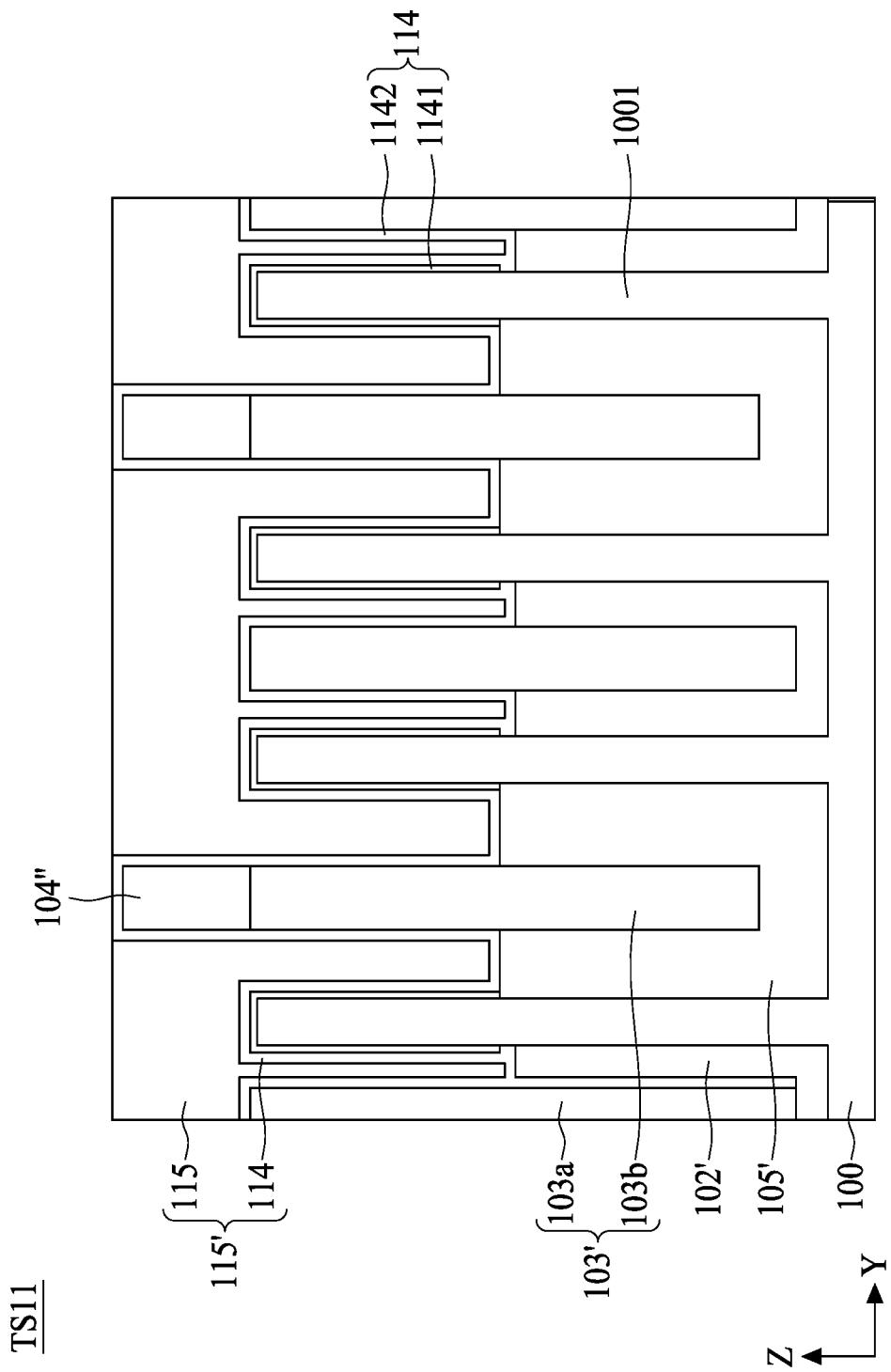
FIGS. 39 to 41 are cross-sectional views cut along lines B2-B2', C2-C2', and D2-D2' shown in FIG. 38 in accordance with some embodiments of the present disclosure.
Figure 40:
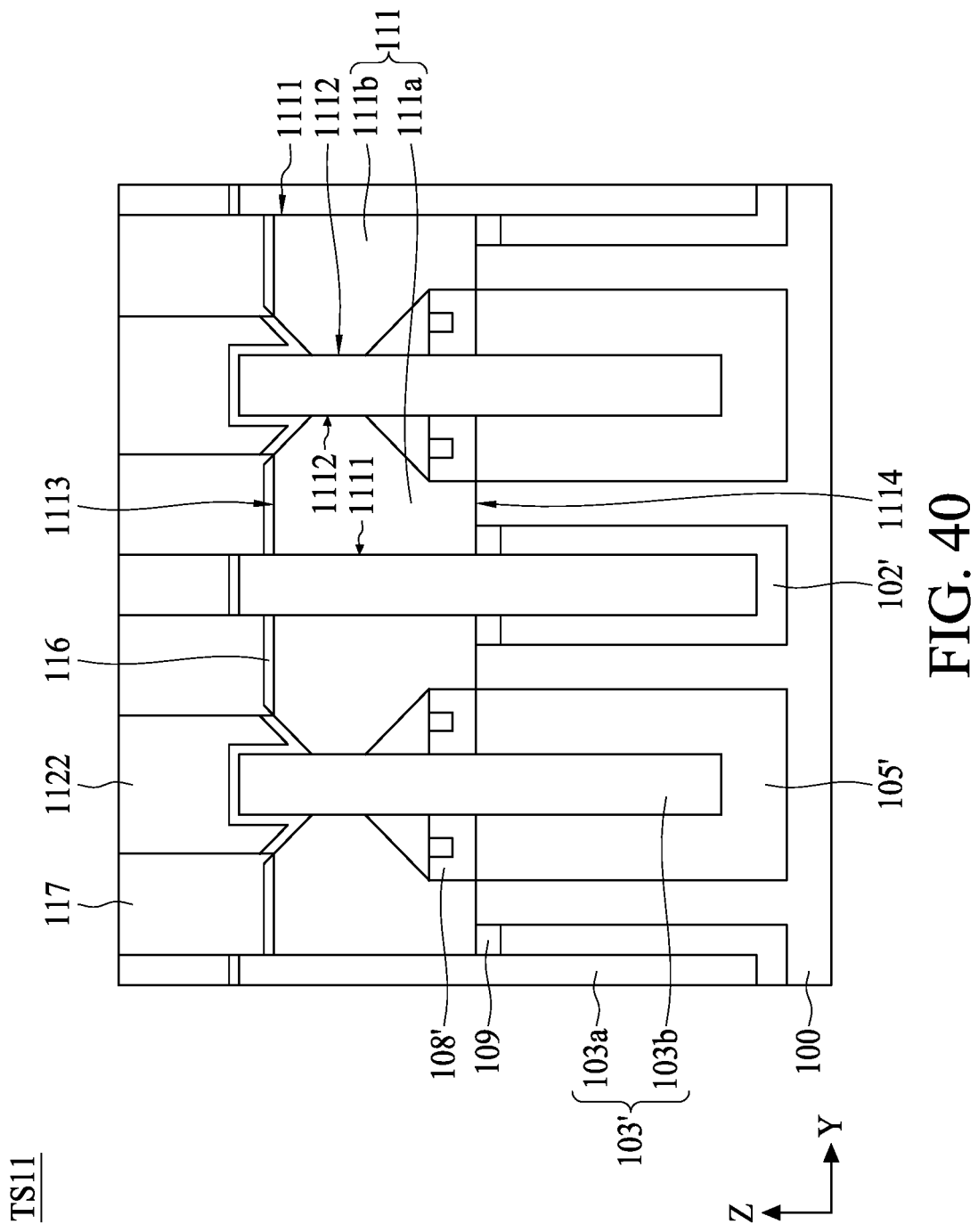
Figure 41:
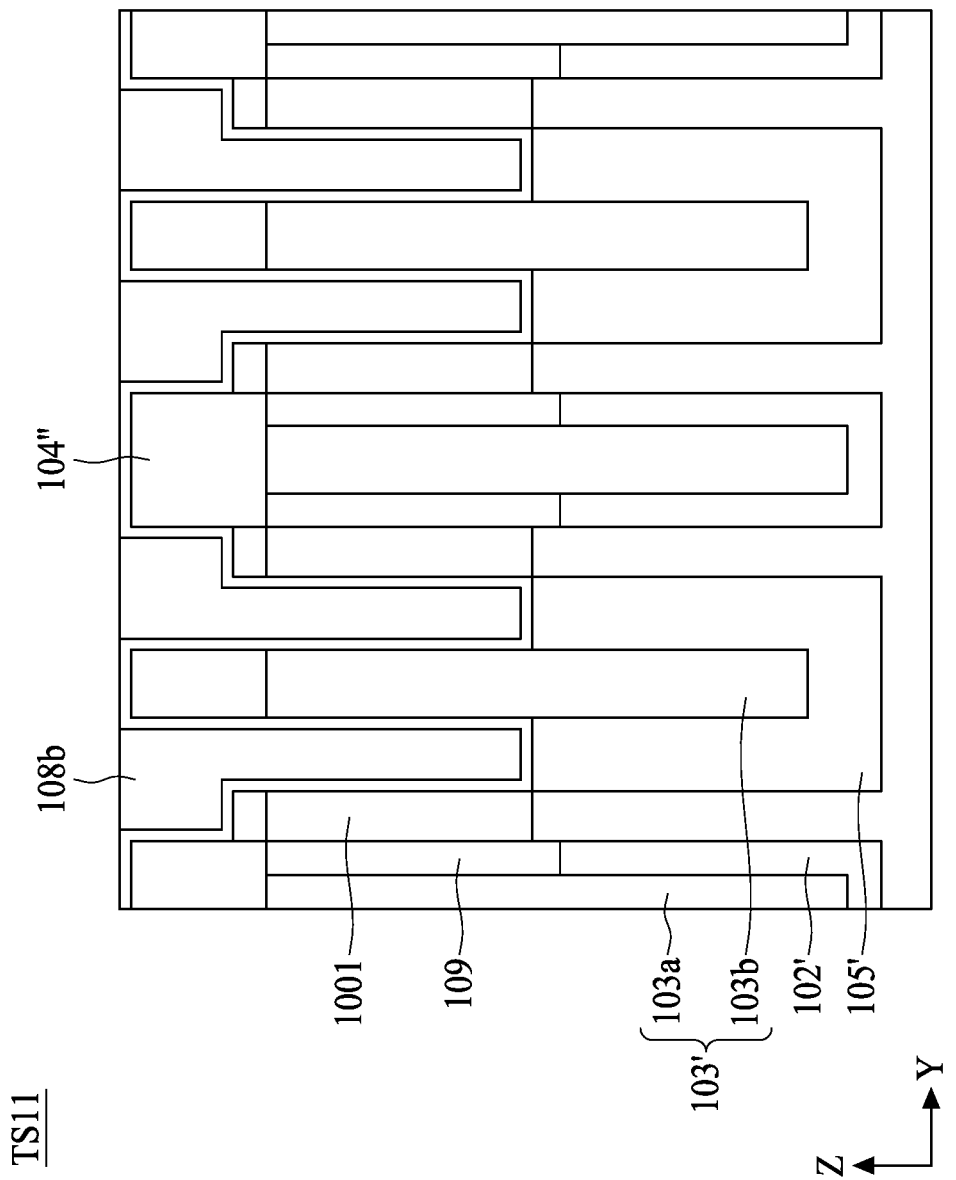

Similar concepts of high-k isolation segments 104" and inner spacer structures as illustrated above can be also applied in a fin field effect transistor (FinFET). FIGS. 31 to 38 show one or more operations of the method M10 as it applies to a FinFET in accordance with some embodiments of the present disclosure. A semiconductor structure TS11 is formed as shown in FIGS. 38 to 41, wherein FIGS. 39 to 41 are Y-cut cross-sectional views along lines B2-B2', C2-C2' and D2-D2', respectively, shown in FIG. 38.

Figure 31:
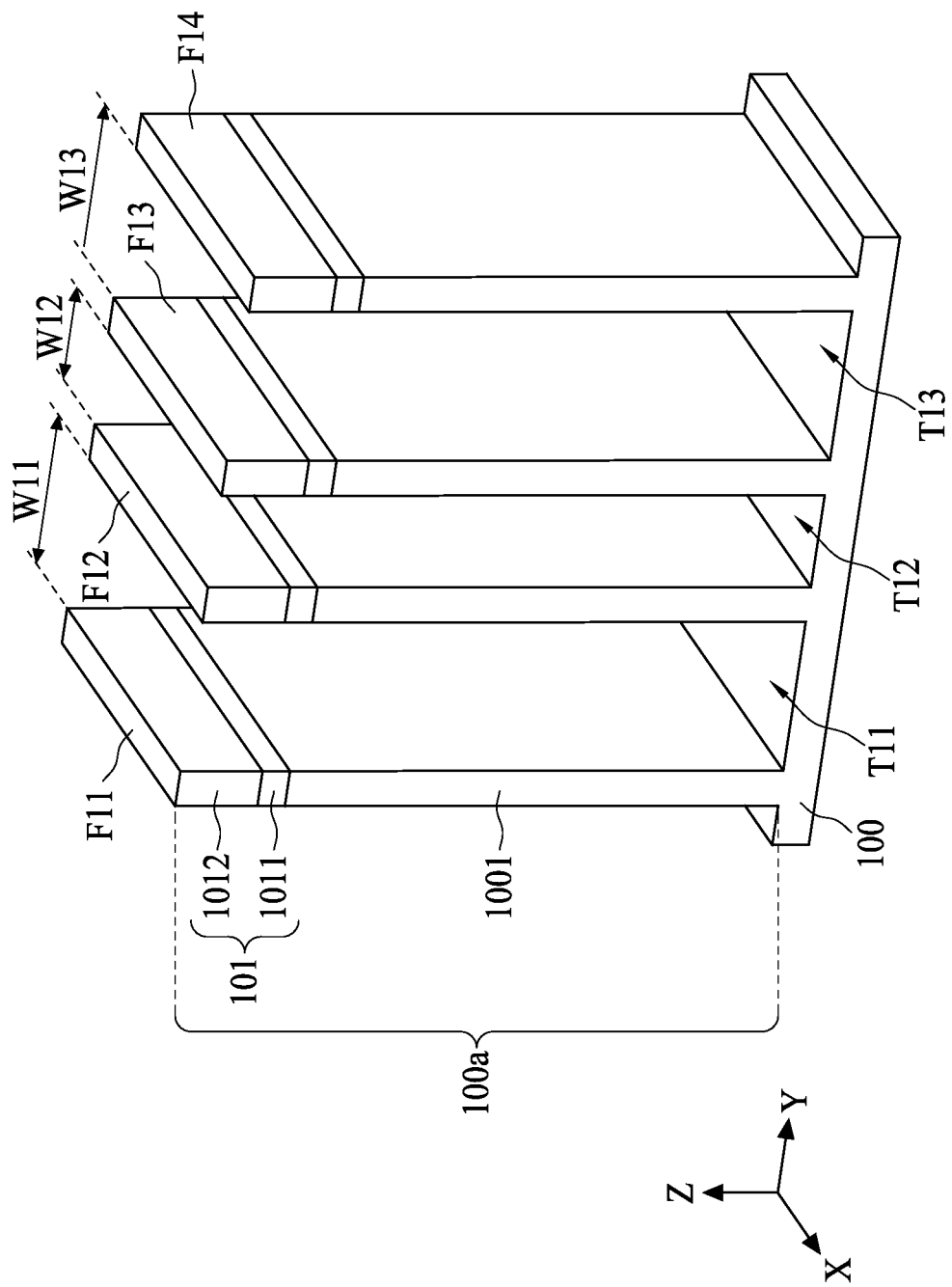
FIGS. 31 to 38 are diagrammatic views of one or more operations of a method for forming a semiconductor structure in accordance with some embodiments of the present disclosure.

Referring to FIG. 31, a plurality of fin structures 100a is formed over the substrate 100. In some embodiments, each of the fin structures 100a includes a hard mask structure 101 on top of a substrate fin 1001. A plurality of trenches T11, T12 and T13 is formed between fin structures F11, F12, F13 and F14. In some embodiments, a width W11 of the trench T11 is substantially the same as a width W13 of the trench T13, and the width W11 is greater than a width W12 of the trench T12. The embodiments shown in FIG. 31 are similar to the embodiments shown in FIG. 3 but without the stacked fins 100b.

Figure 32:
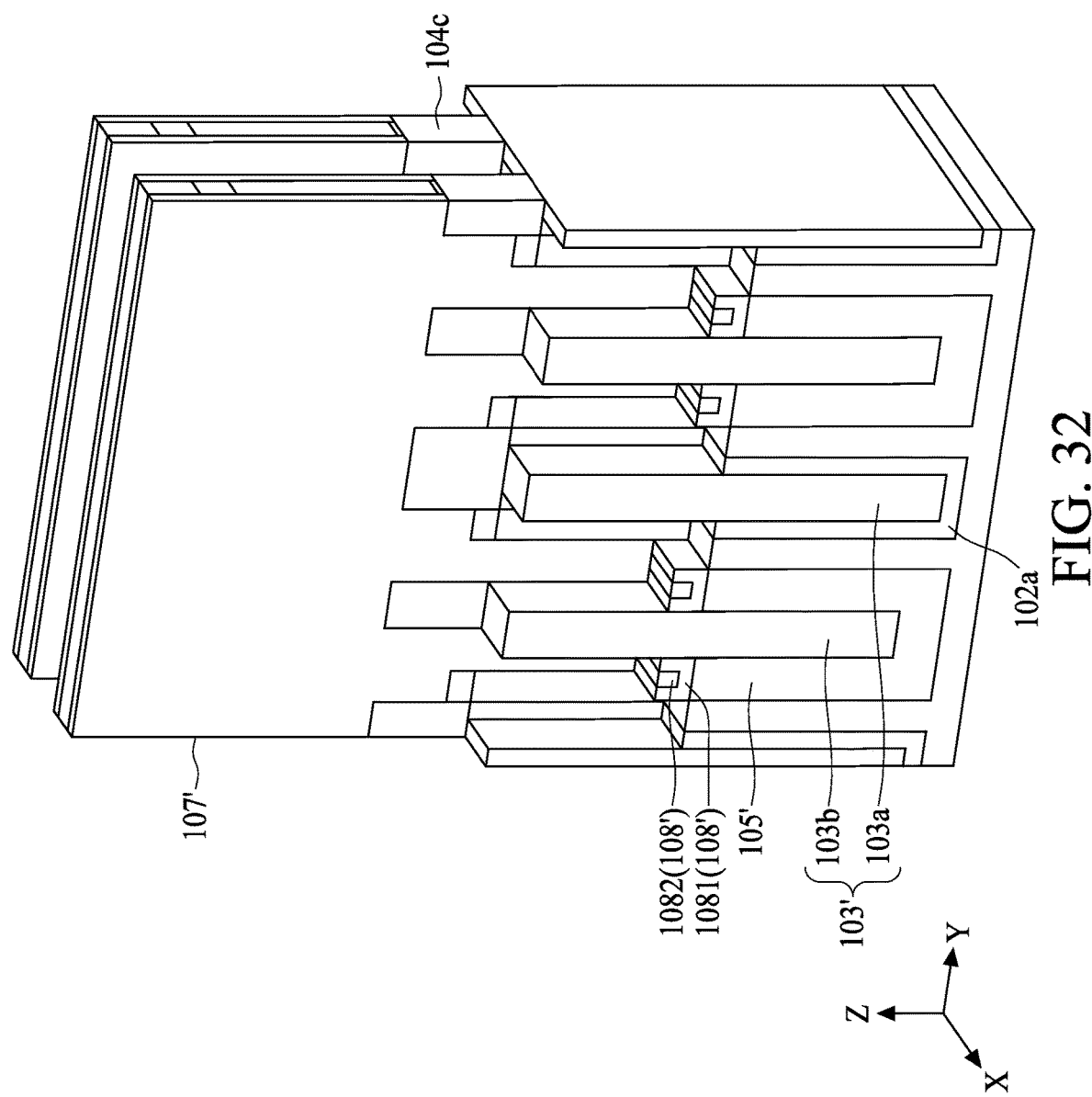

Operations in accordance with FIGS. 4 to 15 are performed on the structure of FIG. 31 to form the structure shown in FIG. 32. A plurality of dummy gate structures 107', high-k isolation portions 104c on tops of low-k isolation strips 103', remaining portions 108' of a seal spacer 108a, and spacers 102a and 105' are formed. In some embodiments, the spacers 105' are disposed between the fin structures 100a above the substrate 100 and stop at a height where the S/D structures 111 are designed to grow. In the embodiments of FIG. 32, in contrast to the embodiments shown in FIG. 15, an S/D etching operation is performed to remove portions of the substrate fins 1001 of the fin structures 100a and portions of the spacers 102a exposed from the dummy gate structures 107' above the spacers 105'.

Figure 33:
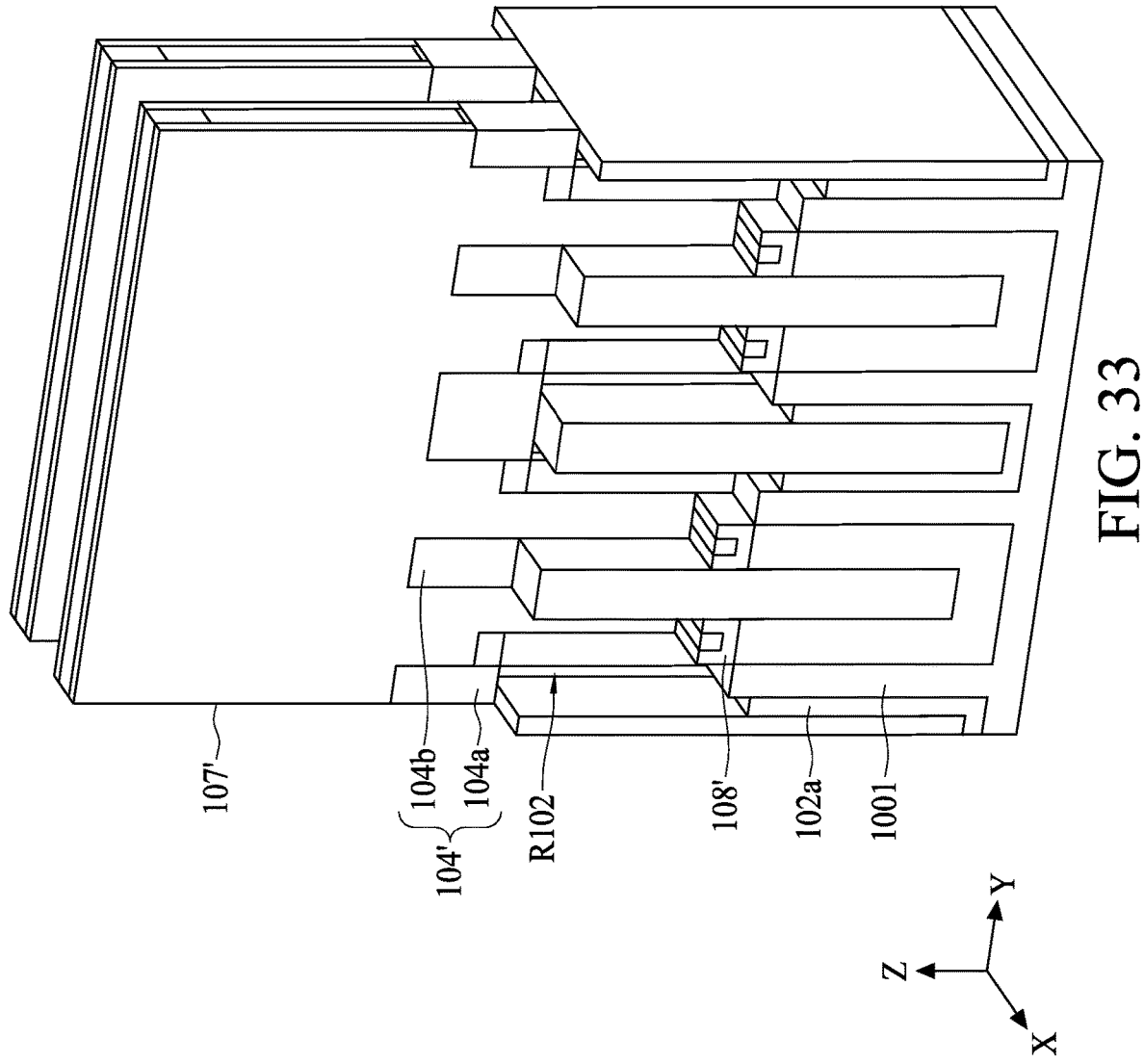

Referring to FIG. 33, in operations similar to those forming the structure of FIG. 16, a push-in operation is performed to partially remove a spacer 102a, and a plurality of recesses R102 are formed in the spacer 102a between the substrate fin 1001 and the adjacent low-k isolation strip 103a. No SiGe layers 1002 are formed in a FinFET, and thus only the recesses R102 are formed in the FinFET embodiments without the recesses R1002 of the SiGe layers 1002.

Figure 34:
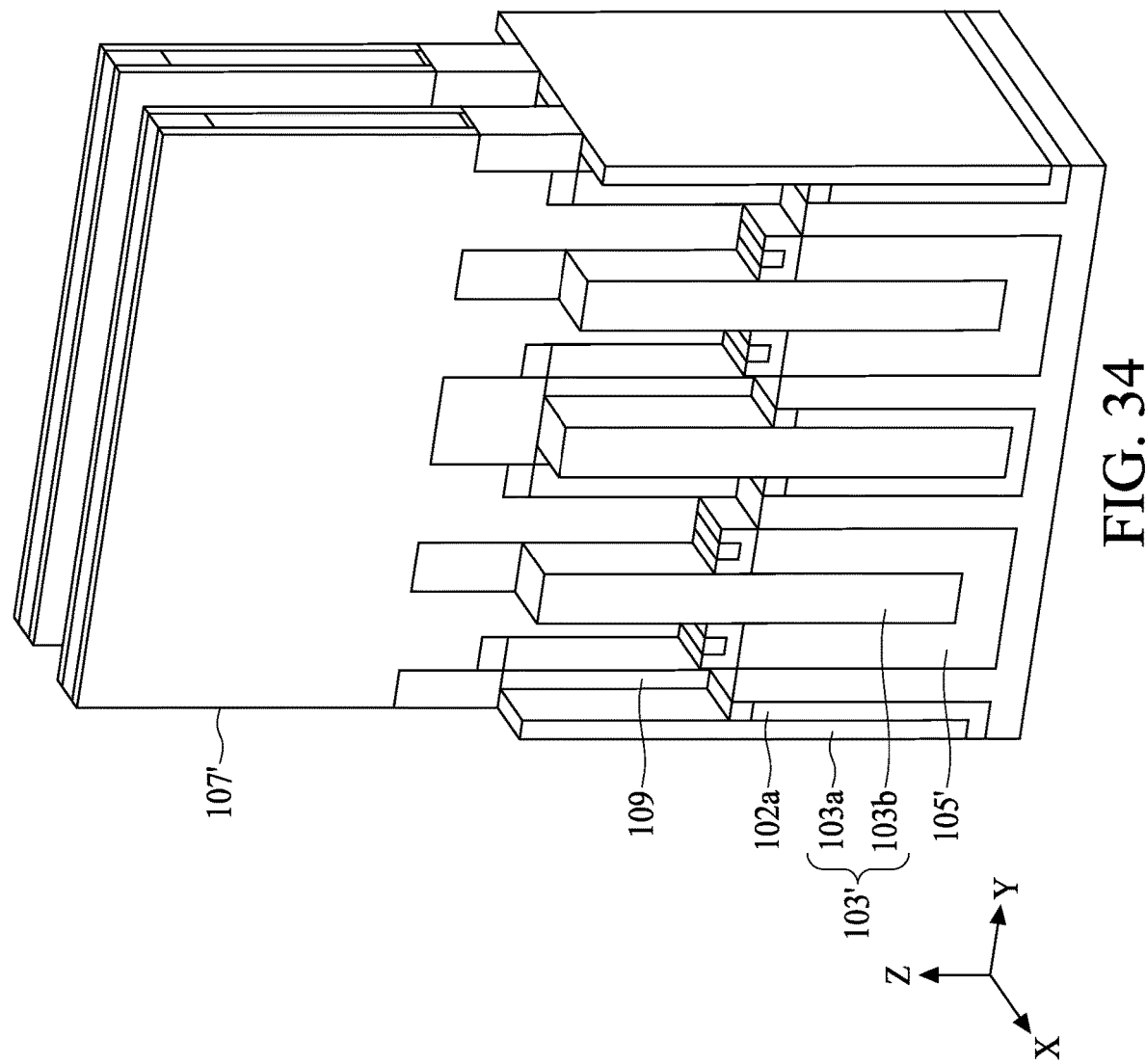

Referring to FIG. 34, in operations similar to those forming the structure of FIG. 17, an inner spacer deposition is performed to form a plurality of inner spacers 109 filling the recesses R102. The inner spacer 109 is formed over the spacer 102a between the substrate fin 1001 and the adjacent low-k isolation strip 103a. In some embodiments, the inner spacer 109 includes low-k dielectric materials. In some embodiments, an etching operation is performed to remove portions of the inner spacer 109 outside the recesses R102.

Figure 35:
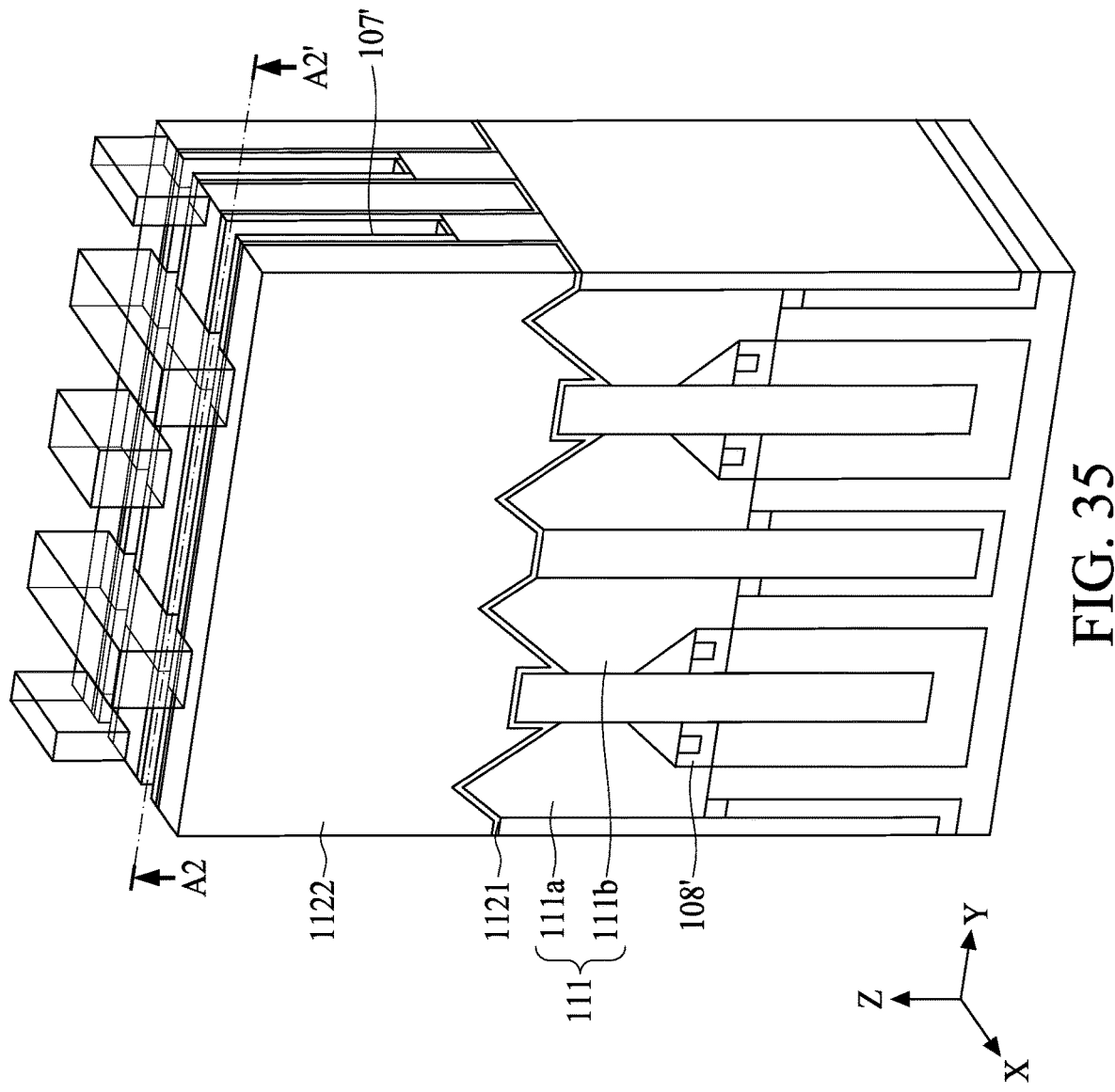
Figure 36:
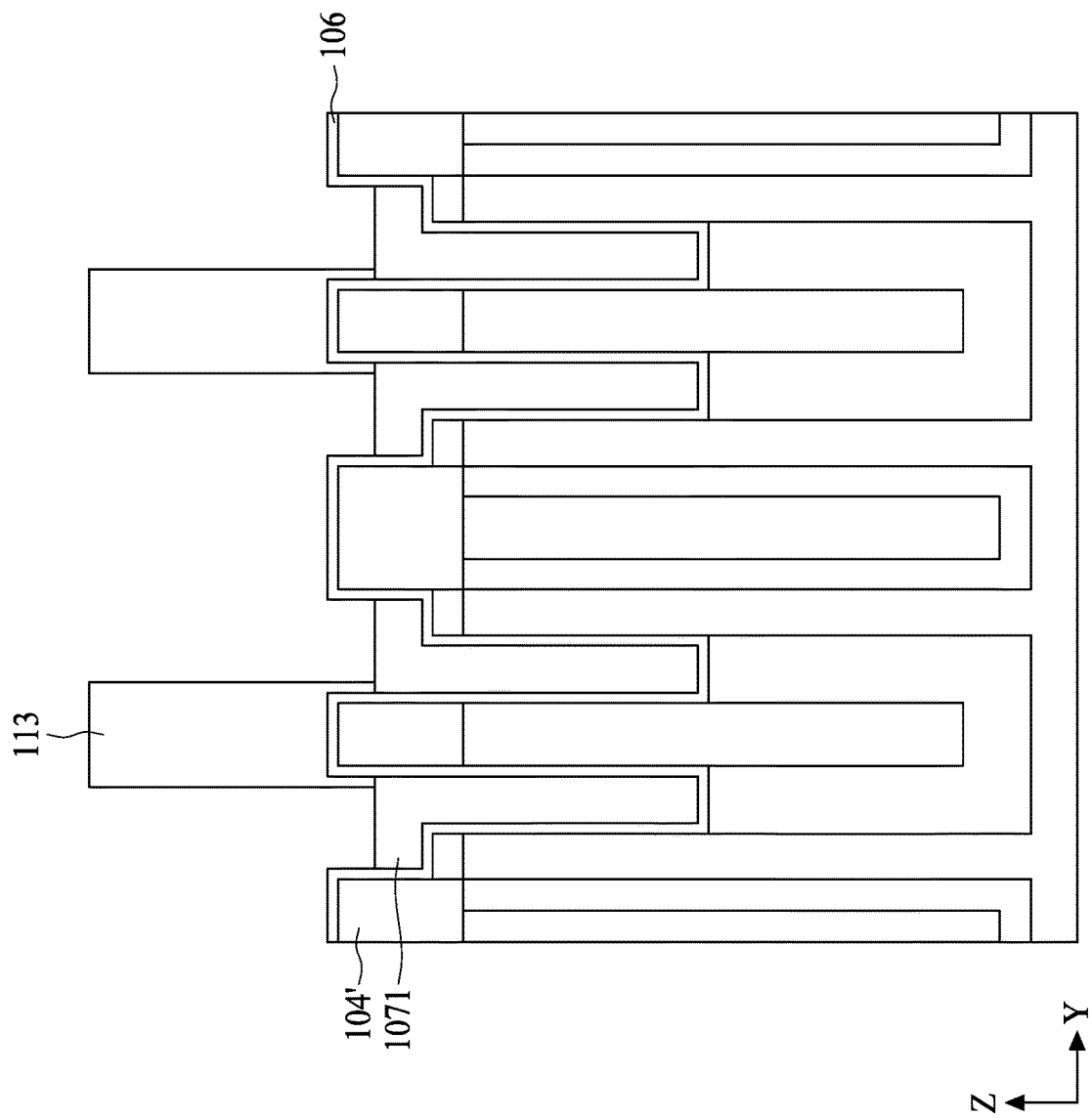

Referring to FIGS. 35 and 36, operations similar to those forming the structure of FIG. 20 are performed. FIG. 36 is a Y-cut cross-sectional view of the structure shown in FIG. 35 along a line A2-A2' at gate regions. A polysilicon layer 1071 is partially removed, and a patterned photomask layer 113 is subsequently formed over the dummy gate structures 107' covering a portion of the high-k isolation portions 104c. In some embodiments, a portion of the patterned photomask layer 113 covers the top of the dummy gate structures 107' and fills the space between the gate spacers 108b at the removed portion of the polysilicon layer 1071.

Figure 37:
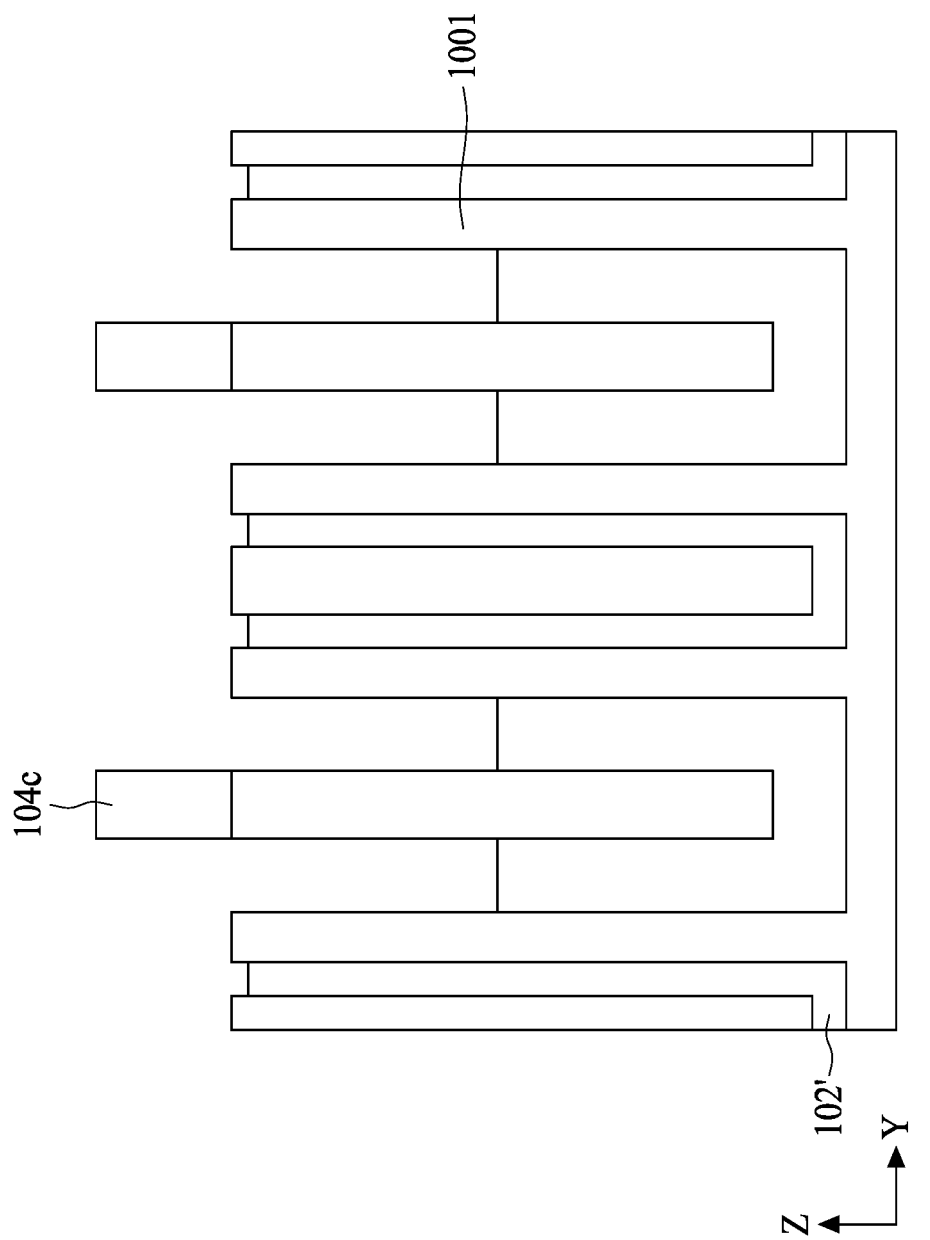

Referring to FIG. 37, operations in accordance with FIGS. 22 to 23 are performed, and spacers 102' are formed after removal of the polysilicon layer 1071. In some embodiments, the spacers 102' are the same as the spacers 102a. In some embodiments, small portions at the tops of the spacers 102a are slightly removed concurrently by the removal operations of polysilicon layer 1071, and thereby forming the spacer 102' which is substantially the same as the spacer 102a. Next, operations in accordance with FIGS. 25 to 27 are performed on the structure shown in FIG. 37, as shown in FIG. 38. A plurality of gate structures 115' are formed, a planarization operation is performed after the formation of the gate electrodes 115, and a silicide 116 and an S/D contact 117 are formed on the S/D structure 111 prior to or after the planarization operation. In the embodiments, in contrast to the semiconductor structure TS10, no nanowire release operation is performed, and the gate structure 115' completely fills the space between the substrate fins 1001 of the fin structures 100a and the low-k isolation strips 103a.

FIGS. 39, 40 and 41 are Y-cut cross-sectional views along a line B2-B2' (Y-cut on the gate structures), a line C2-C2' (Y-cut on the S/D structures) and a line D2-D2' (Y-cut between the gate and the S/D structures), respectively, shown in FIG. 38. In such embodiments of FinFETs, a nanowire release operation is omitted, and a gate dielectric layer 114 is formed conformally on the substrate fins 1001, the low-k isolation strips 103', and the high-k-isolation segments 104" (the dielectric layer 114 is formed on the intermediate structure shown FIG. 37). In some embodiments, the dielectric layer 114 includes a low-k dielectric layer 1141 covering the substrate fins 1001 (or channel regions of transistors) and a high-k dielectric layer 1142 over the low-k dielectric layer 1141, and between gate electrodes 115 and the intermediate structure shown in FIG. 37. In addition, the inner spacer 109 is formed in the recesses R102, only between the substrate fin 1001 of the fin structures 100a and the low-k isolation strips 103a.

Similar to the illustration of the semiconductor structure TS10, the high-k isolation segments 104" on the tops of the low-k isolation strips 103' function to isolate the gate structures 115'. Applications of the high-k isolation segments 104" can provide smaller distances between the gate structures, and therefore a size of a cell of groups of transistors can be decreased, or active areas (or length of nanowires) of the cell can be increased to enhance speed of a device if the size of the cell is constant. The inner spacer 109 (see FIG. 17) formed between the gate structure 115' and the S/D structures 111 functions to prevent side-etching or lateral encroachment to the S/D structures 111 during the dielectric removal operation as shown in FIG. 24 and FIG. 25. When the thickness of the spacer 102' possesses a dimension to an extent that etchant used to remove the dielectric laterally reaches the S/D structure from the gate region as a result of capillary effect, the inner spacer 109 is implemented to prevent such lateral encroachment from happening.

Similar concepts using the high-k isolation segments 104" to cut the gate structures are used in the following embodiments. However, in the following embodiments, the side-etching effect is prevented by application of capillary phenomenon instead of formation of the portion of the inner spacer 109 between channels (nanowires 1003' or substrate fins 1001) of a transistor and the isolation structure (low-k isolation strips 103a).

Figure 42:
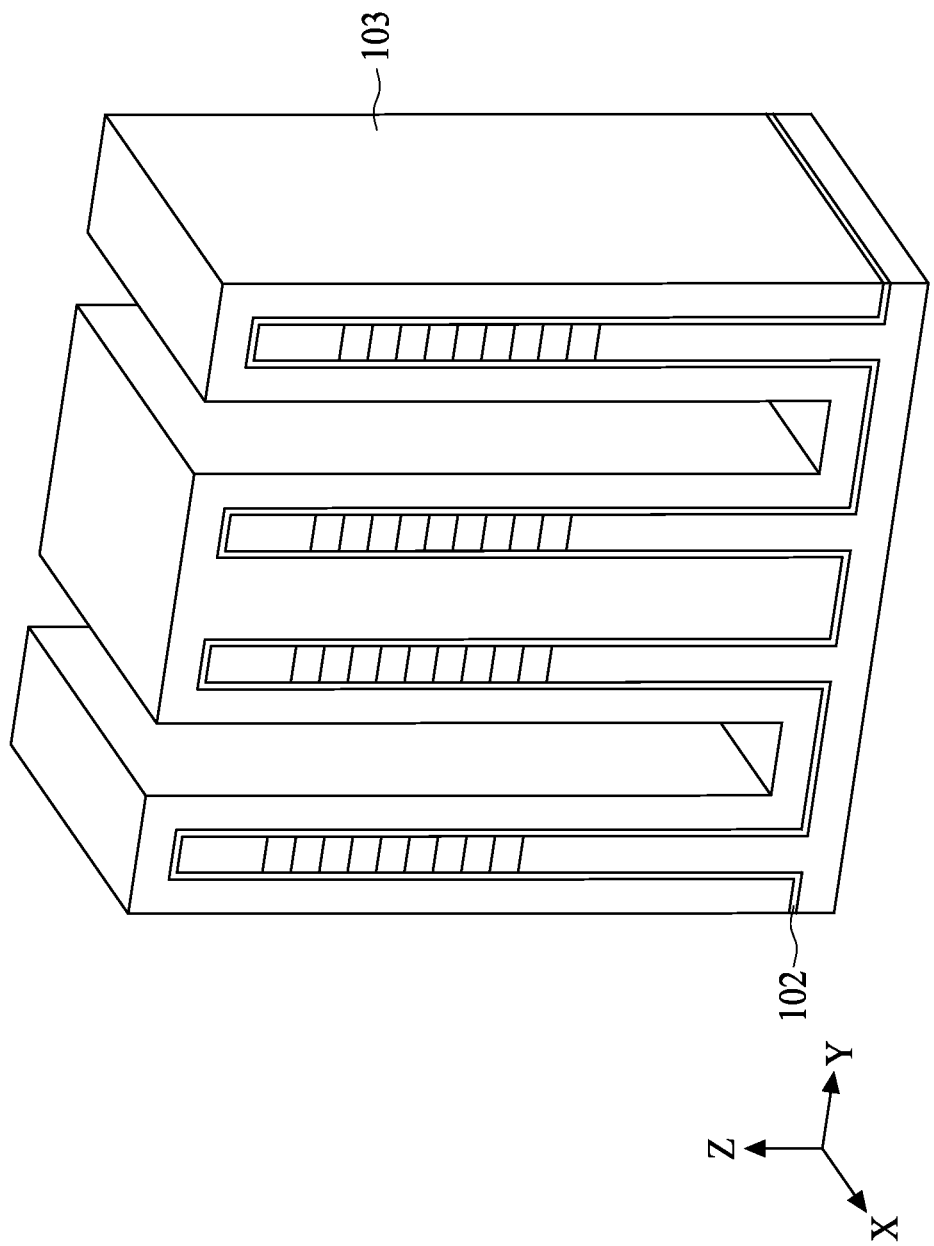
FIGS. 42 to 49 are cross-sectional views of one or more operations of a method for forming a semiconductor structure in accordance with some embodiments of the present disclosure.

Referring to FIG. 42, in accordance with some embodiments of the present disclosure, operations related to those shown in FIGS. 2 to 4 are performed. However, in the embodiments shown in FIG. 42, a dielectric structure 102 that includes only a single dielectric layer having a thickness in a range of 1.5 to 3.5 nm is formed. In some embodiments, the single dielectric layer is an oxide layer.

Figure 43:
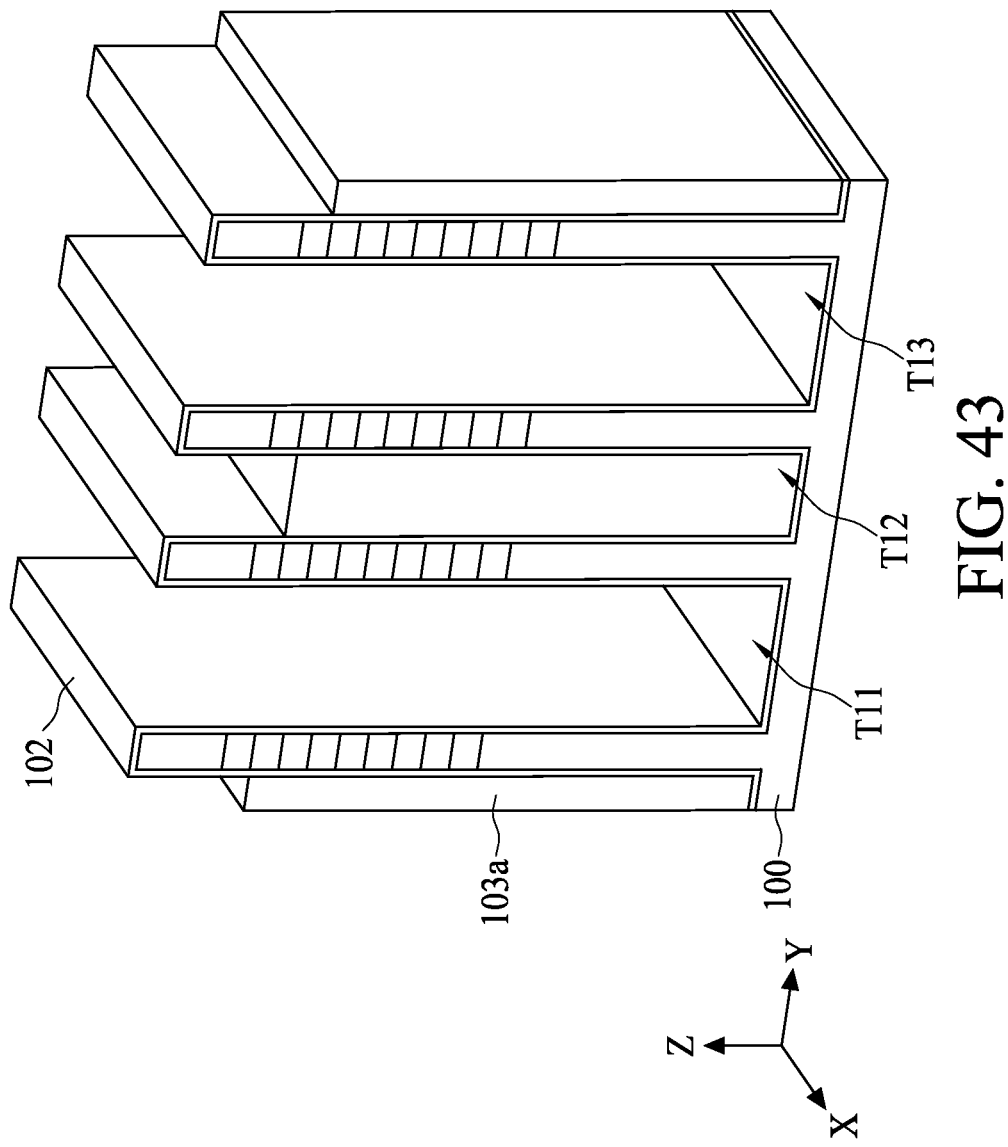
Figure 44:
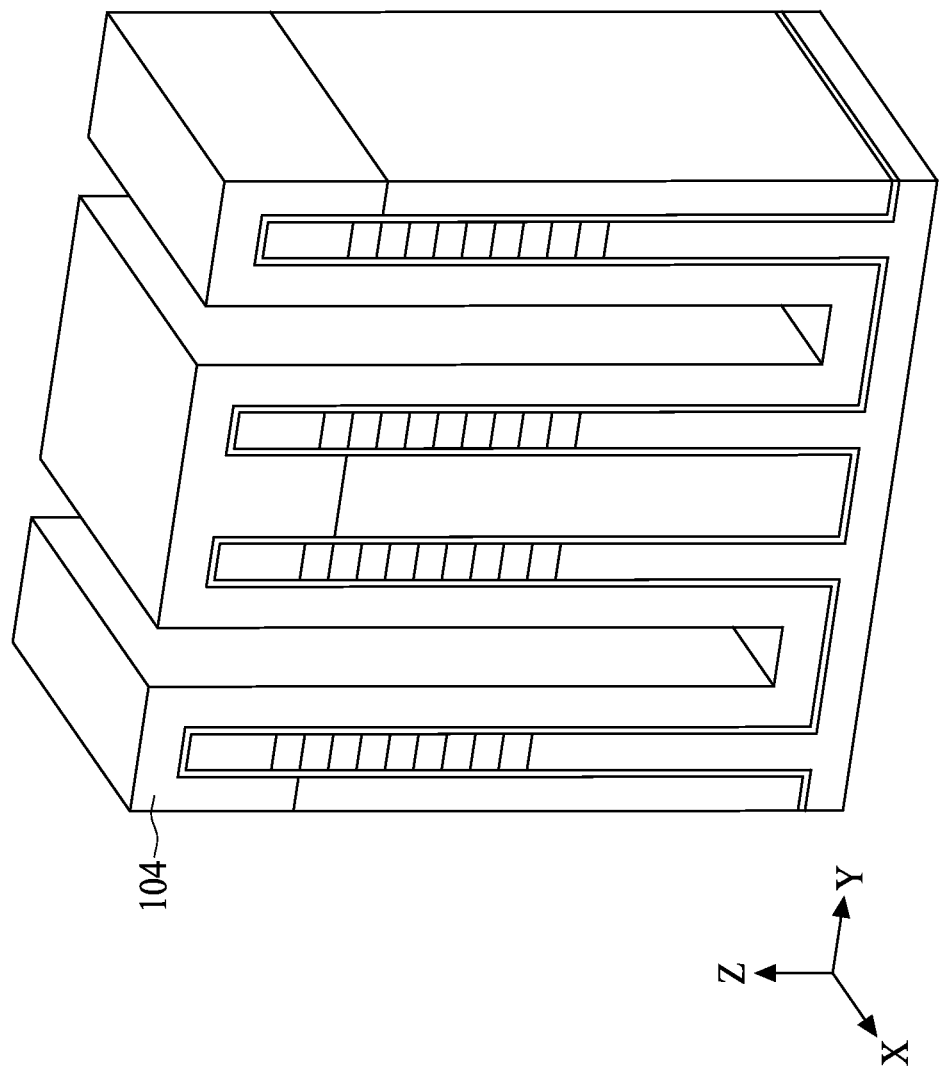
Figure 45:
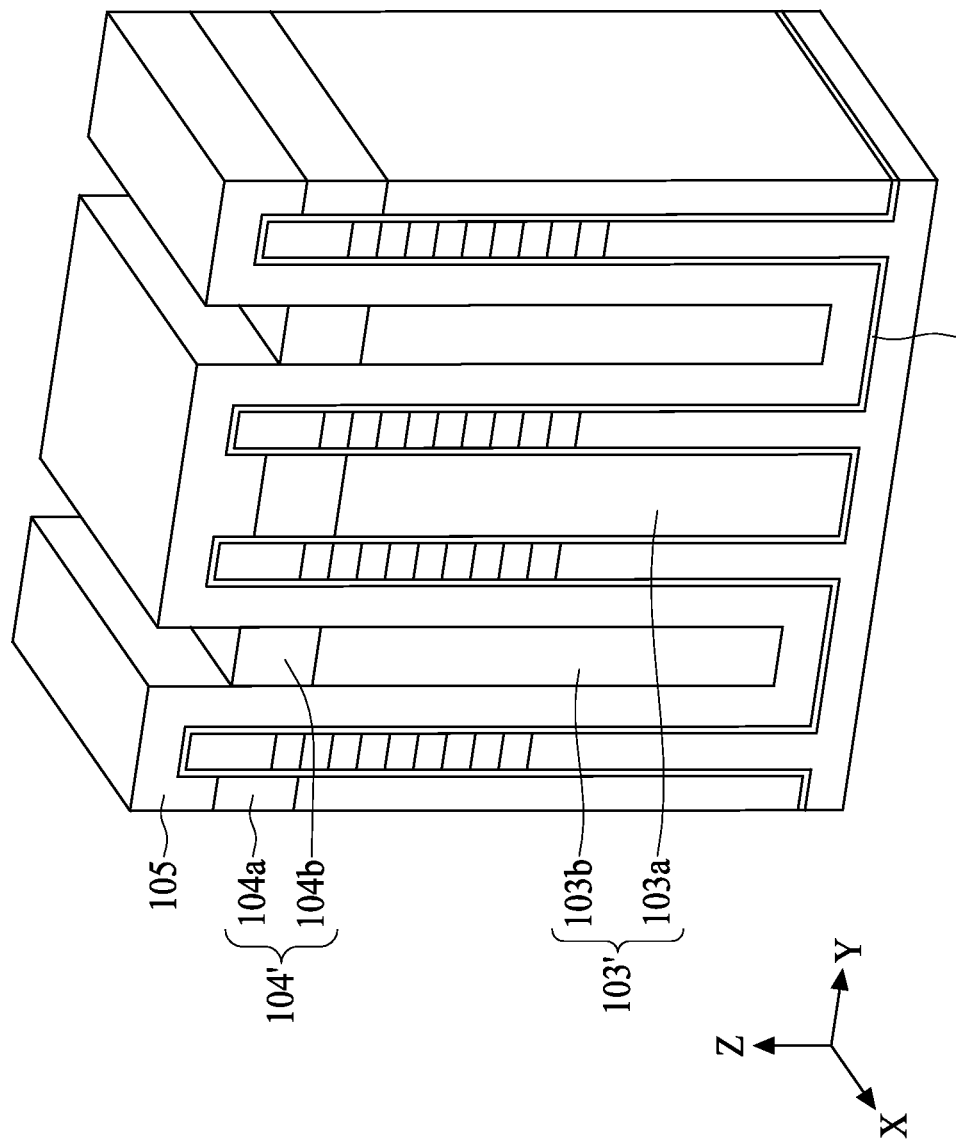

Referring to FIGS. 43 to 45, operations related to those shown in FIG. 5 and FIGS. 7 to 9 are performed. As illustrated above, the operations to remove portions of the dielectric structure 102 are optional. In the embodiments, materials and forming methods of the dielectric structure 102 and a liner layer 105 are similar or the same, and the operations related to those shown in FIG. 6 are omitted. Low-k isolation strips 103' and high-k isolation strips 104' are formed.

Figure 46:
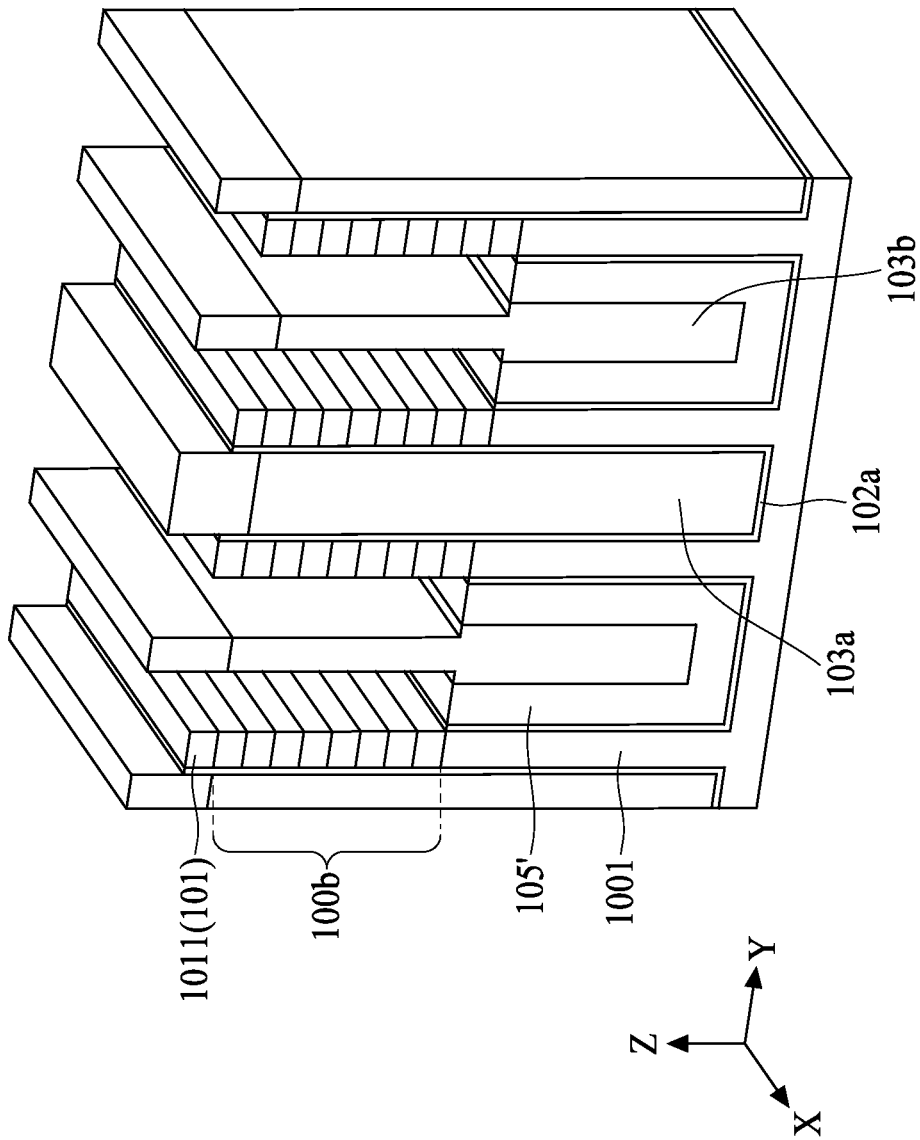

Referring to FIG. 46, operations related to those shown in FIGS. 10 to 11 are performed. In addition, since the materials of the dielectric structure 102 and the liner layer 105 are similar or the same, portions of the dielectric structure 102 are removed in operations of removing portions of spacers 105a to form spacers 102a and spacers 105'. In the embodiments, in contrast to the embodiments shown in FIG. 11, the spacer 102a is also formed between the spacers 105' and the fin structures 100a. In some embodiments, there is no distinct interface between the spacers 102a and the spacers 105'. In some embodiments, portions of the low-k isolation strips 103b are also removed during the operations of removing portions of spacers 105a, and a thickness of the low-k isolation strip 103b exposed through the spacers 105' is less than a thickness of the low-k isolation strip 103b between the spacers 105'. However, in other embodiments, the portions of the low-k isolation strips 103b are not removed; and it depends on the technique and/or etchant used in the operations of removing portions of spacers 105a.

Figure 47:
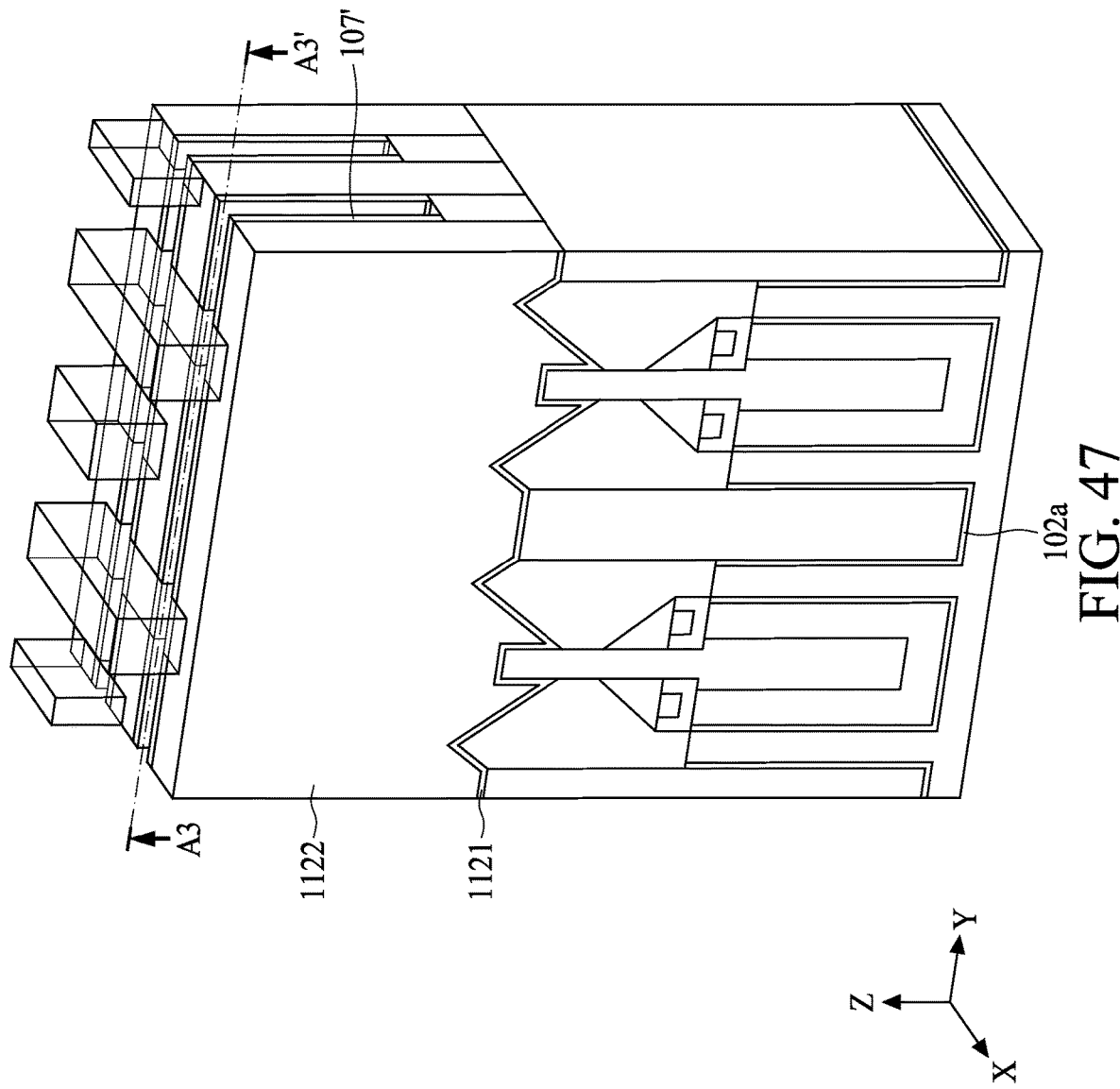

Referring to FIG. 47, operations related to those shown in FIGS. 12 to 20, minus any push-in operations performed on the spacers 102a, are performed on the structure of FIG. 46. A patterned photomask layer 113 is formed over dummy gate structures 107' and the dielectric layer 1122, covering a portion of the high-k isolation portions 104c. It should be noted that an inner spacer 109 is still formed between nanowires 1003' in the recesses R1002 to prevent side-etching damage during the subsequent operations. However, portions of the inner spacer 109 in recesses R102 are not necessary. The thickness of the dielectric structure 102 is too small for etchants to enter. A detailed illustration is provided later in the description.

Figure 48:
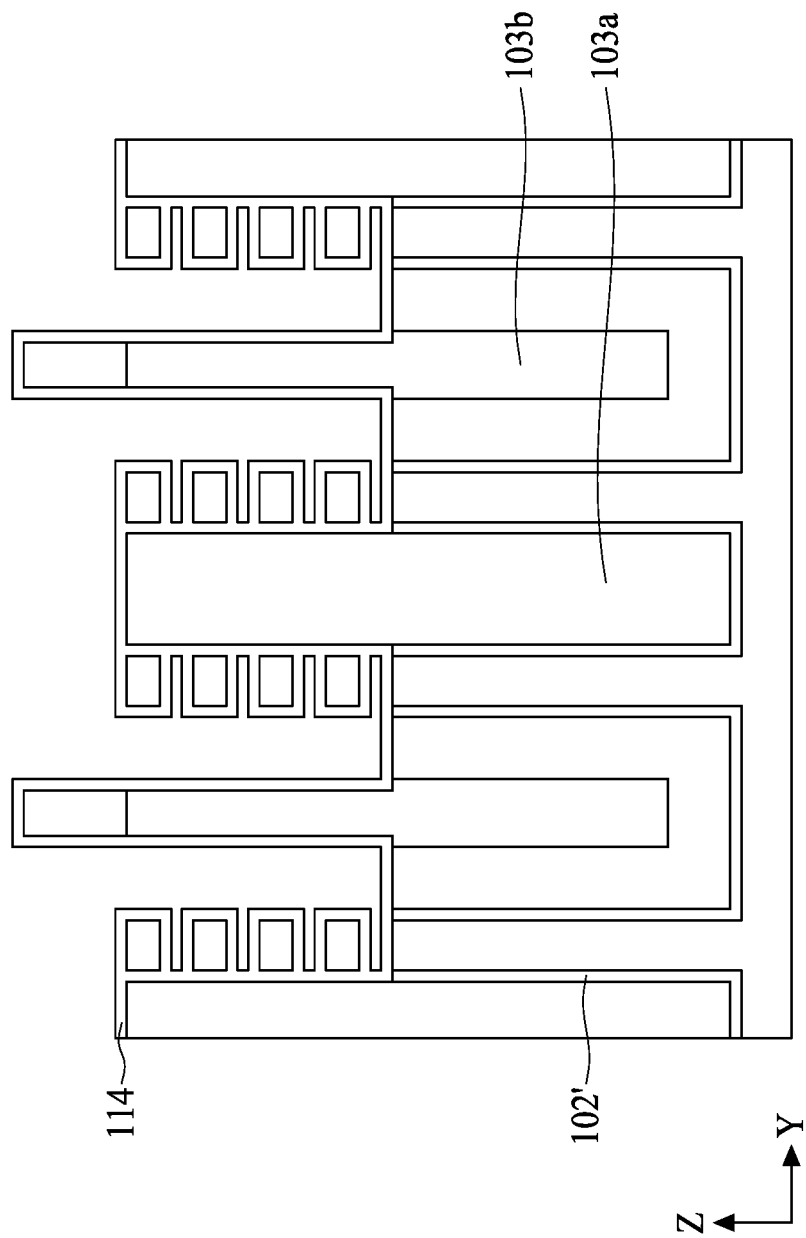

FIG. 48 is a Y-cut cross-sectional view of the structure shown in FIG. 47 along a line A3-A3' at gate regions after performing operations related to those shown in FIGS. 23 to 26. Spacers 102' are formed from the spacers 102a, and a gate dielectric layer 114 is formed surrounding a plurality of nanowires 1003' and also on low-k isolation strips 103' and high-k isolation portions 104c. However, due to reduced thickness of the dielectric structure 102 in the embodiments, the gate dielectric layer 114 completely fills the space between the nanowires 1003' and the adjacent low-k isolation strips 103a. The gate dielectric layer 114 surrounding the nanowires 1003' also contacts the adjacent low-k isolation strips 103a. In some embodiments, the gate dielectric layer 114 is a multi-layer structure including at least a layer of low-k material and at least a layer of high-k material.

Figure 49:
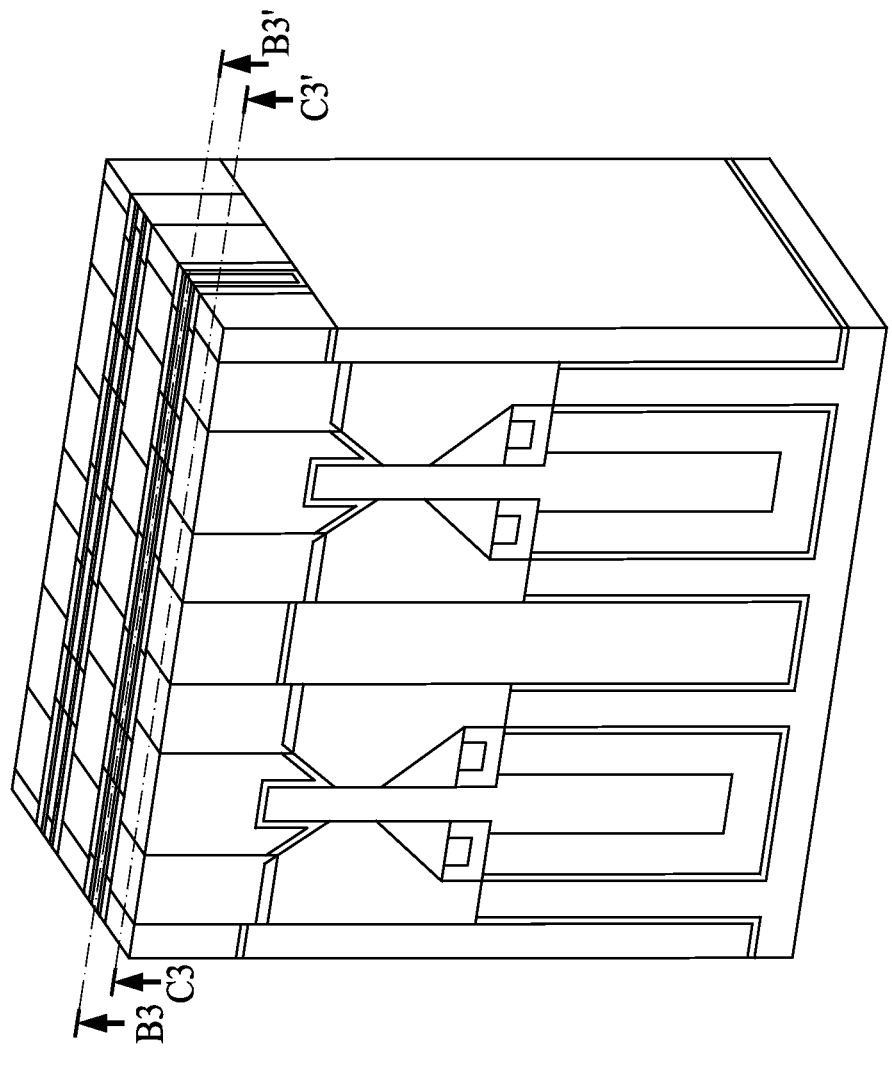
Figure 50:
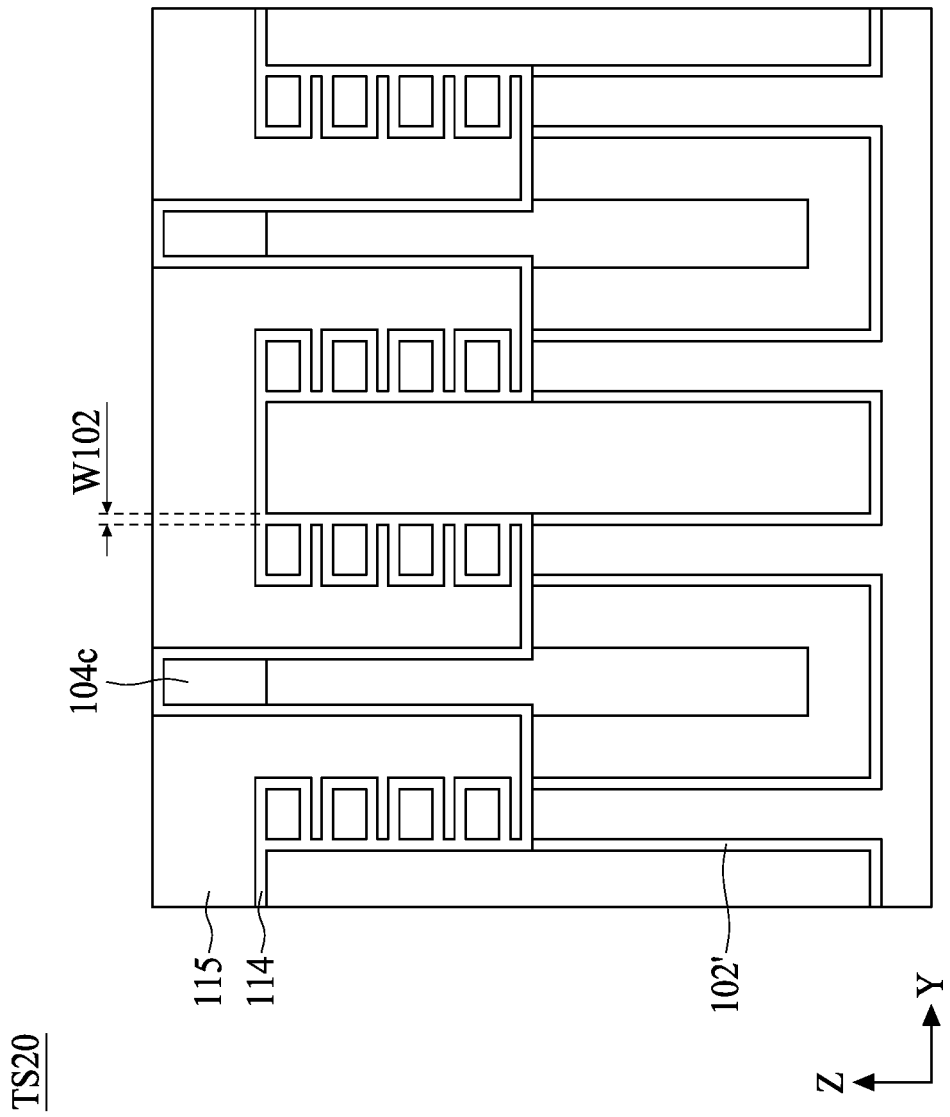
FIGS. 50 to 51 are cross sectional views cutting along lines B3-B3' and C3-C3' shown in FIG. 49 in accordance with some embodiments of the present disclosure.
Figure 51:
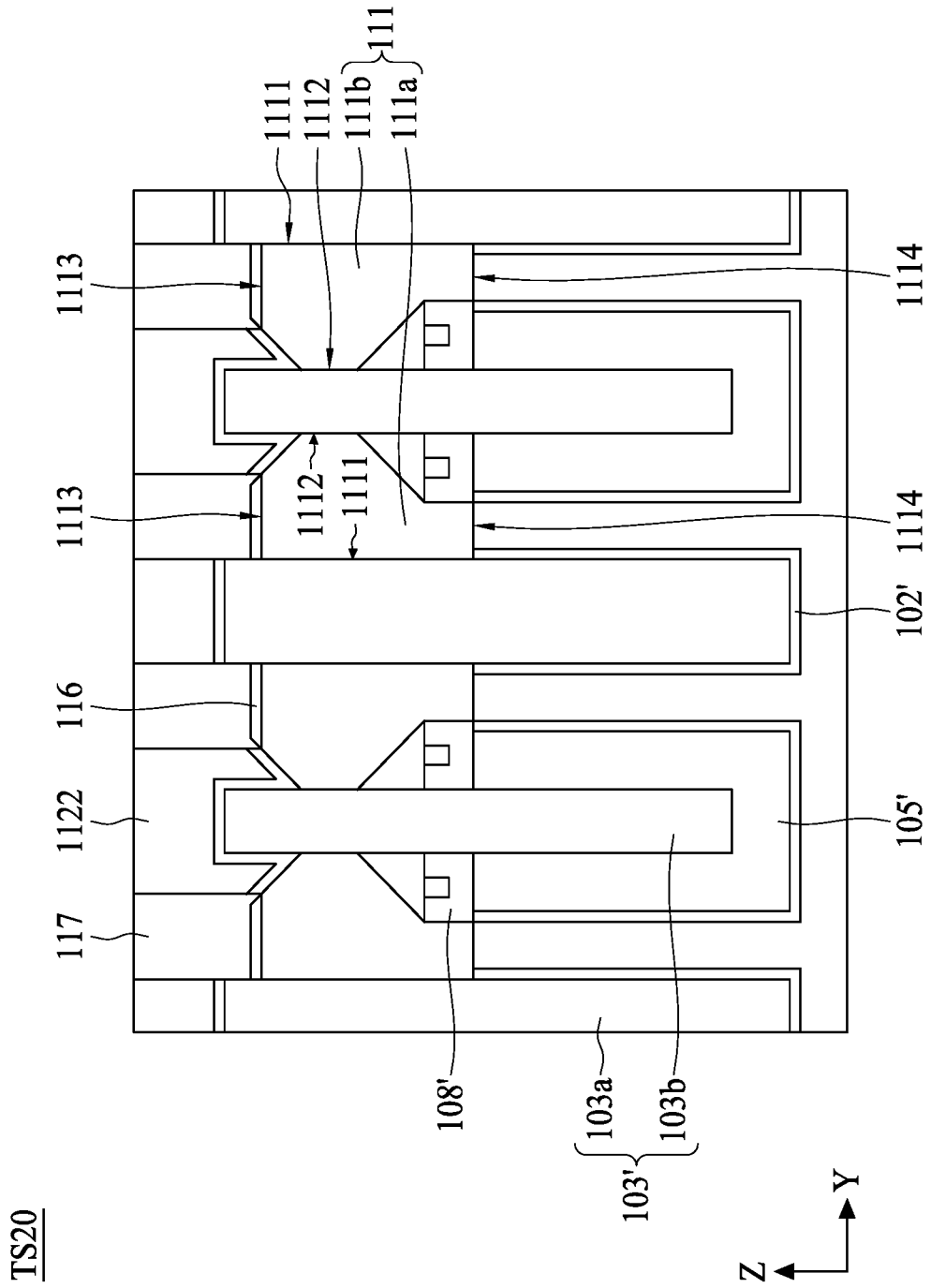

Referring to FIGS. 49 to 51, operations related to those shown in FIG. 27 are performed on the structure of FIG. 47 to form a semiconductor structure TS20. FIGS. 50 and 51 are Y-cut cross-sectional views along a line B3-B3' (Y-cut on the gate structures) and a line C3-C3' (Y-cut on the S/D structures), respectively, shown in FIG. 49. Since a distance W102 (which is substantially the same as a thickness of the dielectric structure 102) between the low-k isolation strip 103a and the nanowires 1003' is small, a gate electrode 115 formed thereover is not able to fill the space between the low-k isolation strip 103a and the nanowires 1003'. As shown in FIG. 50, the semiconductor structure TS20 includes gate around transistors (tri-gate GAA transistor) but not complete GAA transistors.

As illustrated above, the high-k isolation segments 104'' on the tops of the low-k isolation strips 103' function to isolate the gate structures 115'. Applications of the high-k isolation segments 104'' can provide smaller distances between the gate structures, and therefore a size of a cell of groups of transistors can be decreased, or active areas (or lengths of nanowires) of the cell can be increased to enhance speed of a device if the size of the cell is constant. In addition, the dielectric structure 102 having the thickness in a range of 1.5 to 3.5 nm is formed so as to prevent side-etching effect. When the thickness of the spacer 102' possesses a dimension to an extent that etchant used to remove the dielectric being forbidden to reach the S/D structure from the gate region as a result of high surface tension between the dielectric and the etchant, the portion of the inner spacer 109 in the recess R102, as previously addressed in FIG. 16, for example, is not required to prevent such lateral encroachment from happening.

Figure 55:
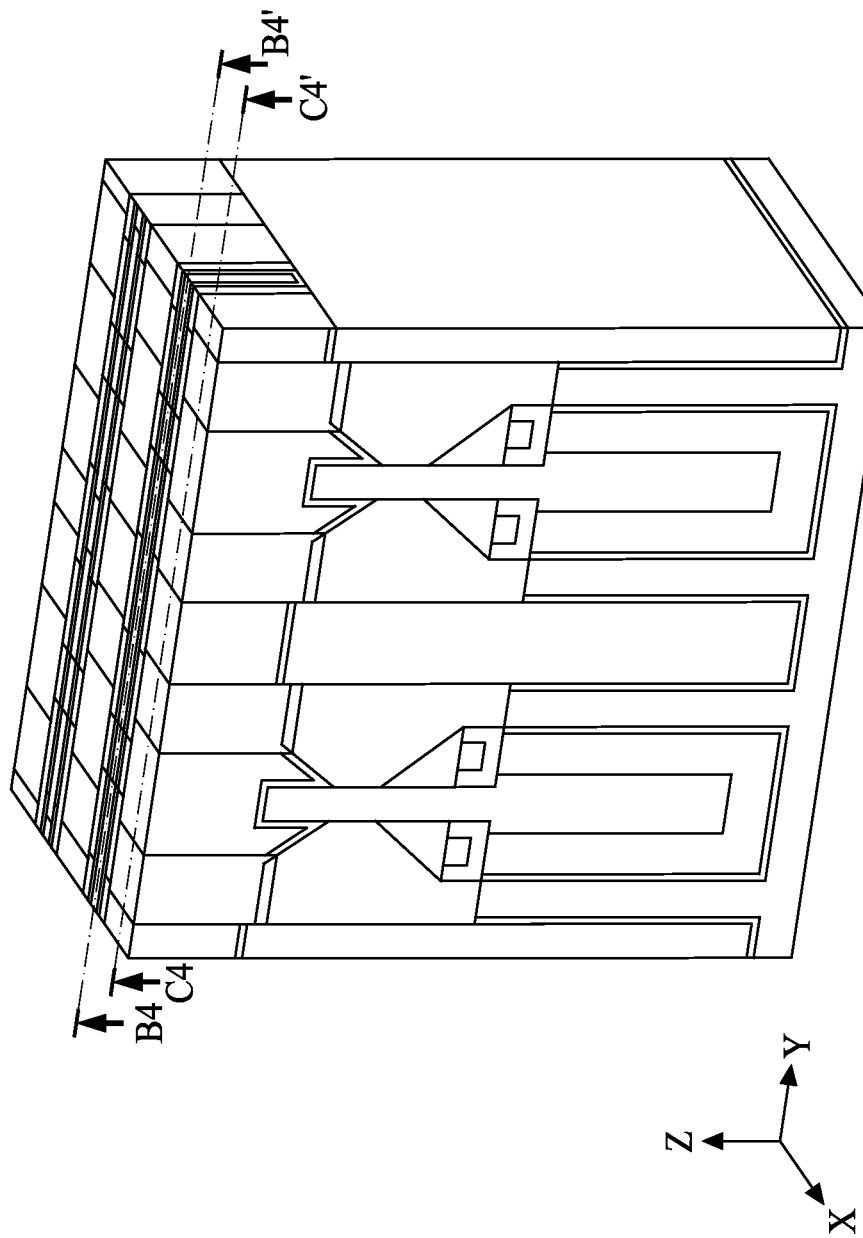
Figure 56:
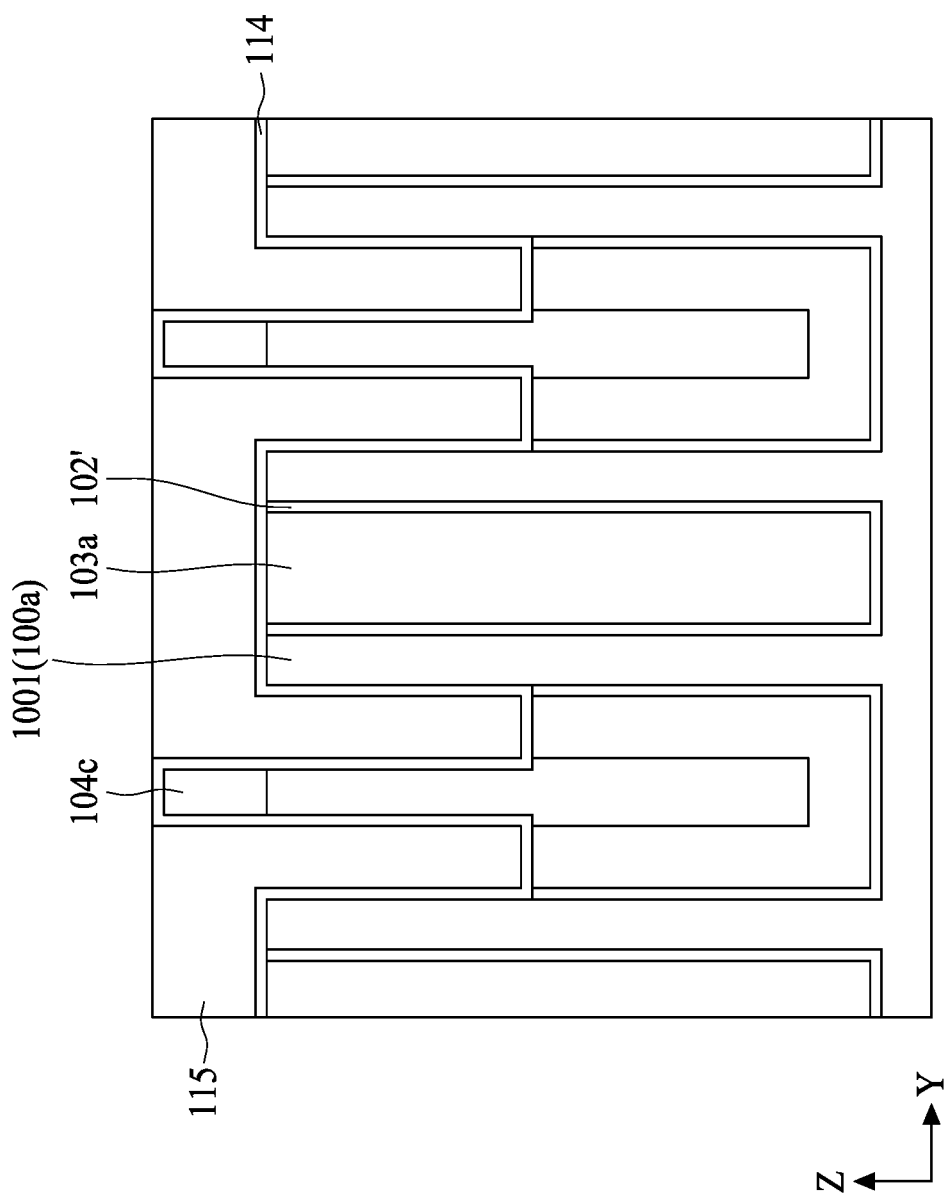
FIGS. 56 to 57 are cross-sectional views cut along lines B4-B4' and C4-C4' shown in FIG. 55 in accordance with some embodiments of the present disclosure.
Figure 57:
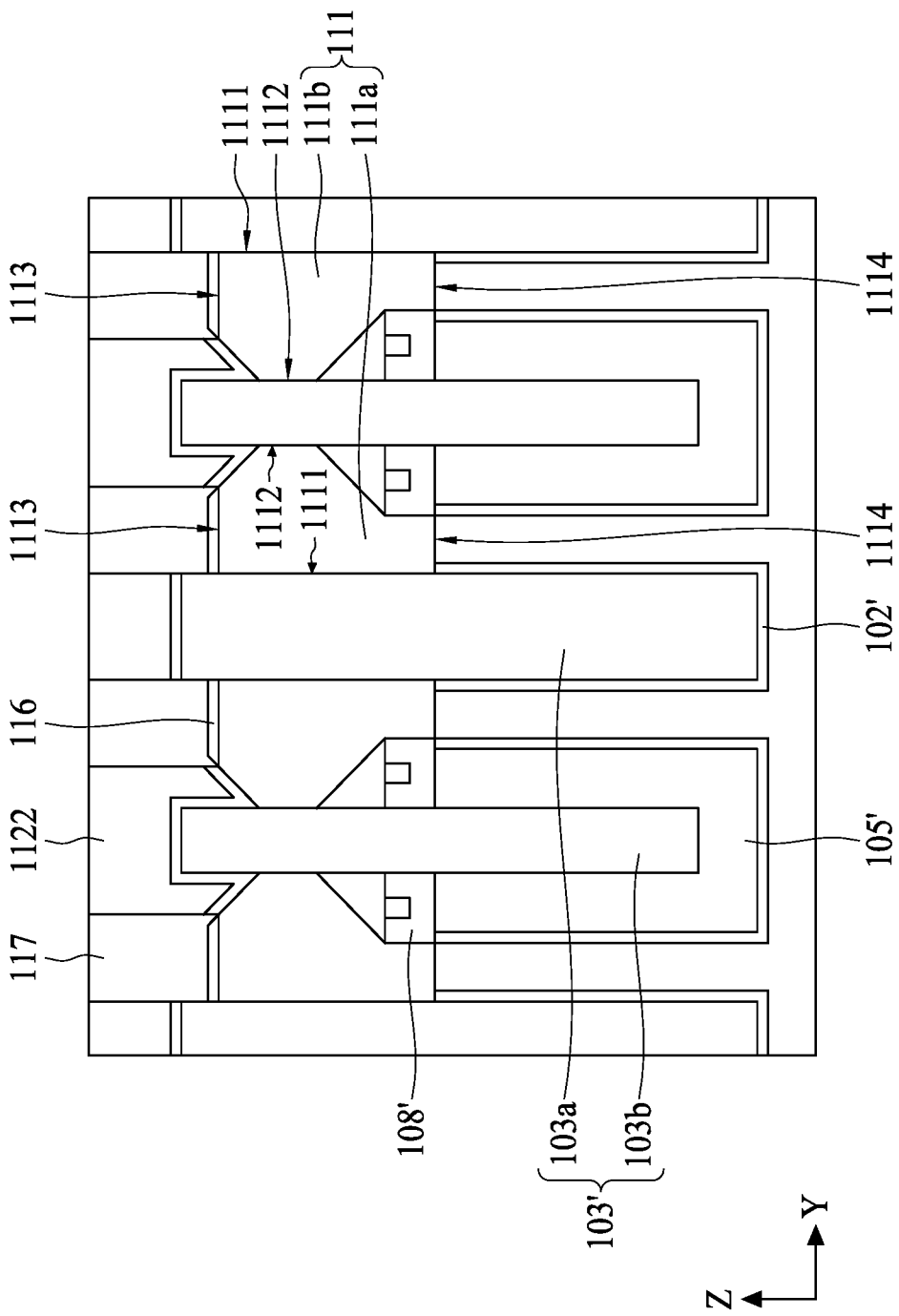

Similar concepts of high-k isolation segments 104'' and the thin dielectric structure 102 as illustrated above can also be applied in a fin field effect transistor (FinFET). FIGS. 52 to 55 show one or more operations of the method M10 as applied to a FinFET in accordance with some embodiments of the present disclosure. A semiconductor structure TS21 is formed as shown in FIGS. 55 to 57, wherein FIGS. 56 to 57 are Y-cut cross-sectional views along lines B4-B4' and C4-C4', respectively, shown in FIG. 55.

Figure 52:
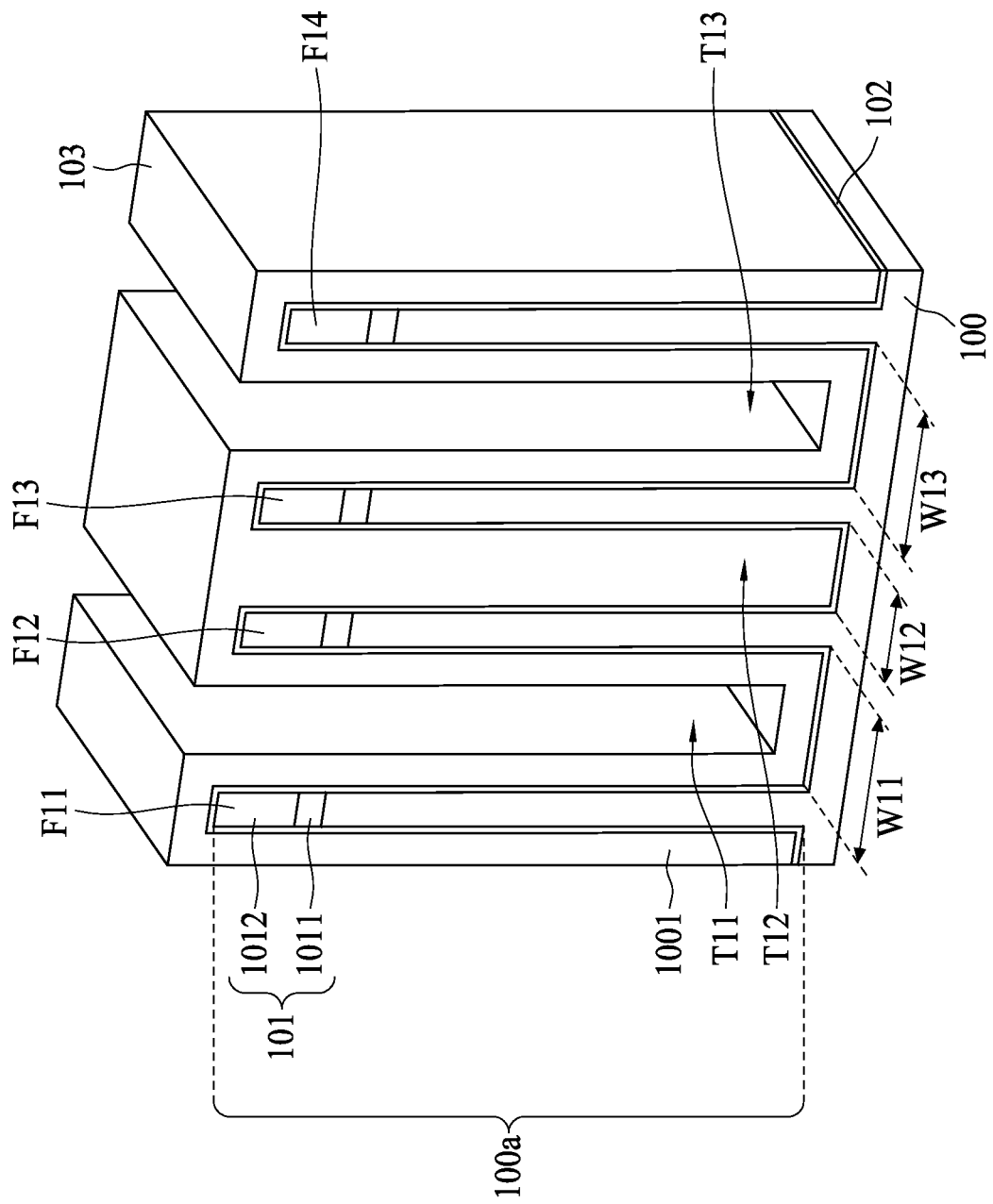
FIGS. 52 to 55 are diagrammatic views of one or more operations of a method for forming a semiconductor structure in accordance with some embodiments of the present disclosure.

Referring to FIG. 52, in accordance with some embodiments of the present disclosure, a dielectric structure 102 with a thickness in a range of 1.5 to 3.5 nm is applied to a plurality of fin structures 100a similar to the structure shown in FIG. 31. A low-k dielectric layer 103 is formed on the dielectric structure 102. A plurality of trenches T11, T12 and T13 are formed between fin structures F11, F12, F13 and F14. In some embodiments, a width W11 of the trench T11 is substantially the same as a width W13 of the trench T13, and the width W11 is greater than a width W12 of the trench T12.

Figure 53:
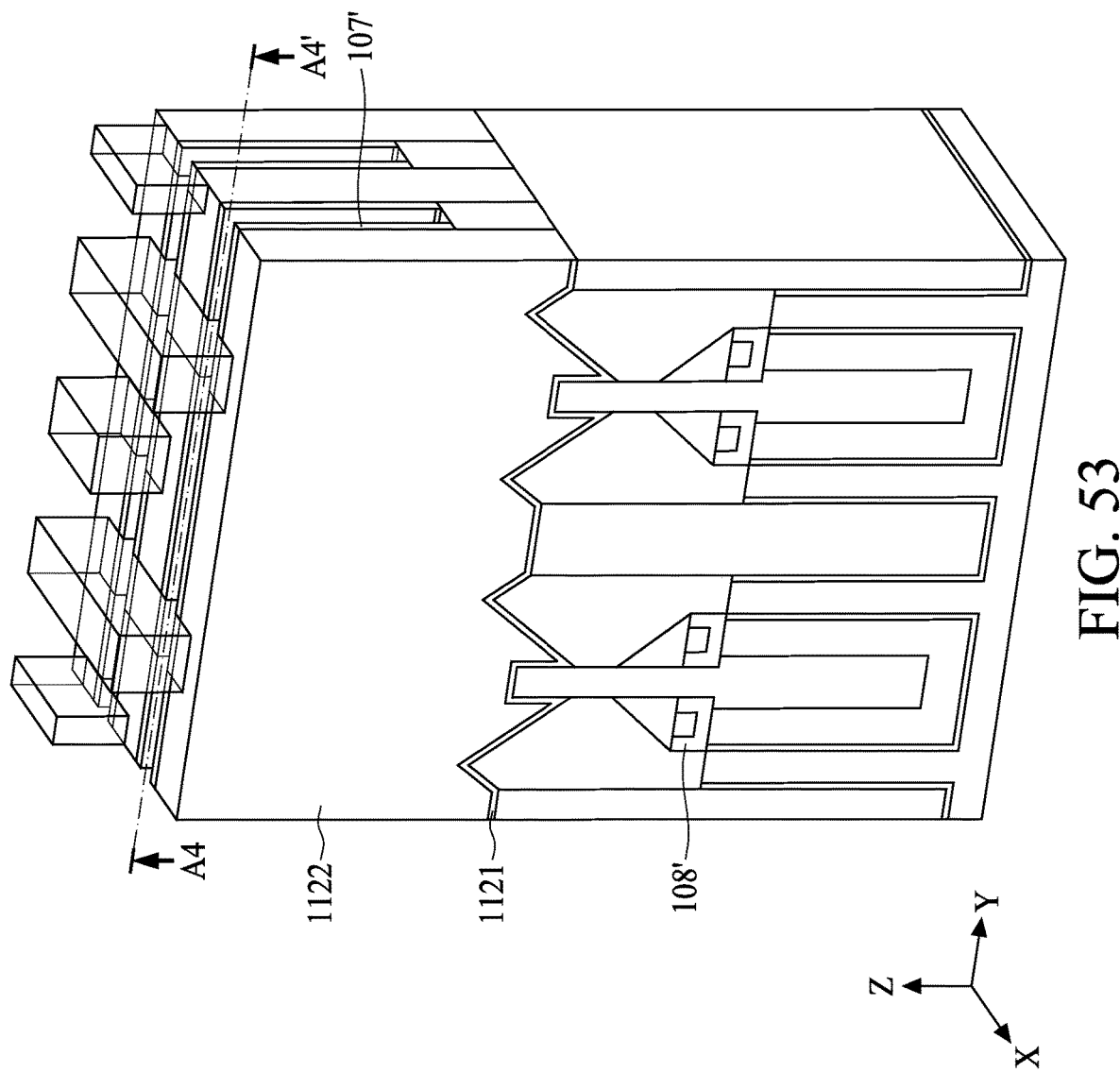

Referring to FIG. 53, operations related to those shown in FIGS. 43 to 47 are performed on the structure of FIG. 52. A patterned photomask layer 113 is formed over dummy gate structures 107' and a dielectric layer 1122, covering a portion of high-k isolation portions 104c. It should be noted that an inner spacer 109 (not shown) between nanowires 1003' in recesses R1002 is formed to prevent side-etching damage during the subsequent operations.

Figure 54:
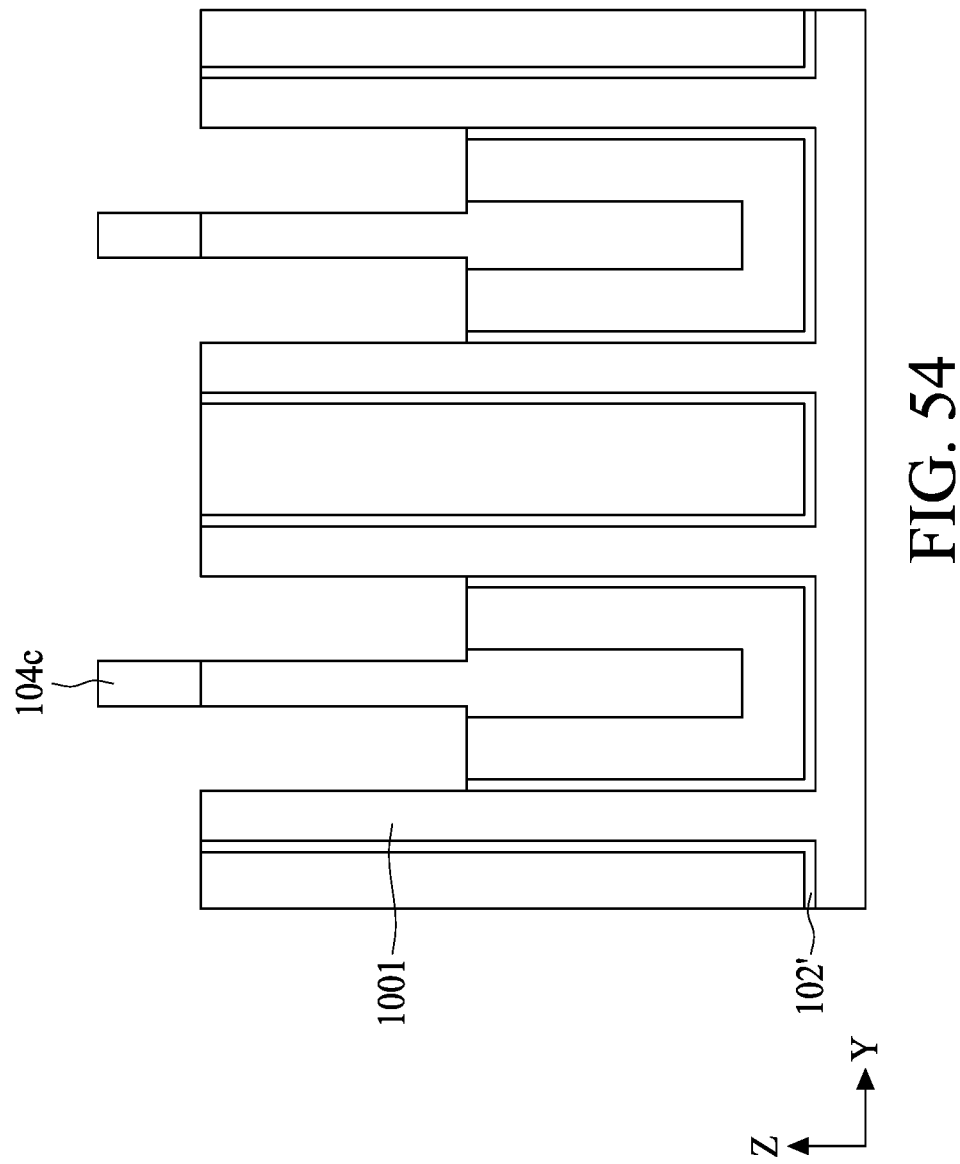

Referring to FIG. 54, operations related to those shown in FIGS. 36 to 37 are performed on the structure of FIG. 53. FIG. 54 shows a Y-cut cross-sectional view at gate regions along a line A4-A4' shown in FIG. 53. Spacers 102' remain between the low-k isolation strips 103a and the substrate fins 1001.

Referring to FIGS. 55 to 57, operations similar to those performed on the structure of FIG. 47 are performed on the structure of FIG. 53 to form a semiconductor structure TS21 having a FinFET as shown in FIG. 55. FIGS. 56 and 57 are Y-cut cross-sectional views along a line B4-B4' (Y-cut on the gate structures) and a line C4-C4' (Y-cut on the S/D structures), respectively, shown in FIG. 55. The thickness of the spacer 102' is too thin to form the gate structure between the substrate fin 1001 and the low-k isolation strip 103a even the dielectric removal operation is performed to release the space between the substrate fin 1001 and the low-k isolation strip 103a, and the spacers 102' remain between the low-k isolation strips 103a and substrate fins 1001. The gate electrode 115 covers only a top and one lateral side of the substrate fin 1001, as shown in FIG. 55. The cross-sectional view of the S/D structures of the semiconductor structure TS21 shown in FIG. 57 is similar to the Y-cut cross-sectional view of the S/D structures of the semiconductor structure TS20 as shown in FIG. 51.

In order to improve the semiconductor structure TS20, the dielectric structure 102 in some embodiments of the present disclosure is designed to be a multi-layer dielectric structure including a plurality of dielectric layers. A thickness of the multi-layer dielectric structure is greater than 3.5 nm, and each of the dielectric layers has a thickness in a range of 1 to 3.5 nm. Two adjacent dielectric layers have different etching rates in response to a predetermined etchant.

Figure 58:
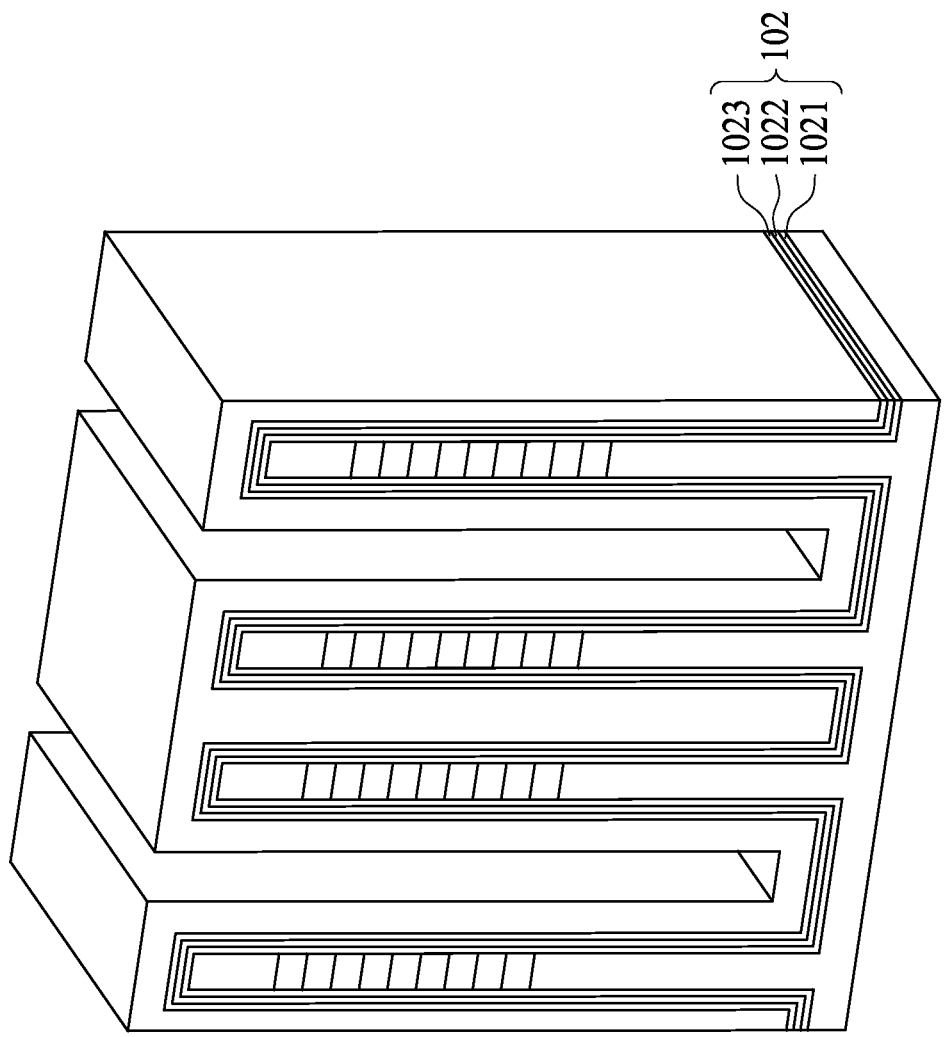
FIGS. 58 to 61 are diagrammatic views of one or more operations of a method for forming a semiconductor structure in accordance with some embodiments of the present disclosure.

Referring to FIG. 58, in accordance with some embodiments, similar to the embodiments shown in FIG. 42, the dielectric structure 102 includes a first dielectric layer 1021, a second dielectric layer 1022 and a third dielectric layer 1023. In some embodiments, materials of the first and third dielectric layers are the same, and are different from material of the second dielectric layer. In the embodiments shown in FIG. 58, the second dielectric layer 1022 is a nitride layer, and the first and the third dielectric layers are oxide layers. Each of the dielectric layers 1021, 1022 and 1023 has a thickness in a range of 1 to 3.5 nm.

Figure 59:
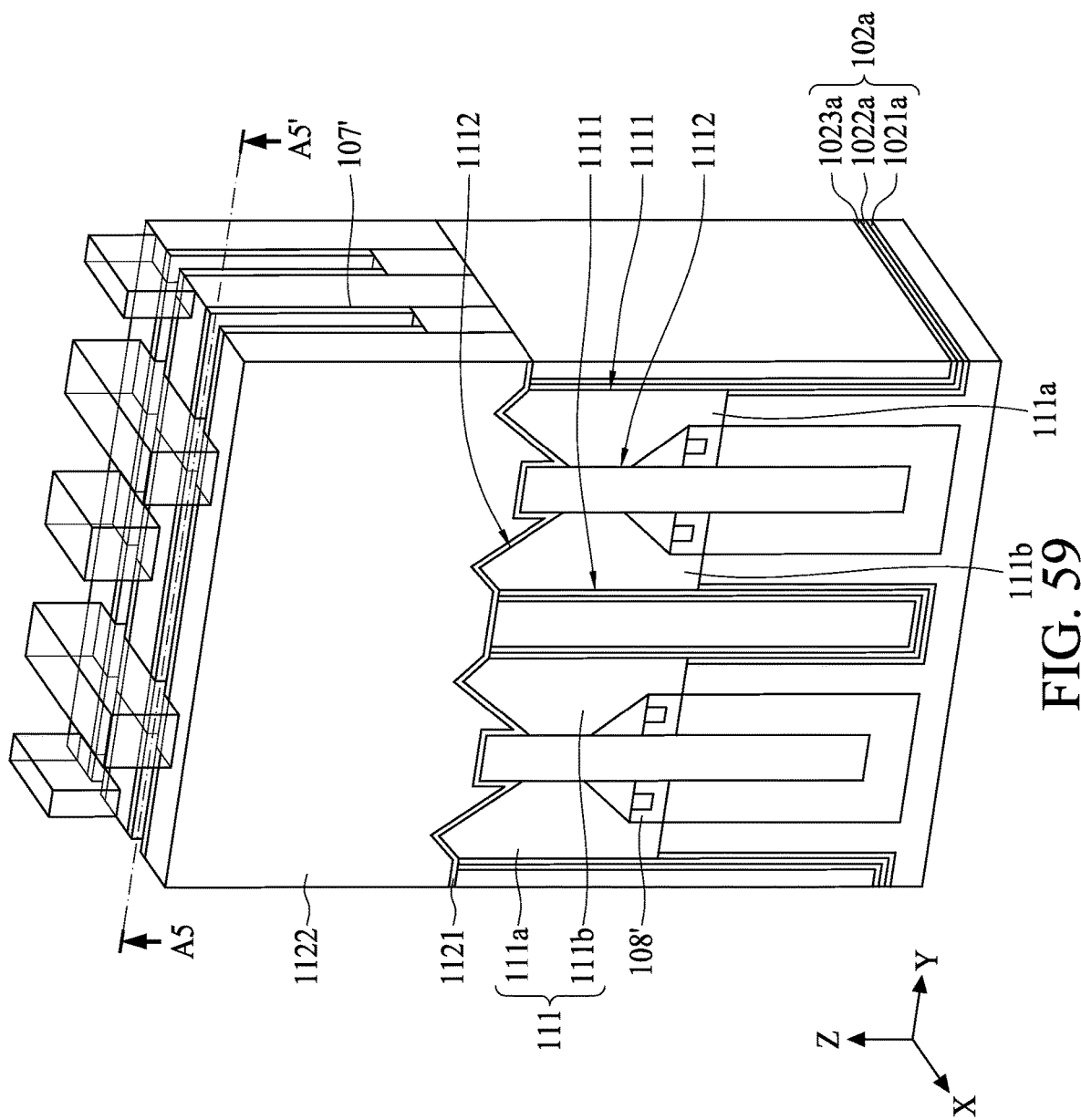

Referring to FIG. 59, operations related to those shown in FIGS. 43 to 47 are performed on the structure of FIG. 58. A patterned photomask layer 113 is formed over dummy gate structures 107' and a dielectric layer 1122, covering a portion of high-k isolation portions 104c. A spacer 102a is formed including a first spacer layer 1021a, a second spacer layer 1022a and a third spacer layer 1023a. It should be noted that a portion of the third dielectric layer 1023 above the substrate fins 1001 and exposed from the dummy gate structures 107' is removed in the S/D etching operation to form the third spacer layer 1023a. In some embodiments, a first side boundary 1111 of an S/D structure 111 contacts and is conformal to the adjacent second spacer layer 1022a. It should be noted that an inner spacer 109 (not shown) between nanowires 1003' in recesses R1002 is formed to prevent side-etching damage during the subsequent operations.

Figure 60:
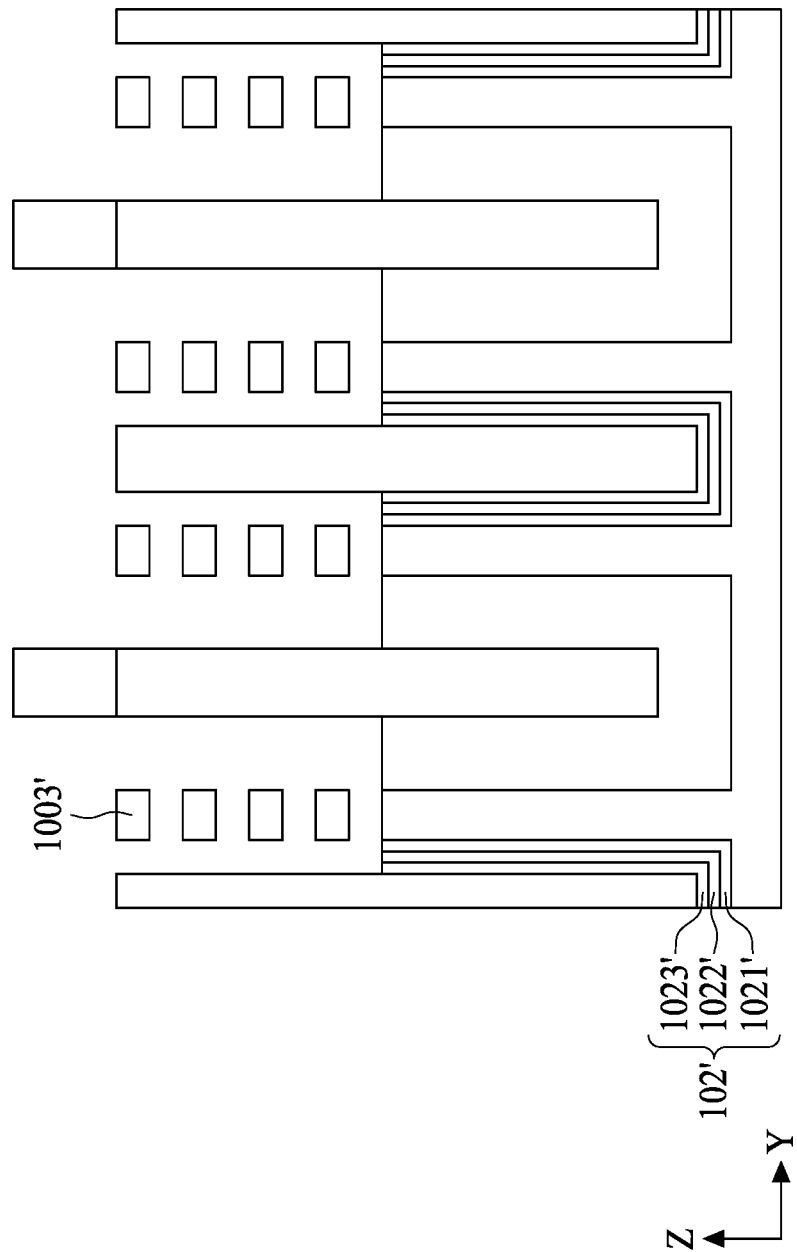

FIG. 60 is a Y-cut cross-sectional view along a line A5-A5' in FIG. 59 at gate regions after performing operations related to those shown in FIGS. 23 to 25. In the embodiments, the dielectric removal operation includes multiple etching operations to partially remove the first, second and third spacer layers 1021a, 1022a and 1023a, respectively. Since the thickness of each of the first, second and third spacer layers 1021a, 1022a and 1023a is in a range of 1 to 3.5 nm, damage to the S/D structures 111 caused by the side-etching effect can be prevented due to cohesion of the etchants. A spacer 102' including a first spacer layer 1021', a second spacer layer 1022' and a third spacer layer 1023' is formed.

Figure 61:
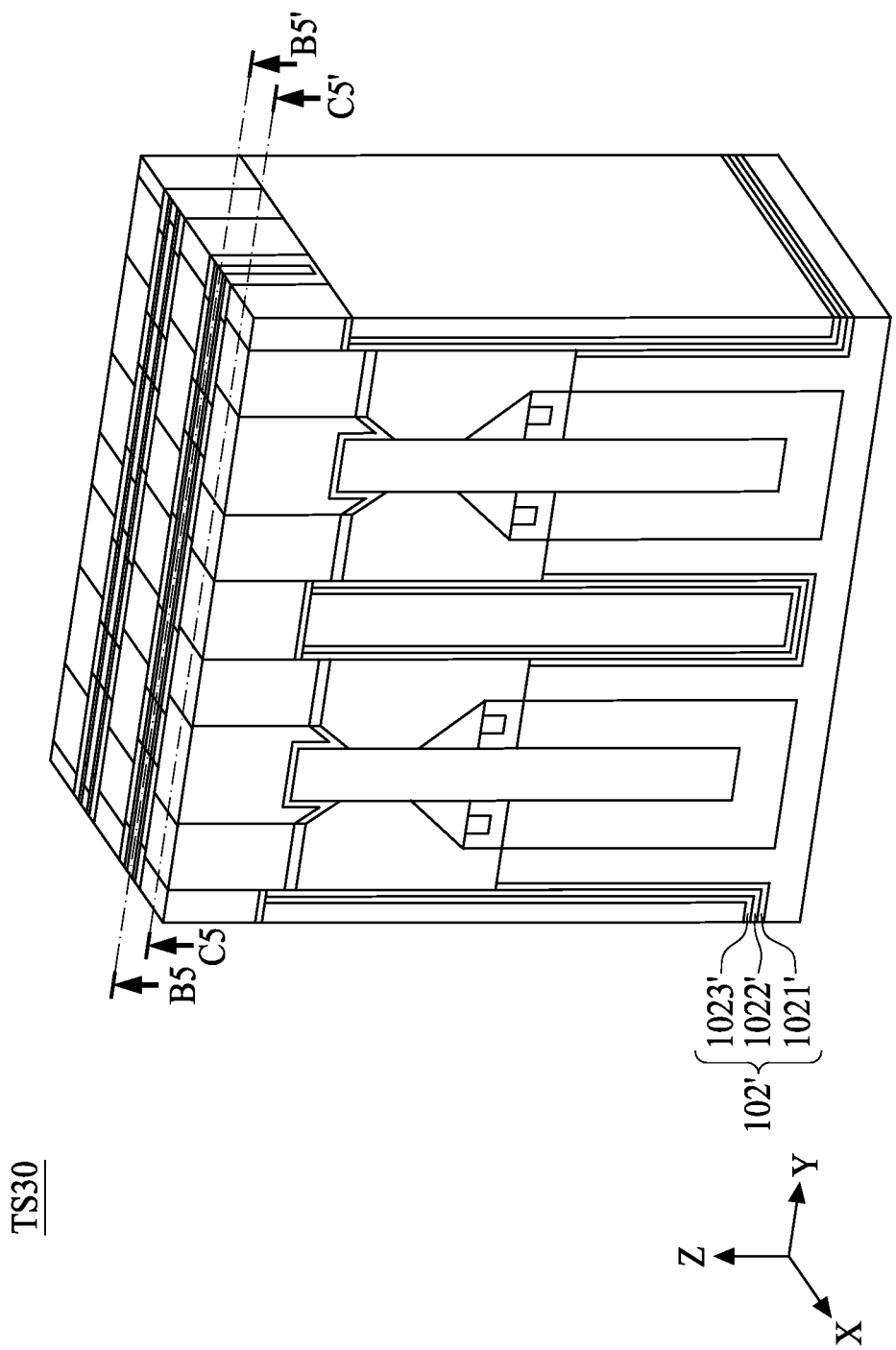
Figure 62:
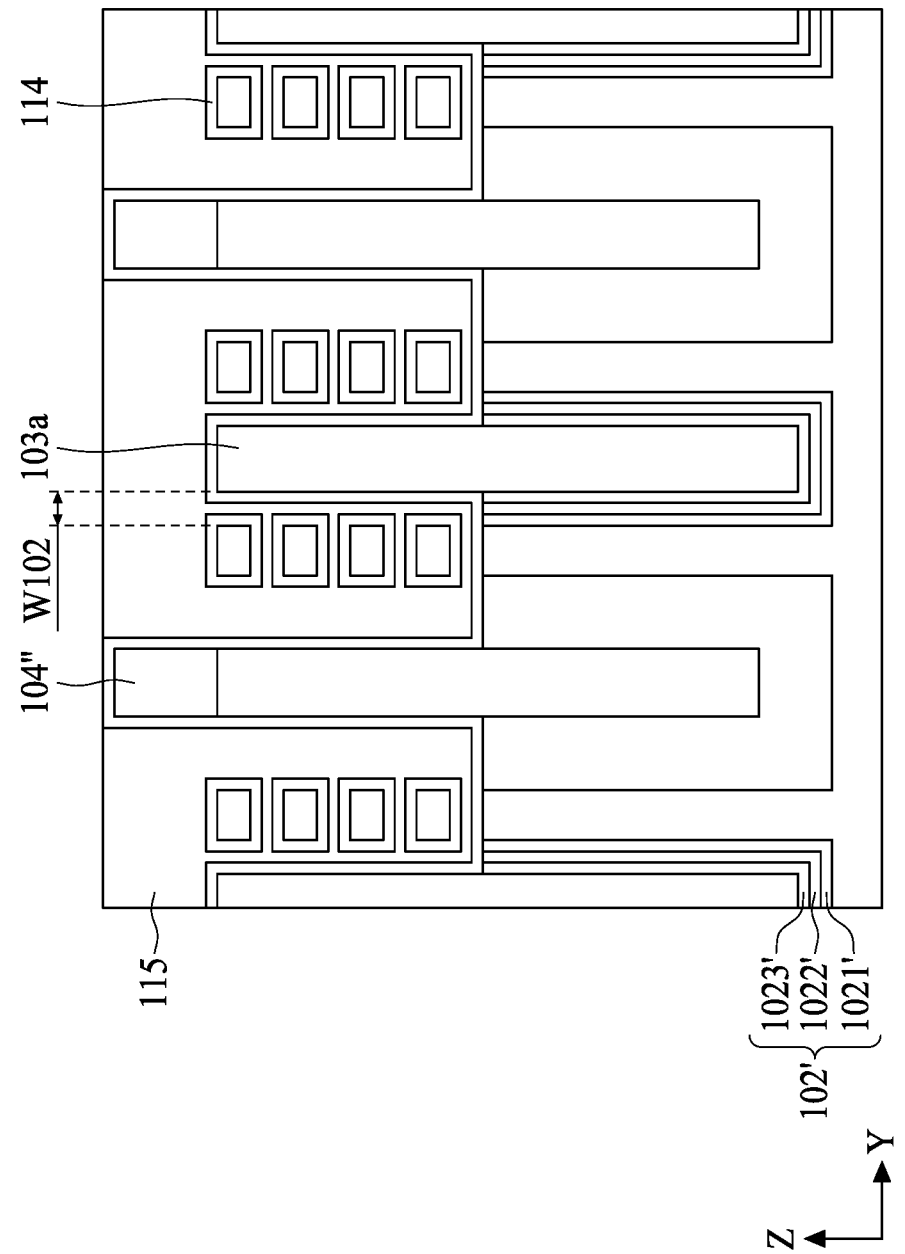
FIGS. 62 to 63 are cross-sectional views cut along lines B5-B5' and C5-C5' shown in FIG. 61 in accordance with some embodiments of the present disclosure.
Figure 63:
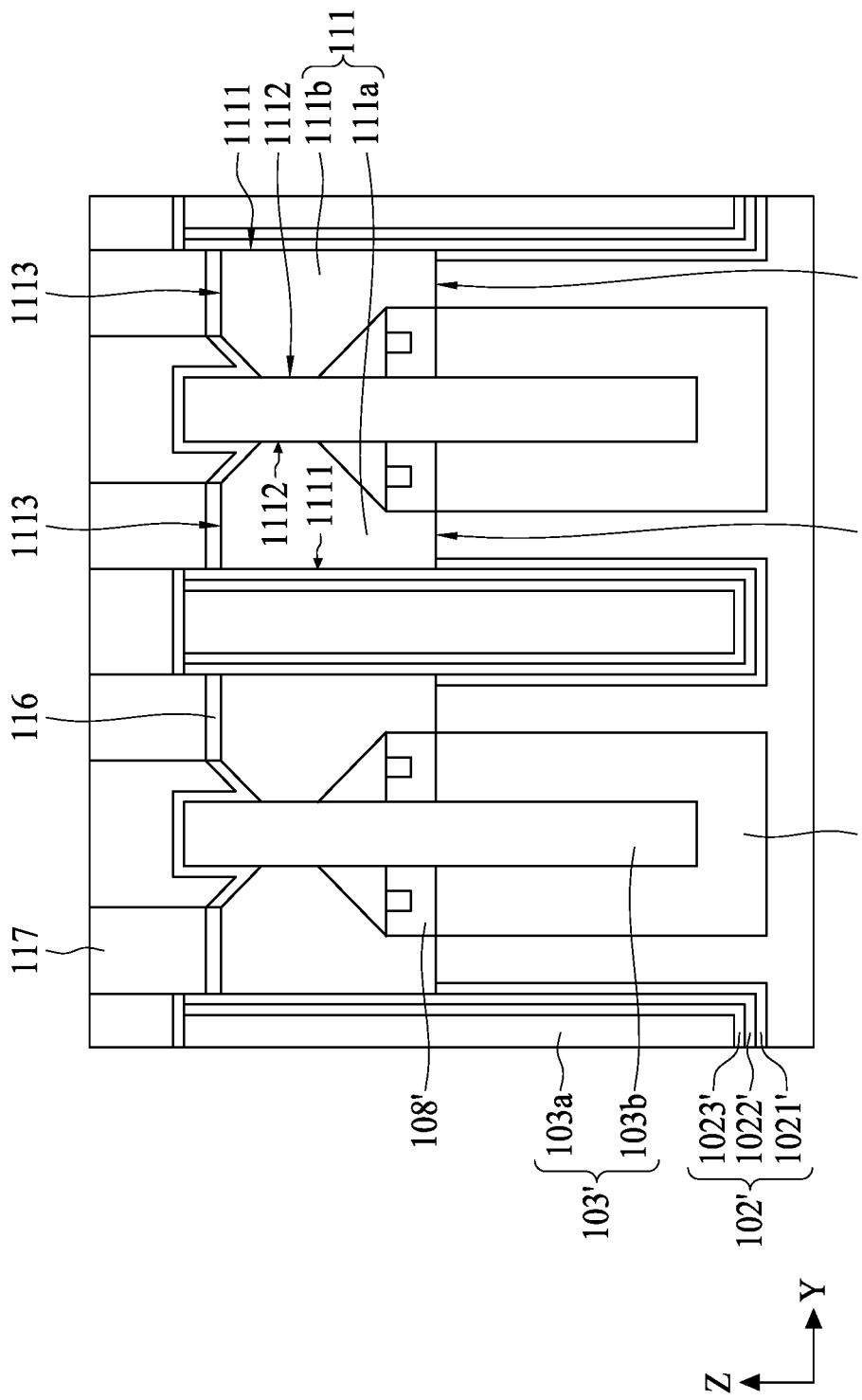

Operations related to those shown in FIGS. 26 to 27 are performed on the structure of FIG. 60, thereby forming a semiconductor structure TS30 as shown in FIG. 61. FIGS. 62 and 63 are Y-cut cross-sectional views along a line B5-B5' (Y-cut on the gate structures) and a line C5-C5' (Y-cut on the S/D structures), respectively, shown in FIG. 61. As with the semiconductor structure TS10, a gate dielectric layer 114 and a gate electrode 115 are formed surrounding the nanowire 1003', but the spacer 102' includes multiple layers with different dielectric materials and small thickness instead of a single thick dielectric layer. In addition, the first side boundary 1111 of the S/D structure 111 contacts the second spacer layer 1022' instead of the low-k isolation strips 103a.

Due to an increase of the thickness of the dielectric structure 102 compared to the configuration of the semiconductor structure TS20, a distance W102 between the low-k isolation strip 103a and the adjacent nanowires 1003' is increased. A space between the low-k isolation strip 103a and the nanowires 1003' is large enough for the gate electrode 115 to fill into after the formation of the gate dielectric layer 114. Thus, a size of a cell of groups of transistors can be decreased, or active areas (or lengths of nanowires) of the cell can be increased to enhance speed of a device by contribution of the high-k isolation segments 104". In addition, the side-etching effect is prevented by the small thickness of each of the dielectric layers of the spacer 102'.

Similar structures of high-k isolation segments 104" and a multi-layer dielectric structure 102, and a manufacturing method of the semiconductor structure TS30 can be applied to form a semiconductor structure TS31 including FinFET structures.

Figure 64:
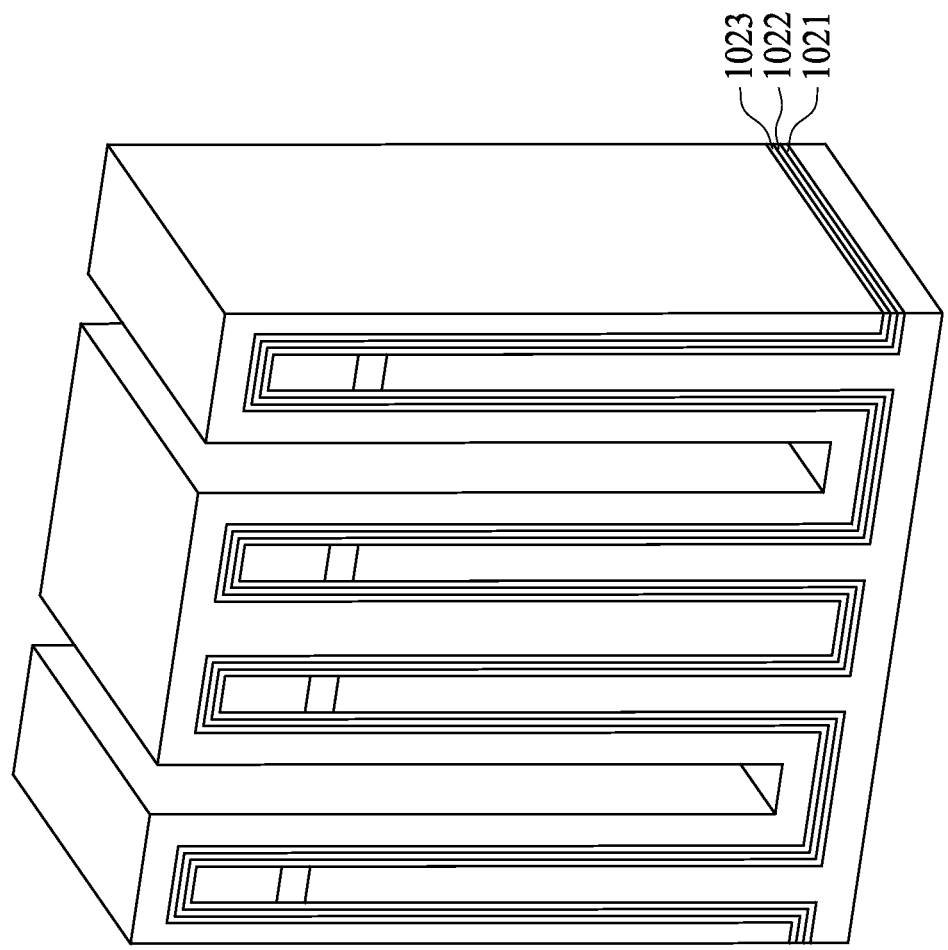
FIGS. 64 to 65 are diagrammatic views of one or more operations of a method for forming a semiconductor structure in accordance with some embodiments of the present disclosure.

Referring to FIG. 64, in accordance with some embodiments of the present disclosure, a multi-layer dielectric structure 102 is applied to a plurality of fin structures 100a similar to the structure shown in FIG. 31.

Figure 65:
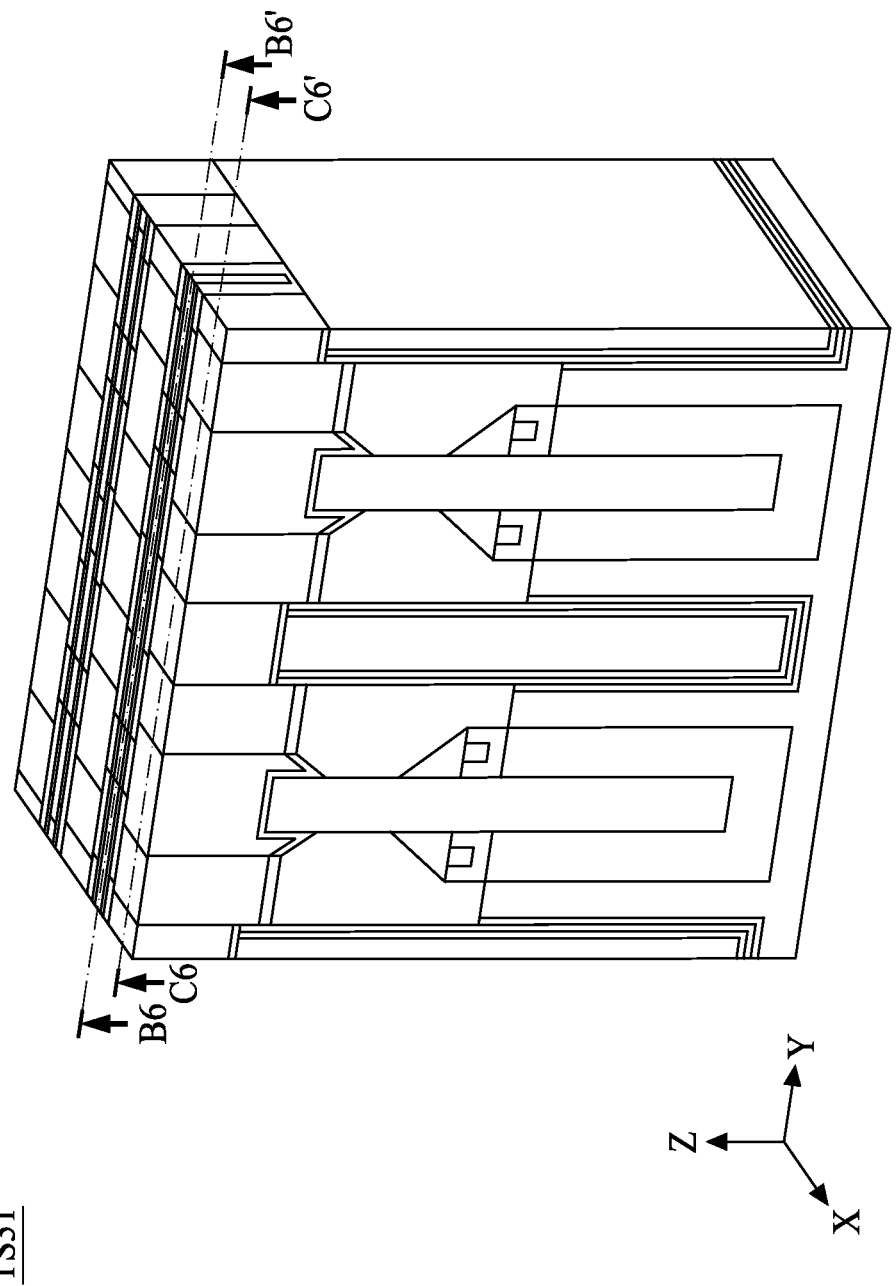
Figure 66:
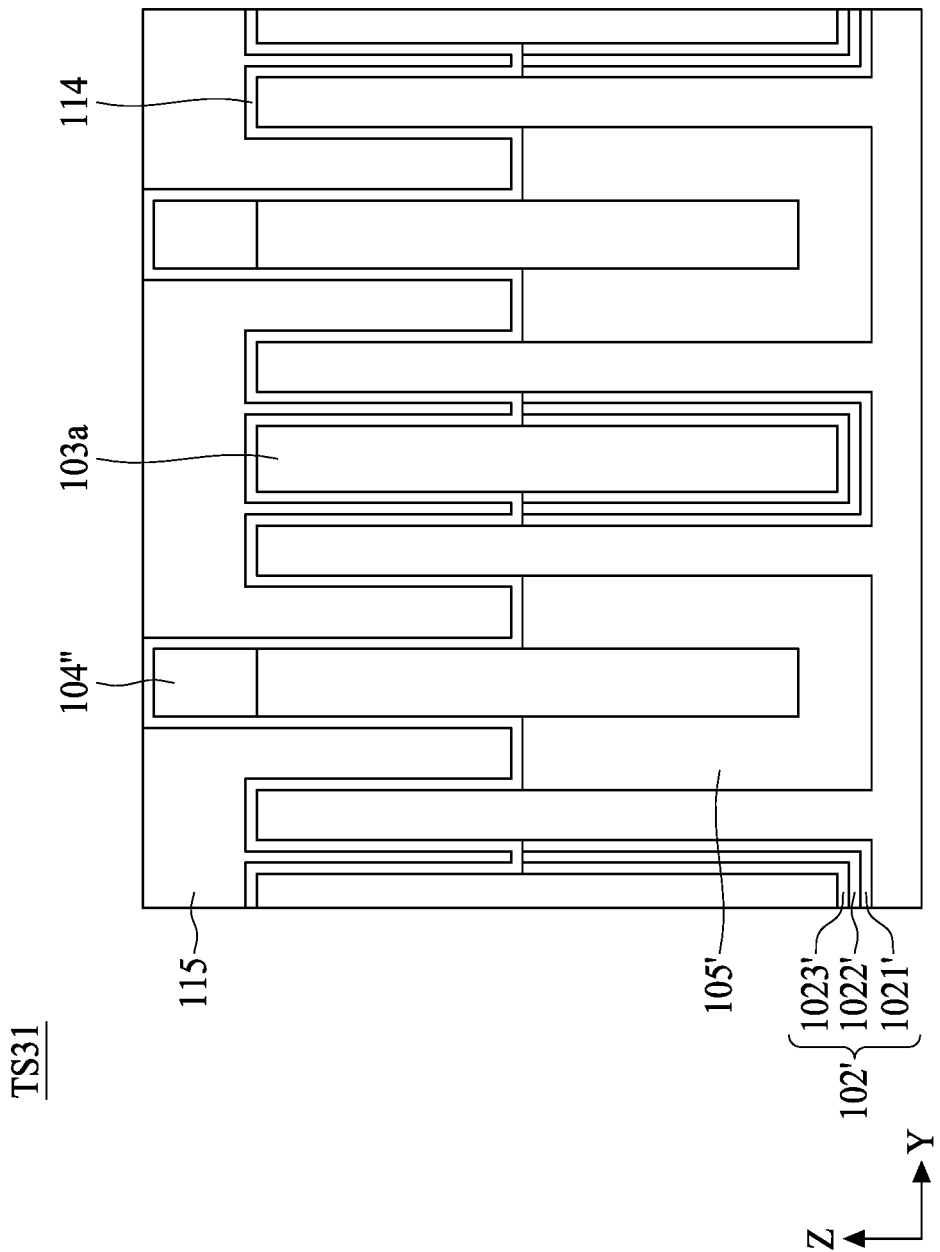
FIGS. 66 to 67 are cross-sectional views cut along lines B6-B6' and C6-C6' shown in FIG. 65 in accordance with some embodiments of the present disclosure.
Figure 67:
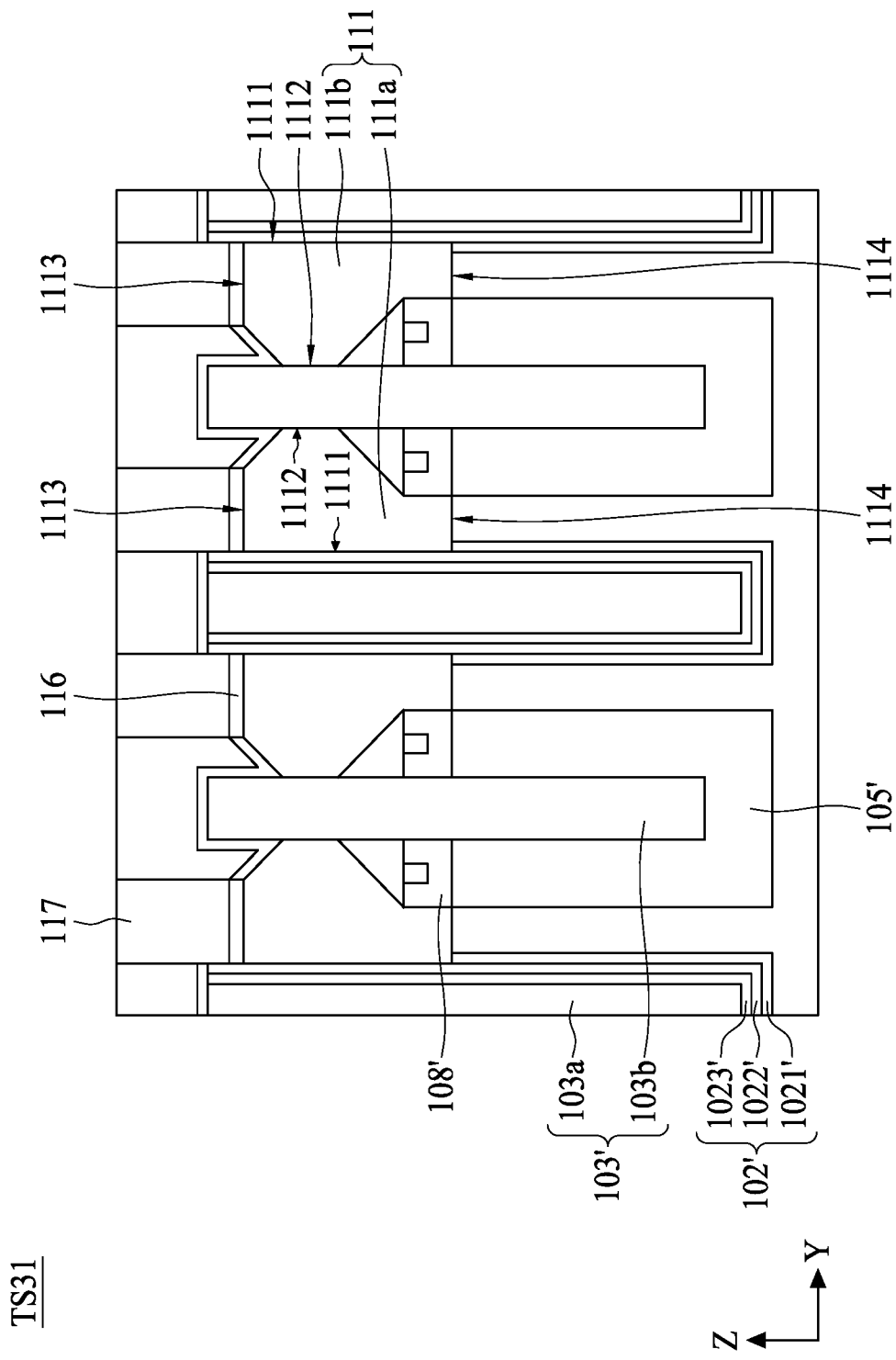

Referring to FIG. 65, operations similar to those of forming the semiconductor structure TS30 are applied to the structure of FIG. 64, except for the nanowire release operation, to form the semiconductor structure TS31 as shown in FIG. 65. FIGS. 66 and 67 are Y-cut cross-sectional views along a line B6-B6' (Y-cut on the gate structures) and a line C6-C6' (Y-cut on the S/D structures), respectively, shown in FIG. 65. The semiconductor structure TS31 is similar to the semiconductor structure TS30, but with FinFET structures instead of GAA structures. Repeated illustration is omitted for brevity.

The present disclosure also provides a method for manufacturing a semiconductor structure. The method includes forming a plurality of fin structures extending along a first direction over a substrate, forming a low-k isolation strip over the substrate, the low-k isolation strip extending along the first direction and between the plurality of fin structures; and forming a high-k isolation strip on top of the low-k isolation strip.

The present disclosure also provides a method for manufacturing a semiconductor structure. The method includes forming a first fin structure and a second fin structure over a substrate, forming a spacer partially filling a trench between the first fin structure and the second fin structure, forming a low-k isolation strip over the spacer in the trench, forming a high-k isolation strip over the low-k isolation strip and the spacer, and forming a dummy gate structure to cover the first fin structure, the high-k isolation strip and the second fin structure.

The present disclosure also provides a method for manufacturing a semiconductor structure. The method includes forming a fin structure over a substrate, forming a first low-k isolation strip over the substrate, and forming a second low-k isolation strip over the substrate after forming the first low-k isolation strip. The fin structure is located between the first low-k isolation strip and second low-k isolation strip, and a first distance between the first low-k isolation strip and the fin structure is less than a second distance between the second low-k isolation strip and the fin structure. The method also includes recessing the fin structure, forming a source/drain structure over the fin structure, and forming a contact on the source/drain structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a plurality of fin structures extending along a first direction over a substrate;
   forming a dielectric layer along sidewalls of the plurality of fin structures;
   forming a low-k isolation strip over the substrate, the low-k isolation strip extending along the first direction and between the plurality of fin structures, wherein the dielectric layer extends below the low-k isolation strip and is interposed between one of the fin structures and the low-k isolation strip; and
   forming a high-k isolation strip on top of the low-k isolation strip; and
   removing a portion of the high-k isolation strip to form a high-k isolation segment on the top of the low-k isolation strip.

2. The method of claim 1, wherein the formation of the high-k isolation segment comprises:
   removing a portion of the high-k isolation strip, thereby forming a plurality of high-k isolation portions;
   forming a hard mask to partially cover at least one of the plurality of high-k isolation portions; and
   removing exposed portions of the high-k isolation portions.

3. The method of claim 1, further comprising:
   prior to formation of the high-k isolation segment, forming a dummy gate structure on the high-k isolation strip to cover a second portion of the high-k isolation strip; and
   removing the dummy gate structure after the formation of the high-k isolation segment.

4. The method of claim 1, further comprising:
   forming a dummy gate structure on the high-k isolation strip;
   removing a first portion of the dielectric layer exposed from the dummy gate structure;
   removing a second portion of the dielectric layer, thereby forming a recess in the dielectric layer; and
   forming an inner spacer by filling the recess.

5. The method of claim 1, further comprising:
   recessing the dielectric layer to expose sidewalls of the low-k isolation strip.

6. The method of claim 1, wherein an interface between the dielectric layer and the high-k isolation strip is leveled with an interface between the low-k isolation strip and the high-k isolation strip.

7. A method for manufacturing a semiconductor structure, comprising:
   forming a first fin structure and a second fin structure over a substrate;
   forming a spacer partially filling a trench between the first fin structure and the second fin structure;
   forming a low-k isolation strip over the spacer in the trench;
   forming a high-k isolation strip over the low-k isolation strip and the spacer; and
   forming a dummy gate structure to cover the first fin structure, the high-k isolation strip and the second fin structure.

8. The method of claim 7, further comprising:
   removing an upper portion of the first fin structure and an upper portion of the second fin structure;
   removing a portion of the spacer to expose the low-k isolation strip; and
   forming a first source/drain structure over a lower portion of the first fin structure and a second source/drain structure over a lower portion of the second fin structure.

9. The method of claim 8, wherein the low-k isolation strip is in contact with both the first source/drain structure and the second source/drain structure.

10. The method of claim 7, further comprising:
    removing a first portion of the dummy gate structure;
    removing the high-k isolation strip; and
    removing a second portion of the dummy gate structure.

11. The method of claim 7, wherein each of the first fin structure and the second fin structure comprises alternately stacked SiGe material layers and Si material layers.

12. The method of claim 11, further comprising:
    partially removing the SiGe material layers to form a plurality of first recesses between the Si material layers;
    partially removing the spacer to form a second recess; and
    forming an inner spacer to fill the plurality of first recesses and the second recess.

13. The method of claim 11, further comprising:
    removing the dummy gate structure;
    removing the SiGe material layers to form a plurality of nanowires from the plurality of the Si material layers;
    recessing the spacer to expose the low-k isolation strip;
    forming a high-k dielectric layer around the plurality of nanowires and along a sidewall of the low-k isolation strip; and
    forming a gate electrode over the high-k dielectric layer.

14. The method of claim 7, wherein the spacer comprises a first dielectric layer, a second dielectric layer over the first dielectric layer and a third dielectric layer over the second dielectric layer, and materials of the first and third dielectric layers are the same, and are different from a material of the second dielectric layer.

15. A method for manufacturing a semiconductor structure, comprising:
    forming a fin structure over a substrate;
    forming a first low-k isolation strip over the substrate;
    forming a second low-k isolation strip over the substrate after forming the first low-k isolation strip, wherein the fin structure is located between the first low-k isolation strip and second low-k isolation strip, and a first distance between the first low-k isolation strip and the fin structure is less than a second distance between the second low-k isolation strip and the fin structure;
    recessing the fin structure;
    forming a source/drain structure over the fin structure; and
    forming a contact on the source/drain structure.

16. The method of claim 15, further comprising:
    forming a first spacer between the first low-k isolation strip and the fin structure, wherein the source/drain structure covers an upper surface of the first spacer; and
    forming a second spacer between the second low-k isolation strip and the fin structure.

17. The method of claim 16, further comprising:
    forming a seal spacer over the second spacer, wherein the source/drain structure is in contact with a sidewall of the seal spacer.

18. The method of claim 15, wherein an interface between the contact and the source/drain structure is lower than an upper surface of the first low-k isolation strip.

19. The method of claim 15, further comprising:
forming a first high-k isolation strip over the first low-k isolation strip; and
forming a second high-k isolation strip over the second low-k isolation strip, wherein k values of the first high-k isolation strip and the second high-k isolation strip are greater than 7.

20. The method of claim 19, further comprising:
forming a dummy gate structure to partially cover the first high-k isolation strip, the fin structure and the second high-k isolation strip; and
removing a portion of the first high-k isolation strip uncovered by the dummy gate structure and a portion of the second high-k isolation strip uncovered by the dummy gate structure before forming the source/drain structure over the fin structure.

* * * * *